US012635330B2

(12) United States Patent
Lee et al.

(10) Patent No.: US 12,635,330 B2
(45) Date of Patent: May 19, 2026

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Jongwon Lee, Yongin-si (KR); Seungcheol Kim, Yongin-si (KR); Heungsu Park, Yongin-si (KR); Changmin Lee, Yongin-si (KR); Hyunshik Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1068 days.

(21) Appl. No.: 17/722,378

(22) Filed: Apr. 17, 2022

(65) Prior Publication Data

US 2023/0113852 A1 Apr. 13, 2023

(30) Foreign Application Priority Data

Aug. 17, 2021 (KR) ........................ 10-2021-0108176

(51) Int. Cl.
*H01L 51/50* (2006.01)
*H10K 50/11* (2023.01)
(Continued)

(52) U.S. Cl.
CPC ............. *H10K 50/12* (2023.02); *H10K 50/11* (2023.02); *H10K 50/15* (2023.02); *H10K 50/16* (2023.02);
(Continued)

(58) Field of Classification Search
None
See application file for complete search history.

(56) References Cited

U.S. PATENT DOCUMENTS

| | | | | |
|---|---|---|---|---|
| 6,280,559 | B1 * | 8/2001 | Terada | H05B 33/10 313/506 |
| 10,600,981 | B2 | 3/2020 | So et al. | |
| 11,158,831 | B2 | 10/2021 | Lee et al. | |
| 11,165,035 | B2 | 11/2021 | Liaptsis et al. | |
| 11,944,002 | B2 | 3/2024 | Kang et al. | |

(Continued)

FOREIGN PATENT DOCUMENTS

| | | |
|---|---|---|
| JP | 2019204947 | 11/2019 |
| KR | 10-2017-0078573 | 7/2017 |
| KR | 10-1786881 | 10/2017 |
| KR | 10-2020-0032294 | 3/2020 |

(Continued)

*Primary Examiner* — Gregory D Clark
(74) *Attorney, Agent, or Firm* — Womble Bond Dickinson (US) LLP

(57) ABSTRACT

A light-emitting device including: m emitting units located between a first electrode and a second electrode; and m−1 charge generation units, each located between two neighboring emitting units among the m emitting units and including an n-type charge generation layer and a p-type charge generation layer. The m emitting units may each include an emission layer, at least one of the m emission layers comprises a first emission layer and a second emission layer that are in contact with each other, the first emission layer includes a first host, a second host, and a first dopant, the second emission layer includes a third host, a fourth host, and a second dopant, the first host and the second host form a first exciplex, the third host and the fourth host form a second exciplex, and the first dopant is a delayed fluorescence dopant, and the second dopant is a phosphorescent dopant.

19 Claims, 7 Drawing Sheets

(51) Int. Cl.

| | |
|---|---|
| ***H10K 50/12*** | (2023.01) |
| ***H10K 50/15*** | (2023.01) |
| ***H10K 50/16*** | (2023.01) |
| ***H10K 50/17*** | (2023.01) |
| ***H10K 85/30*** | (2023.01) |
| ***H10K 85/60*** | (2023.01) |
| *H10K 101/10* | (2023.01) |

(52) U.S. Cl.

CPC ......... *H10K 50/171* (2023.02); *H10K 85/322* (2023.02); *H10K 85/653* (2023.02); *H10K 85/654* (2023.02); *H10K 85/655* (2023.02); *H10K 2101/10* (2023.02)

(56) References Cited

U.S. PATENT DOCUMENTS

| | | | | |
|---|---|---|---|---|
| 2010/0001301 | A1* | 1/2010 | Karg | H10K 59/878 257/40 |
| 2014/0034927 | A1* | 2/2014 | Seo | H10K 50/11 257/40 |
| 2016/0164020 | A1 | 6/2016 | Kim et al. | |
| 2017/0133614 | A1* | 5/2017 | Gu | H10K 50/15 |
| 2019/0140204 | A1* | 5/2019 | Seo | H10H 20/811 |
| 2021/0066617 | A1 | 3/2021 | Shin et al. | |
| 2021/0135141 | A1 | 5/2021 | Park et al. | |

FOREIGN PATENT DOCUMENTS

| | | |
|---|---|---|
| KR | 10-2020-0103235 | 9/2020 |
| KR | 10-2021-0028085 | 3/2021 |
| KR | 10-2021-0028317 | 3/2021 |

* cited by examiner

LIGHT-EMITTING DEVICE AND ELECTRONIC APPARATUS INCLUDING THE SAME

CROSS-REFERENCE TO RELATED APPLICATION

This application claims priority from and the benefit of Korean Patent Application No. 10-2021-0108176, filed on Aug. 17, 2021, which is hereby incorporated by reference for all purposes as if fully set forth herein.

BACKGROUND

Field

Embodiments of the invention relate generally to a light-emitting device and an electronic apparatus including the same.

Discussion of the Background

Light-emitting devices are self-emissive devices that have wide viewing angles, high contrast ratios, and short response times, and exhibit excellent characteristics in terms of luminance, driving voltage, and response speed.

In a light-emitting device, a first electrode is located on a substrate, and a hole transport region, an emission layer, an electron transport region, and a second electrode are sequentially formed on the first electrode. Holes injected from the first electrode move to the emission layer through a non-luminescent exciton transport region that does not contribute to light emission among excitons generated inside the emission layer, and electrons injected from the second electrode pass through the electron transport region to the emission layer. Carriers, such as holes and electrons, recombine in the emission layer to produce excitons. These excitons transition from an excited state to a ground state, thereby generating light.

The above information disclosed in this Background section is only for understanding of the background of the inventive concepts, and, therefore, it may contain information that does not constitute prior art.

SUMMARY

Embodiments of the present invention provide a light-emitting device with improved efficiency and an electronic device including the light-emitting device.

Additional features of the inventive concepts will be set forth in the description which follows, and in part will be apparent from the description, or may be learned by practice of the inventive concepts.

An embodiment of the present invention provides a light-emitting device including a first electrode, a second electrode facing the first electrode, m emitting units located between the first electrode and the second electrode, and m−1 charge generation units, each located between two neighboring emitting units among the m emitting units and including an n-type charge generation layer and a p-type charge generation layer, wherein m is an integer of 2 or more. Each of the m emitting units includes a hole transport region, an emission layer, and an electron transport region, which are sequentially arranged, at least one of the m emission layers includes a first emission layer and a second emission layer that are in contact with each other, the first emission layer includes a first host, a second host, and a first dopant, the second emission layer includes a third host, a fourth host, and a second dopant, the first host and the second host form a first exciplex, the third host and the fourth host form a second exciplex, the first dopant is a delayed fluorescence dopant, and the second dopant is a phosphorescent dopant.

An electronic apparatus may include the light-emitting device.

The electronic apparatus may include a quantum dot or an optical member including the quantum dot, each located in at least one traveling direction of light emitted from the light-emitting device.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
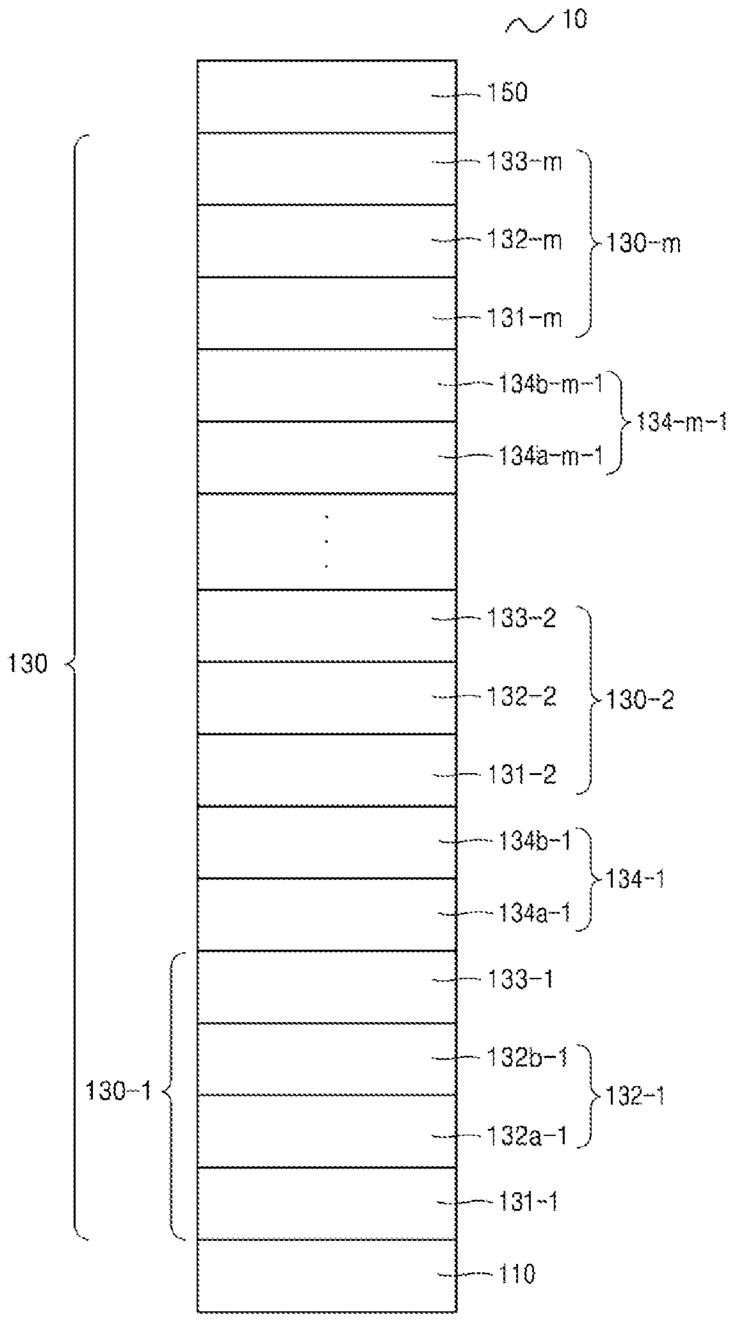
FIGS. 1, 2, and 3 each show a schematic cross-sectional view of a light-emitting device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic cross-sectional view of a light-emitting device 10 according to an embodiment.

As shown in FIG. 1, the light-emitting device 10 according to an embodiment may include: a first electrode 110; a second electrode 150 facing the first electrode 110; m emitting units 130-1, 130-2, . . . , and 130-*m* located between the first electrode 110 and the second electrode 150; and m−1 charge generation units 134-1, . . . , and 134-*m*−1, each located between two neighboring emitting units among them emitting units 130-1, 130-2, . . . , and 130-*m* and including an n-type charge generation layer 134*a*−1, . . . , or 134*a*-*m*−1 QC_41 and a p-type charge generation layer 134*b*−1, . . . , or 134*b*-*m*−1.

An emitting unit herein is not particularly limited as long as the emitting unit has a function capable of emitting light. For example, an emitting unit may include one or more emission layers. When necessary, an emitting unit may further include an organic layer other than an emission layer.

The light-emitting device 10 may include m stacked emitting units 130-1, 130-2, . . . , and 130-*m*, wherein m may be an integer of 2 or more. For example, m may be an integer of 3 or more. A number, m, of the emitting units, may vary according to the purpose, and the upper limit of the number is not particularly limited. In an embodiment, the light-emitting device 10 may include 2, 3, 4, 5, or 6 emitting units. In one or more embodiments, the light-emitting device 10 may include 3 or 4 emitting units.

The light-emitting device 10 may include charge generation units 134-1, . . . , and 134-*m*−1, each located between two neighboring emitting units among the m emitting units 130-1, 130-2, . . . , and 130-*m*. Here, the term "neighboring" refers to the location relationship of the closest layers or units among the layers or units described as being "neighboring". In an embodiment, the "two neighboring emitting units" refers to the location relationship of two emitting units located closest to each other among a plurality of emitting units. The term "neighboring" may refer to a case where two layers or units are physically in contact with each other, and a case where another layer or unit, not mentioned, may be located between the two layers or units. For example, the "emitting unit neighboring to the second electrode" refers to the emitting unit located closest to the second electrode. Also, the second electrode and the neighboring emitting unit thereto may be in physical contact. In an embodiment, however, other layers or units other than the emitting unit may be located between the second electrode and the neighboring emitting unit thereto. In an embodiment, an electron transport layer may be located between the second electrode and the neighboring emitting unit thereto. However, a charge generation unit may be located between two neighboring emitting units.

The "charge generation unit" may generate electrons with respect to one of the two neighboring emitting units to serve as a cathode, and may generate holes with respect to the other one of the two neighboring emitting units to serve as an anode. In this regard, the charge generation unit may separate the neighboring emitting units from each other without being directly connected to an electrode. A light-emitting device including m emitting units may include m−1 charge generation units.

In the light-emitting device 10 of the inventive concepts, each of the charge generation units 134-1, . . . , and 134-*m*−1 may include an n-type charge generation layer 134*a*−1, . . . , or 134*a*-*m*−1 and a p-type charge generation layer 134*b*−1, . . . , or 134*b*-*m*−1. Here, the n-type charge generation layer 134*a*−1, . . . , or 134*a*-*m*−1 may directly contact the p-type charge generation layer 134*b*−1, . . . , or 134*b*-*m*−1 to form an NP junction. Due to the NP junction, electrons and holes may simultaneously be generated between the n-type charge generation layer 134*a*−1, . . . , or 134*a*-*m*−1 and the p-type charge generation layer 134*b*−1, . . . , or 134*b*-*m*−1. The generated electrons may be delivered to one of two neighboring emitting units through the n-type charge generation layer 134*a*−1, . . . , or 134*a*-*m*−1. The generated holes may be delivered to the other one of the two neighboring emitting units through the p-type charge generation layer 134*b*-1, . . . , or 134*b*-*m*−1. In addition, each of the charge generation units 134-1, . . . , and 134-*m*−1 may include one n-type charge generation layer 134*a*−1, . . . , or 134*a*-*m*−1 and one p-type charge generation layer 134*b*−1, . . . , or 134*b*-*m*−1, so that the light-emitting device 10 including m−1 charge generation units 134-1, . . . , and 134-*m*−1 may include m−1 n-type charge generation layers 134*a*−1, . . . , and 134*a*-*m*−1 and m−1 p-type charge generation layers 134*b*−1, . . . , and 134*b*-*m*−1.

The term "n-type" refers to n-type semiconductor characteristics, that is, the characteristics of injecting or transporting electrons. The term "p-type" refers to p-type semiconductor characteristics, that is, the characteristics of injecting or transporting holes.

An n-type charge generation material included in the n-type charge generation layer 134*a*−1, . . . , or 134*a*-*m*−1 may be understood with reference to the description of an electron transport region in the present specification, and a p-type charge generation material included in the p-type charge generation layer 134*b*−1, . . . , or 134*b*-*m*−1 may be understood with reference to the description of a hole transport region in the present specification.

At least one of the charge generation units 134-1, . . . , and 134-*m*−1 may further include an interlayer (not shown) located between the n-type charge generation layer 134*a*−1, . . . , or 134*a*-*m*−1 and the p-type charge generation layer 134*b*−1, . . . , or 134*b*-*m*−1. The interlayer may prevent materials included in the n-type charge generation layer 134*a*−1, . . . , or 134*a*-*m*−1 from diffusing into the p-type charge generation layer 134*b*−1, . . . , or 134*b*-*m*−1. A material included in the interlayer is not limited as long as it is capable of performing the above-described roles, but may specifically be a compound selected from an organic compound, an inorganic semiconductor compound, and an inorganic insulator compound. More specifically, the material included in the interlayer may be an organic insulator compound such as a p-dopant which will be described later.

Each of the m emitting units 130-1, 130-2, . . . , and 130-*m* may include a hole transport region 131-1, 131-2, . . . , or 131-*m*, an emission layer 132-1, 132-2, . . . , or 132-*m*, and an electron transport region 133-1, 133-2, . . . , or 133-*m*. Them hole transport regions 131-1, 131-2, . . . , and 131-*m* included in them emitting units 130-1, 130-2, . . . , and 130-*m* may each include a hole-transporting material, and the m electron transport regions 133-1, 133-2, . . . , and 133-*m* included in the m emitting units 130-1, 130-2, . . . , and 130-*m* may each include an electron-transporting material.

In this regard, hole-transporting materials included in the m hole transport regions 131-1, 131-2, . . . , and 131-*m* may be identical to or different from each other. In this regard, electron-transporting materials included in the m electron transport regions 133-1, 133-2, . . . , and 133-*m* may be identical to or different from each other.

In an embodiment, the hole transport regions 131-1, 131-2, . . . , and 131-*m* may each include a hole injection layer, a hole transport layer, an emission auxiliary layer, an electron blocking layer, or any combination thereof, and the electron transport regions 133-1, 133-2, . . . , and 133-*m* may each include a buffer layer, a hole blocking layer, an electron transport layer, an electron injection layer, or any combination thereof.

At least one of the m emission layers 132-1, 132-2, . . . , and 132-*m* may include a first emission layer 132*a*−1 and a second emission layer 132*b*−1 that are in contact with each other.

FIG. 1 shows an embodiment of the light-emitting device 10 in which only one of the m emitting units 130-1, 130-2, . . . , and 130-*m* includes the first emission layer 132*a*−1 and the second emission layer 132*b*−1, and more particularly, shows the light-emitting device 10 in which the emission layer 132-1 of the neighboring emitting unit 130-1 to the first electrode 110 includes the first emission layer 132*a*−1 and the second emission layer 132*b*−1. However, various modifications are available as described later. That is, in FIG. 1, the first emission layer 132*a*−1 and the second emission layer 132*b*−1 are included in the first emitting unit 130-1, and the first emitting unit 130-1 is located between the first electrode 110 and the first charge generation unit 134-1.

In addition, FIG. 1 shows an embodiment of the light-emitting device 10 in which the first emission layer 132*a*−1 is located closer to the first electrode 110 than the second emission layer 132*b*−1. However, the stacking order of the first emission layer 132*a*−1 and the second emission layer 132*b*−1 may be changed. That is, in one or more embodiments, the first emission layer 132*a*−1 may be located closer to the second electrode 150 than the second emission layer 132*b*−1.

For example, at least one emission layer 132-1 including the first emission layer 132*a*−1 and the second emission layer 132$b$-1 among the m emission layers 132-1, 132-2, . . . , and 132-$m$ may include: the first emission layer 132$a$-1 located between the first electrode 110 and the second electrode 150 and the second emission layer 132$b$-1 located between the first emission layer 132$a$-1 and the second electrode 150 (see FIG. 1); or the first emission layer 132$a$-1 located between the first electrode 110 and the second electrode 150 and the second emission layer 132$b$-1 located between the first electrode 110 and the first emission layer 132$a$-1 (not shown).

In an embodiment, the first emission layer 132$a$-1 may include a first host, a second host, and a first dopant, and the second emission layer 132$b$-1 may include a third host, a fourth host, and a second dopant, wherein the first host and the second host may form a first exciplex, the third host and the fourth host may form a second exciplex, the first dopant may be a delayed fluorescence dopant, and the second dopant may be a phosphorescent dopant.

The first host and the third host may each be a hole-transporting host, and the second host and the fourth host may each be an electron-transporting host.

In an embodiment, the first host and the third host may each independently be represented by Formula 1:

Formula 1

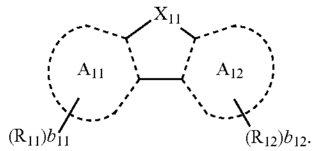

In Formula 1, $X_{11}$ may be O, S, or $N(R_{13})$, $R_{11}$ to $R_{13}$ may each independently be $*-(L_{11})_{a11}-R_{14}$, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, wherein at least one of $R_{11}$ to $R_{13}$ may be $*-(L_{11})_{a11}-R_{14}$, b11 and b12 may each independently be an integer of 1 to 6, $L_{11}$ may be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a11 may be an integer of 0 to 5, $R_{14}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the second host and the fourth host may each independently be represented by Formula 3:

Formula 3

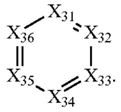

In Formula 3, $X_{31}$ may be N or $C(R_{31})$; $X_{32}$ may be N or $C(R_{32})$; $X_{33}$ may be N or $C(R_{33})$; $X_{34}$ may be N or $C(R_{34})$; $X_{35}$ may be N or $C(R_{35})$; and $X_{36}$ may be N or $C(R_{36})$, at least one of $X_{31}$ to $X_{36}$ may be N, $R_{31}$ to $R_{36}$ may each independently be $*-(L_{31})_{a31}-R_{37}$, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), wherein at least one of $R_{31}$ to $R_{36}$ may be *-($L_{31}$)$_{a31}$-$R_{37}$, $L_{31}$ may be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a31 may be an integer of 0 to 5, $R_{37}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In detail, the first host and the third host may each independently be mCP, o-CBP, DCDPA, or t-DCDBA:

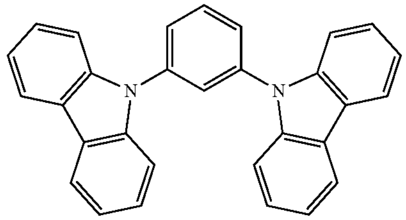

mCP

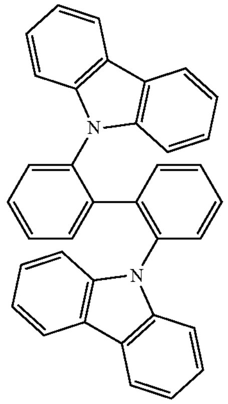

oCBP

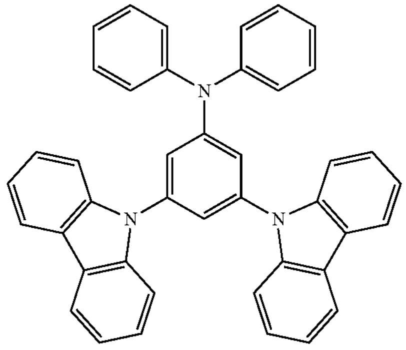

DCDPA

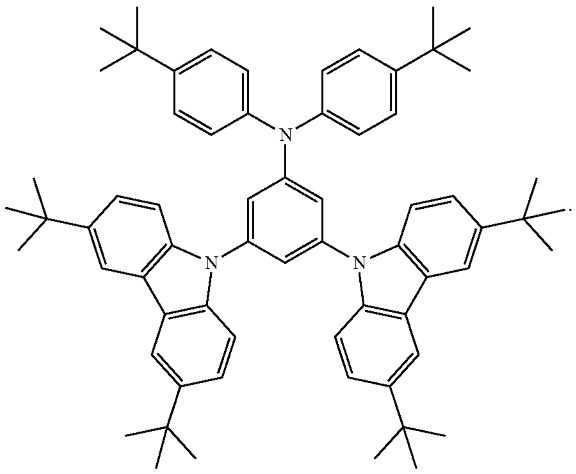

t-DCDBA

In detail, the second host and the fourth host may each independently be BM-A10, PO-T2T, DBFTrz, or B3PYMPM:

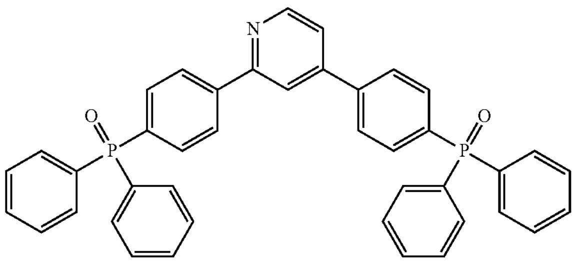

BM-A10

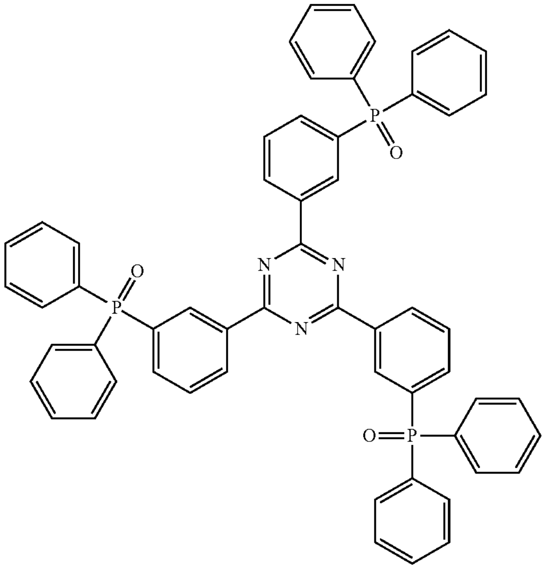

PO-T2T

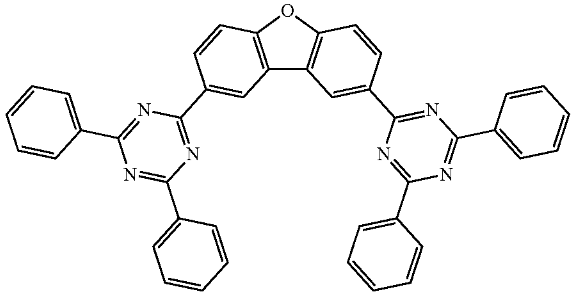

DBFTrz

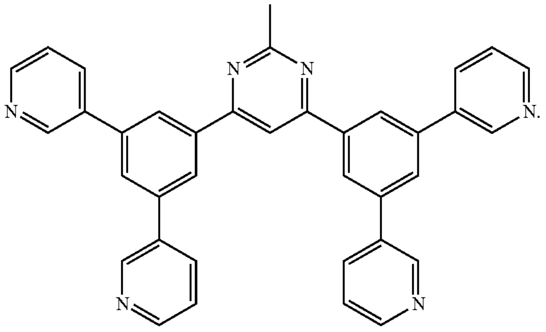

B3PYMPM

Considering that the first emission layer 132*a*–1 emits delayed fluorescence, and the second emission layer 132*b*–1 emits phosphorescence, internal quantum efficiency of the emission layer 132-1 may theoretically be 100%. In detail, the internal quantum efficiency of each of the first emission layer 132*a*–1 and the second emission layer 132*b*–1 may theoretically be 50%.

The first dopant may be understood with reference to the description of a delayed fluorescence material which will be described later, and the second dopant may be understood with reference to the description of a phosphorescent dopant which will be described later. In detail, the first dopant may include a condensed cyclic compound represented by Formula 2, which will be described later, and the second dopant may include an organometallic compound represented by Formula 401, which will be described later.

In an embodiment, the first dopant and the second dopant may emit light of different colors from each other. In this regard, the first emission layer 132*a*–1 may emit first-color light, and the second emission layer 132*b*–1 may emit second-color light, wherein the first-color light and the second-color light may be different from each other. In one or more embodiments, the first dopant may emit light having a shorter maximum emission wavelength than the second dopant. In one or more embodiments, the first dopant may emit blue light, and the second dopant may emit green light or red light. In one or more embodiments, the first dopant may emit blue light, and the second dopant may emit green light.

In an embodiment, a lowest excitation triplet energy level of the first exciplex (T1(Ex1)) and a lowest excitation triplet energy level of the second exciplex (T1(Ex2)) may each be greater than 2.7 eV. When the lowest excitation triplet energy levels of the first exciplex and the second exciplex satisfy the above-described condition, some of triplet excitons of the first exciplex and the second exciton may be transferred to a triplet state of the first dopant and a triplet state of the second dopant, respectively, through Dexter energy transfer. After the triplet excitons of the first dopant are converted to a singlet state through reverse intersystem crossing (RISC), delayed fluorescence may be emitted, and the second dopant may emit phosphorescence. Accordingly, the light-emitting device 10 may have improved luminescence efficiency.

In an embodiment, a lowest excitation singlet energy level of the first exciplex may be higher than that of the first dopant, and a lowest excitation singlet energy level of the second exciplex may be higher than that of the second dopant. Accordingly, the singlet energy of the first dopant does not move to a singlet level of the first exciplex, whereas the singlet energy of the first exciplex may be easily transferred to the first dopant having a lower singlet energy level than the first exciplex. Likewise, the singlet energy of the second exciplex may be easily transferred to the second dopant having a lower singlet energy level than the second exciplex. Accordingly, since the probability of generating singlet excitons by the first dopant and the second dopant may increase, the first dopant may effectively use the singlet excitons for light emission by the fluorescence emission mechanism, and the second dopant which transfers the singlet energy back to the triplet energy may effectively use the triplet excitons for light emission by the phosphorescence emission mechanism. Therefore, the light-emitting device 10 may have improved internal quantum efficiency.

In an embodiment, the first host and the third host may be identical to each other, and the second host and the fourth host may be identical to each other. In this regard, the Dexter energy may be easily transferred from the first exciplex of the first emission layer 132_a_−1 to the second exciplex the second emission layer 132_b_−1, thereby improving luminescence efficiency of the second emission layer 132_b_−1. In addition, a case opposite to the above-mentioned embodiment may be also available.

Furthermore, in the light emitting device 10 according to an embodiment, the intensity of light emitted from the first emission layer 132_a_−1 and the second emission layer 132_b_−1 may increase or decrease proportionally according to the increase or decrease of the current density, and thus the light-emitting device 10 may have a small change in chromaticity of light emitted from the light-emitting device 10, thereby having excellent color purity.

In an embodiment, an amount of the first dopant in the first emission layer 132_a_−1 may be in a range of about 0.01 parts by weight to about 5 parts by weight based on 100 parts by weight of the first emission layer 132_a_−1.

In an embodiment, an amount of the second dopant in the second emission layer 132_b_−1 may be in a range of about 0.01 parts by weight to about 30 parts by weight based on 100 parts by weight of the second emission layer 132_b_−1.

A thickness of each of the first emission layer 132_a_−1 and the second emission layer 132_b_−1 may be in a range of about 50 Å to about 500 Å, for example, about 100 Å to about 300 Å. When the thickness of each of the first emission layer 132_a_−1 and the second emission layer 132_b_−1 is within these ranges, excellent luminescence characteristics may be obtained without a substantial increase in driving voltage.

In an embodiment, a maximum emission wavelength of light emitted from at least one of the m emitting units 130-1, 130-2, . . . , and 130-_m_ may be different from a maximum emission wavelength of light emitted from at least one of the remaining m emitting units. Since the emission layer 132-1 of the first emitting unit 130-1 has a multi-layered structure as described above, light emitted from the first emitting unit 130-1 may be mixed color light, and more particularly, the first emitting unit 130-1 may have an emission spectrum with at least two peaks. In addition, each emission layer 132-2, and 132-_m_ of the second emitting unit 130-2 and the $m^{th}$ emitting unit 130-_m_ may each independently have i) a single-layered structure consisting of a single layer consisting of a single material, ii) a single-layered structure consisting of a single layer consisting of a plurality of different materials, or iii) a multi-layered structure having a plurality of layers consisting of a plurality of different materials. Accordingly, light emitted from the second emitting unit 130-2 and the $m^{th}$ emitting unit 130-_m_ may be single-color light or mixed-color light. In an embodiment, a maximum emission wavelength of light emitted from the second emitting unit 130-2 may be identical to a maximum emission wavelength of light emitted from the $m^{th}$ emitting unit 130-_m_, but may be different from the maximum emission wavelength of the light emitted from the first emitting unit 130-1. In one or more embodiments, the maximum emission wavelength of light emitted from the first emitting unit 130-1, the maximum emission wavelength of the light emitted from the second emitting unit 130-2, and the maximum emission wavelength of light emitted from the $m^{th}$ emitting unit 130-_m_ may be different from one another.

In an embodiment, the m−1 emission layers 132-2, . . . , and 132-_m_ included in the m−1 emitting units 130-2, . . . , and 130-_m_, respectively, may each independently include a phosphorescent dopant, a fluorescent dopant, a delayed fluorescence material, or any combination thereof.

In one or more embodiments, the m−1 emission layers 132-2, . . . , and 132-_m_ may all include: a phosphorescent dopant; a fluorescent dopant; or a delayed fluorescence material.

In one or more embodiments, at least one of the m−1 emission layers 132-2, . . . , and 132-_m_ may include a phosphorescent dopant and the remaining emission layers may include a fluorescent dopant. In one or more embodiments, at least one of the m−1 emission layers 132-2, . . . , and 132-_m_ may include a phosphorescent dopant and the remaining emission layers may include a delayed fluorescence material. In one or more embodiments, at least one of the m−1 emission layers 132-2, . . . , and 132-_m_ may include a fluorescent dopant and the remaining emission layers may include a delayed fluorescence material.

In one or more embodiments, at least one of the m−1 emission layers 132-2, . . . , 132-_m_ may include a phosphorescent dopant, at least one of the remaining emission layers may include a fluorescent dopant, and the remaining emission layers may include a delayed fluorescence material.

For example, all dopants included in the m−1 emission layers 132-2, . . . , and 132-_m_ may be identical to or different from each other.

In an embodiment, m may be an integer of 3 or more.

In the light-emitting device 10, m may be 3 or 4.

In particular, when m is 4 and considering that the first emitting unit 130-1 includes the multi-layered emission layers 132-1 as described above, light emitted from the first emitting unit 130-1 may each be mixed color light, and light emitted from the second emitting unit 130-2 and the third emitting unit (not shown) may each emit blue fluorescence, and the fourth emitting unit 130-_m_ may emit green phosphorescence.

In an embodiment, the first electrode 110 may be an anode, and the second electrode 150 may be a cathode.

[First Electrode 110]

In FIG. 1, a substrate may be additionally located under the first electrode 110 or on the second electrode 150. In an embodiment, for the substrate, a glass substrate or a plastic substrate may be used. In one or more embodiments, the substrate may be a flexible substrate, and for example, may include plastics with excellent heat resistance and durability, such as polyimide, polyethylene terephthalate (PET), polycarbonate, polyethylene napthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. In an embodiment, when the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure consisting of a single layer or a multi-layered structure including a plurality of layers. For example, the first electrode 110 may have a three-layered structure of ITO/Ag/ITO.

[Interlayer 130]

The interlayer 130 is located on the first electrode 110. The interlayer 130 may include the emission layers 132-1, 132-2, . . . , and 132-*m*.

The interlayer 130 may include hole transport regions 131-1, 131-2, . . . , and 131-*m* between the first electrode 110 and each of the emission layers 132-1, 132-2, . . . , and 132-*m*, respectively, and electron transport regions 133-1, 133-2, . . . , and 133-*m* between each of the emission layers 132-1, 132-2, . . . , and 132-*m* and the second electrode 150, respectively.

The interlayer 130 may further include, in addition to various organic materials, a metal-containing compound, such as an organometallic compound, an inorganic material, such as a quantum dot, and the like.

In an embodiment, as described above, the interlayer 130 may include, i) two or more emitting units sequentially stacked between the first electrode 110 and the second electrode 150 and ii) a charge generation unit located between two emitting units. When the interlayer 130 includes the emitting units and the charge generation unit as described above, the light-emitting device 10 may be a tandem light-emitting device (see FIG. 1).

[Hole Transport Region 131-1, 131-2, . . . , or 131-*m* in interlayer 130]

The hole transport region 131-1, 131-2, . . . , or 131-*m* may have: i) a single-layered structure consisting of a single layer consisting of a single material, ii) a single-layered structure consisting of a single layer consisting of a plurality of different materials, or iii) a multi-layered structure including a plurality of layers including different materials.

Multi-layered hole transport layers in the hole transport regions 131-1, 131-2, . . . and 131-*m* may have the above-described layer configuration.

The hole transport region 131-1 which does not include multi-layered hole transport layers 131*a*-2 to 131*c*-2, . . . , and 131*a-m* to 131*c-m* may include a hole injection layer, a hole transport layer, an emission auxiliary layer, an electron blocking layer, or any combination thereof.

For example, the hole transport region 130 may hole transport region 131-1 which does not include multi-layered hole transport layers 131*a*-2 to 131*c*-2, . . . , and 131*a-m* to 131*c-m* may have a multi-layered structure, such as a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the constituent layers of each structure are stacked sequentially from the first electrode 110 in the stated order.

The hole transport region 131-1, 131-2, . . . , or 131-*m* may include a compound represented by Formula 201, a compound represented by Formula 202, or any combination thereof:

Formula 201

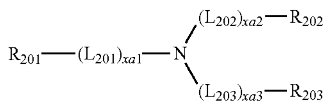

-continued

Formula 202

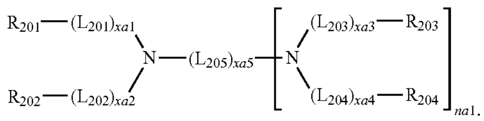

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer of 0 to 5, xa5 may be an integer of 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer of 1 to 4.

For example, each of Formulae 201 and 202 may include at least one of groups represented by Formulae CY201 to CY217:

CY201

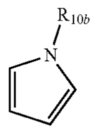

CY202

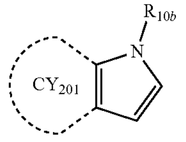

CY203

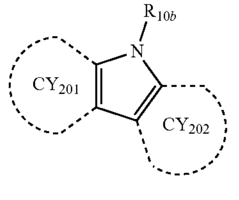

-continued

CY204

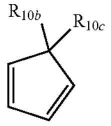

CY205

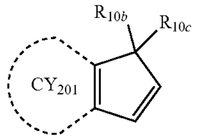

CY206

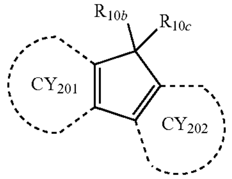

CY207

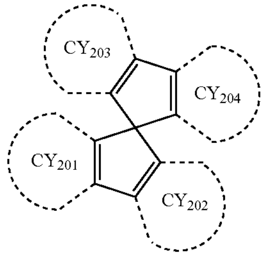

CY208

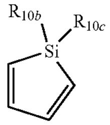

CY209

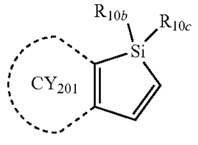

CY210

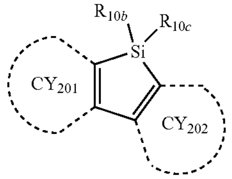

CY211

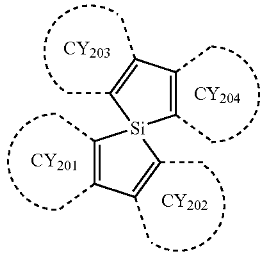

CY212

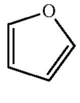

-continued

CY213

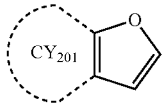

CY214

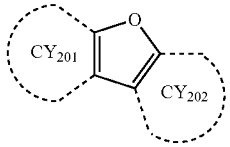

CY215

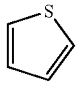

CY216

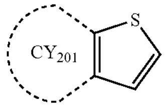

CY217

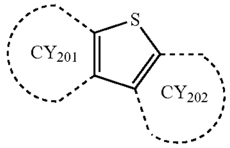

.

In Formulae CY201 to CY217, $R_{10b}$ and $R_{10c}$ may each be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one of groups represented by Formulae CY201 to CY203.

In one or more embodiments, Formula 201 may include at least one of groups represented by Formulae CY201 to CY203 and at least one of groups represented by Formulae CY204 to CY217.

In one or more embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include groups represented by Formulae CY201 to CY203.

In one or more embodiments, each of Formulae 201 and 202 may not include groups represented by Formulae CY201 to CY203, and may include at least one of groups represented by Formulae CY204 to CY217.

In one or more embodiments, each of Formulae 201 and 202 may not include groups represented by Formulae CY201 to CY217.

For example, the hole transport region 131-1, 131-2, . . . , or 131-*m* may include one of Compounds HT1 to HT44, m-MTDATA, TDATA, 2-TNATA, NPB(NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate (PEDOT/PSS), polyaniline/camphor sulfonic acid (PANI/CSA), polyaniline/poly(4-styrenesulfonate) (PANI/PSS), or any combination thereof:
HT1
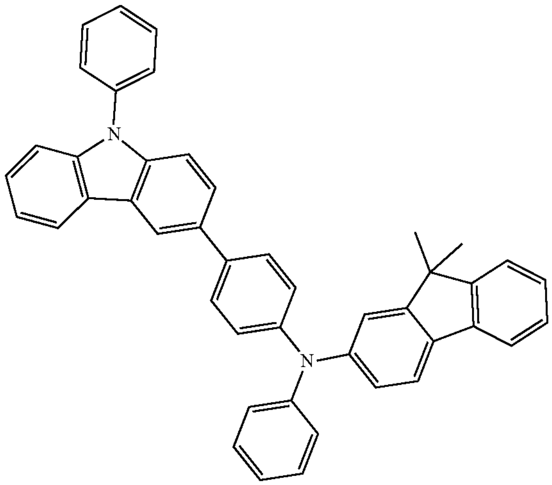
HT2
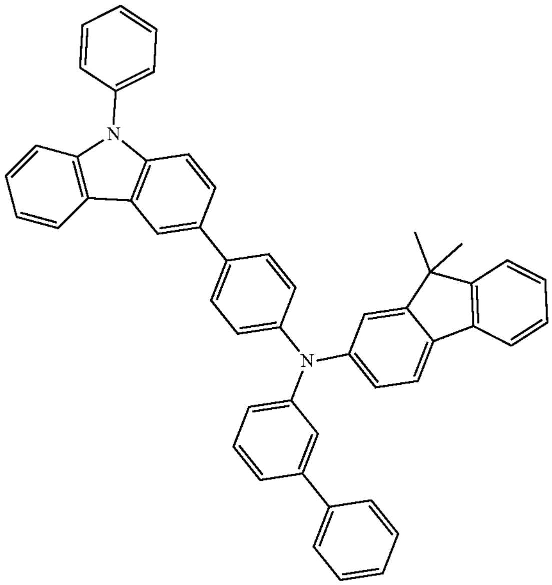
HT3
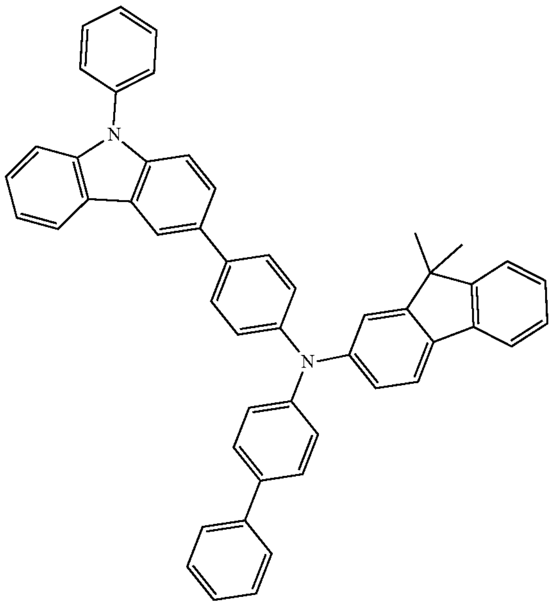
HT4
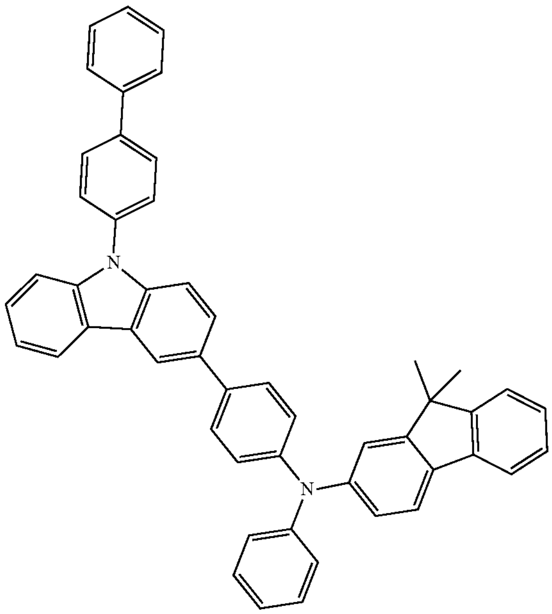

-continued
HT5
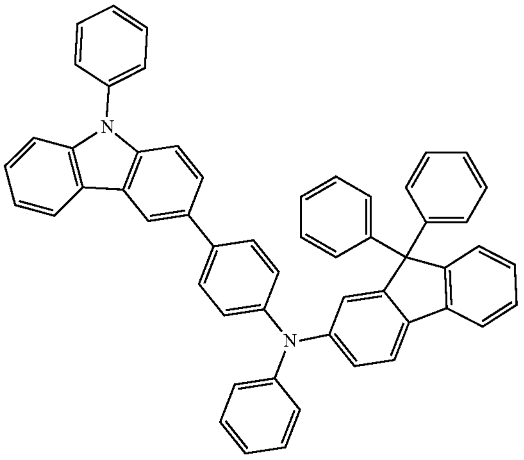
HT6
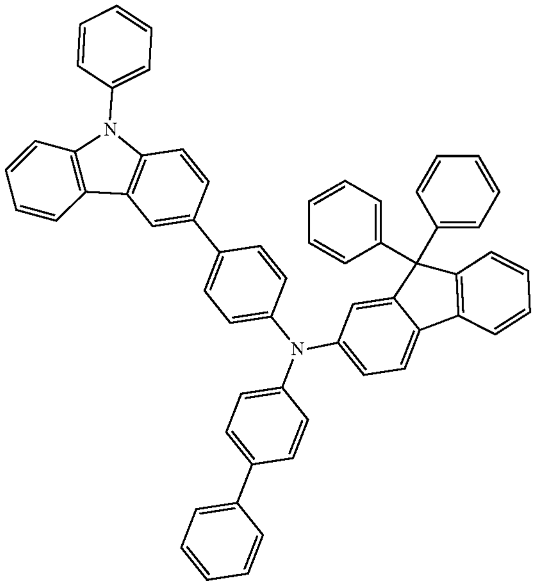
HT7
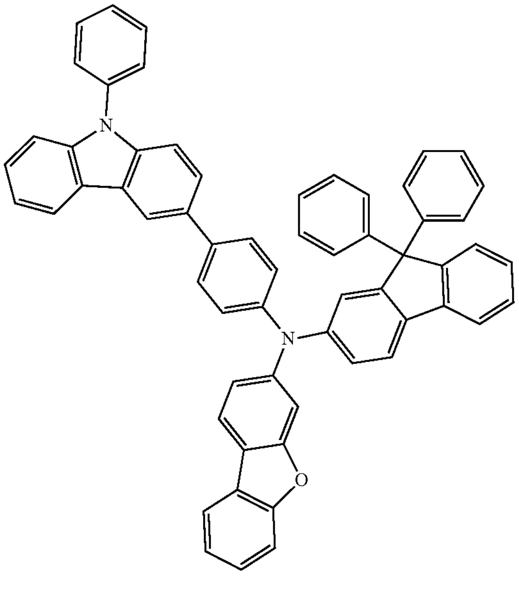
HT8
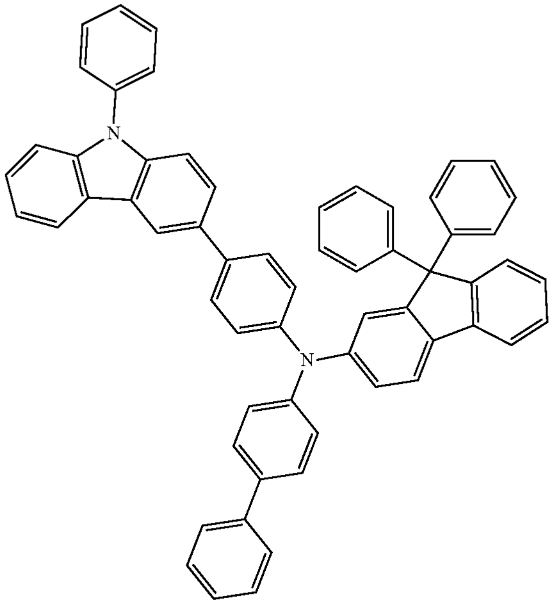

-continued
HT9
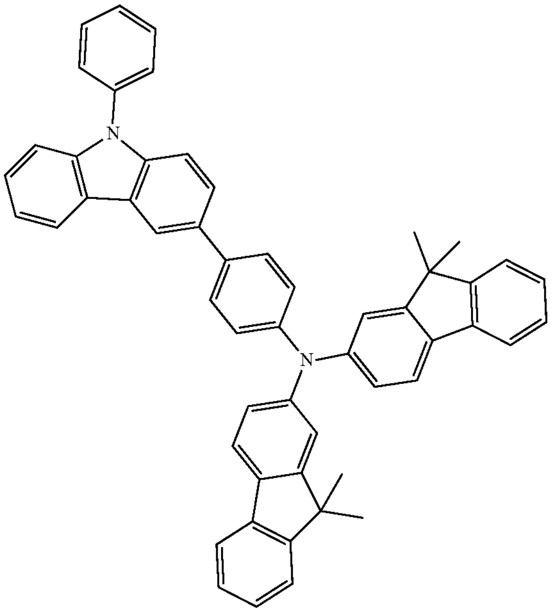
HT10
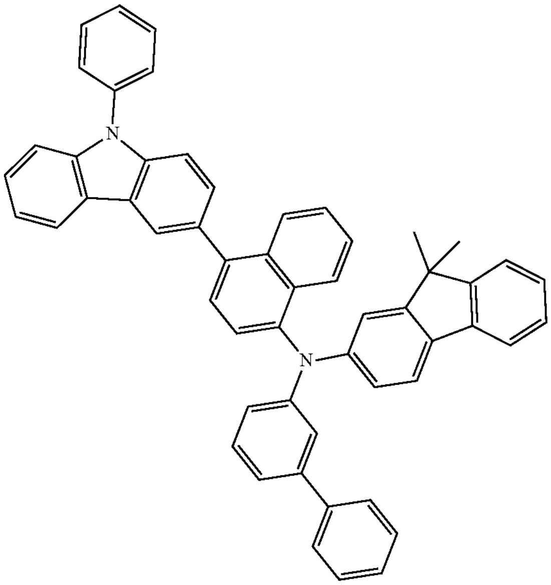
HT11
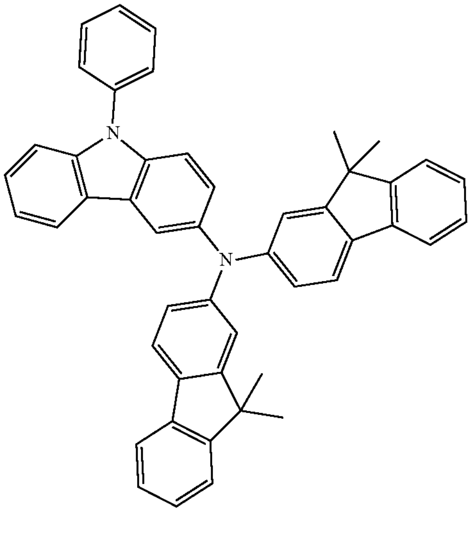
HT12
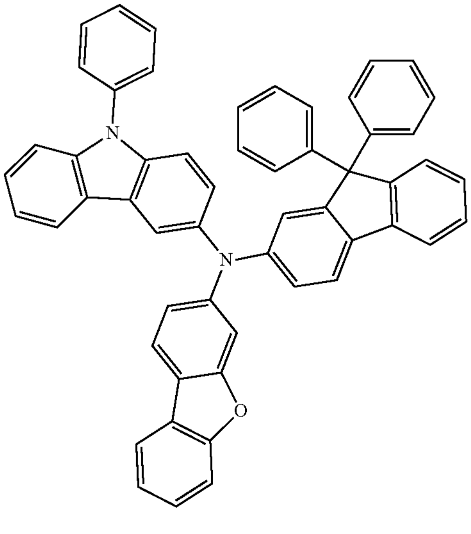

-continued
HT13
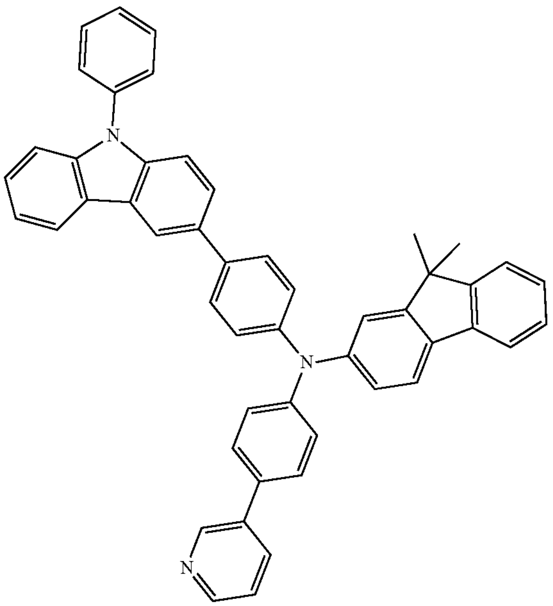
HT14
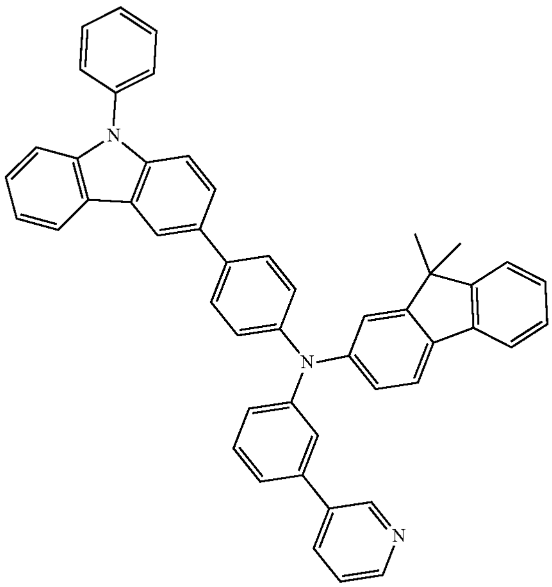
HT15
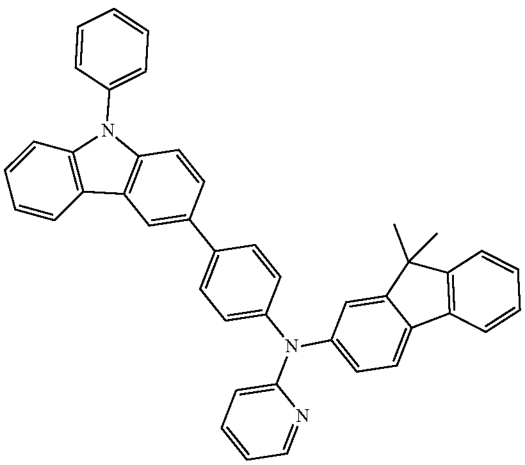
HT16
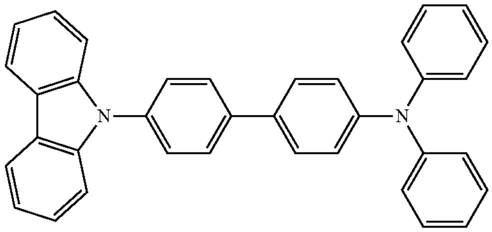
HT17
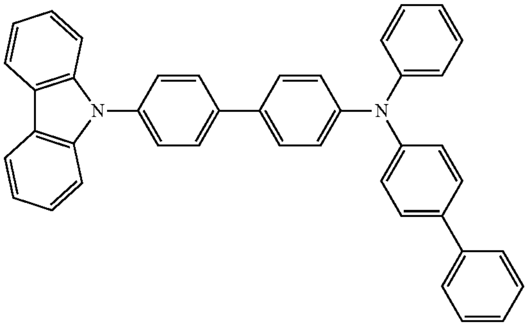
HT18
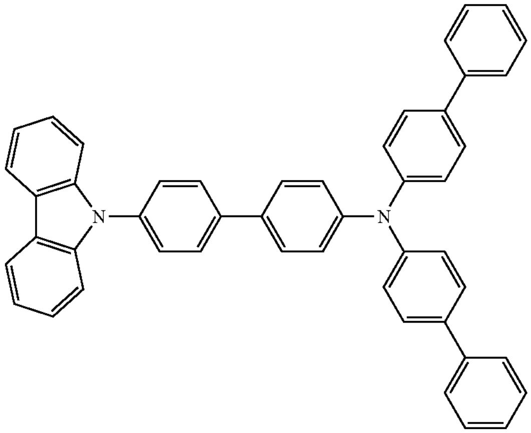

-continued
HT19
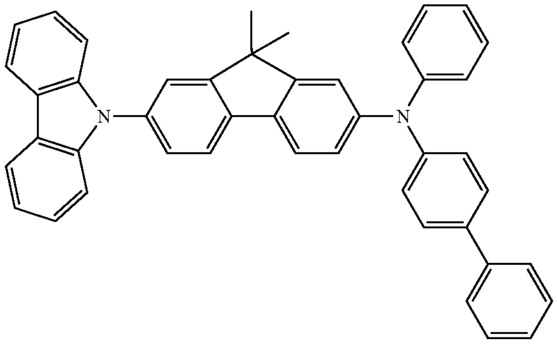
HT20
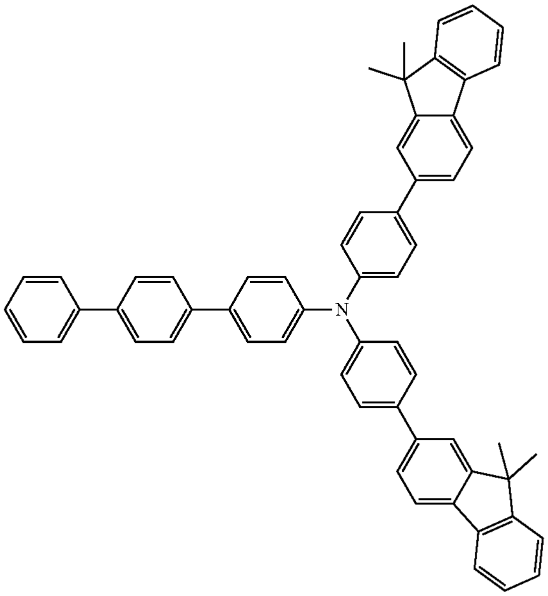
HT21
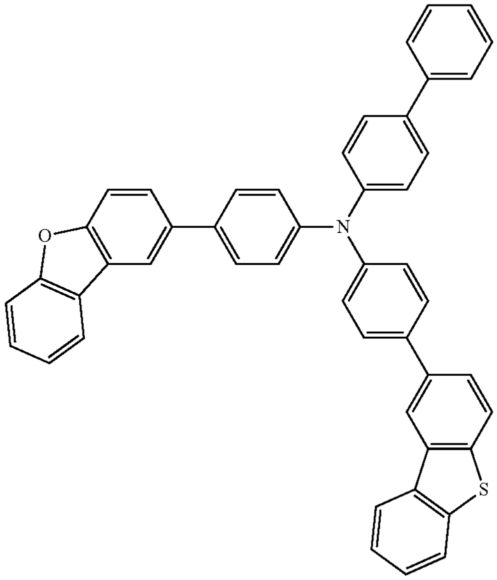
HT22
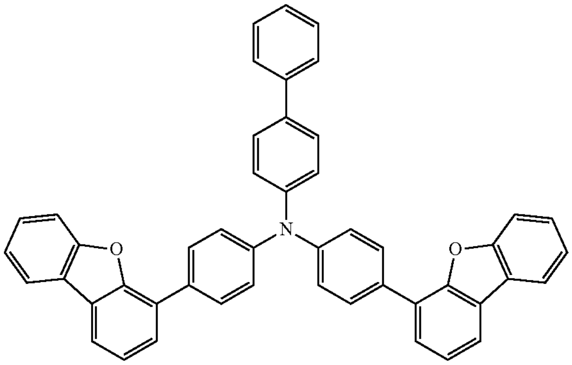

-continued
HT23
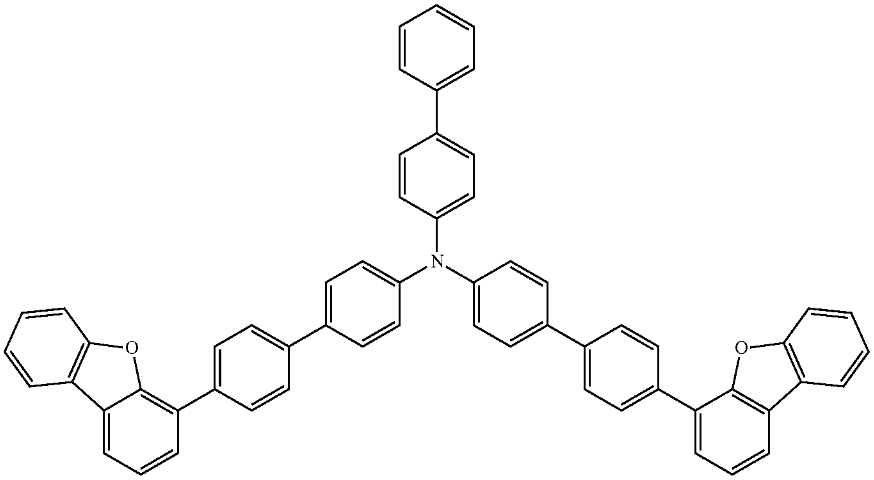
HT24
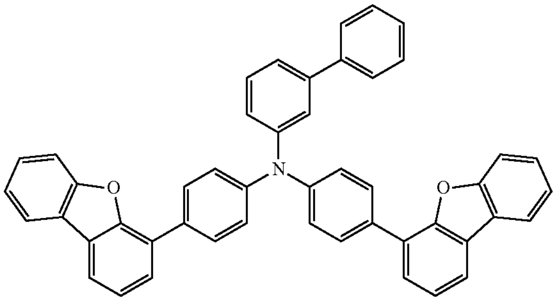
HT25
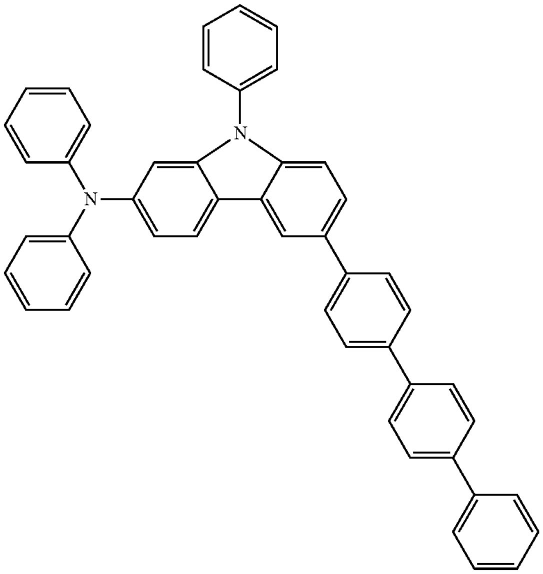
HT26
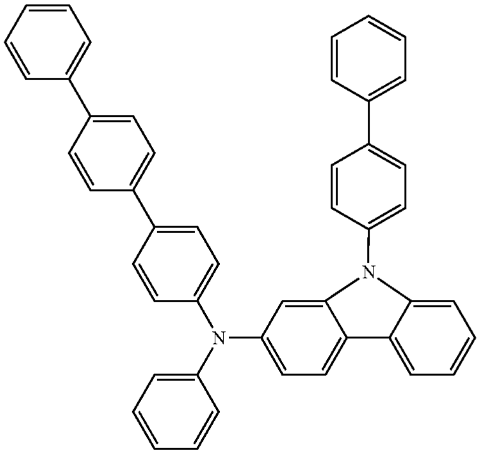
HT27
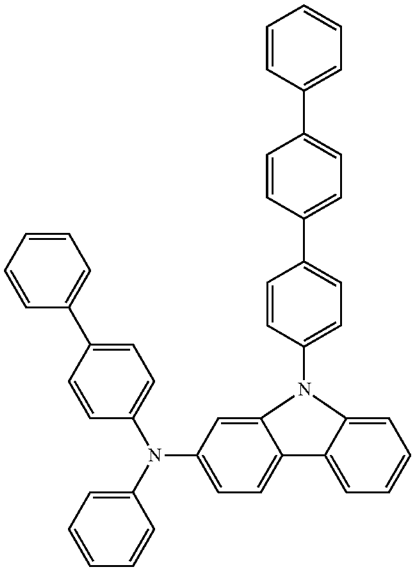

-continued
HT28
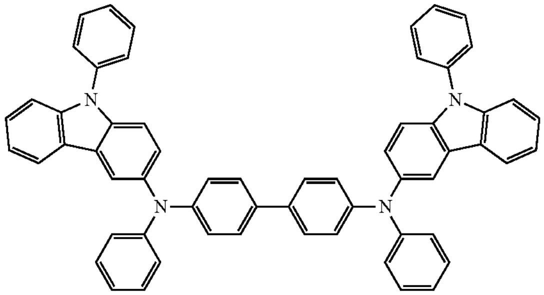
HT29
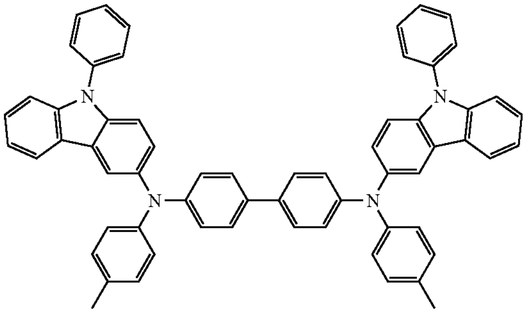
HT30
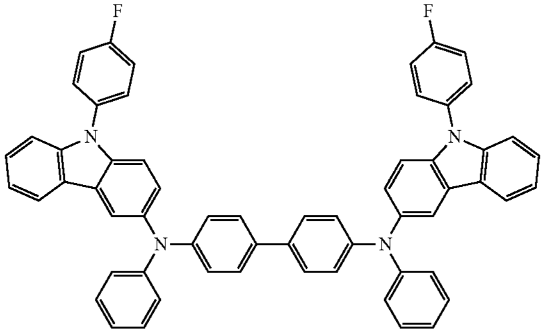
HT31
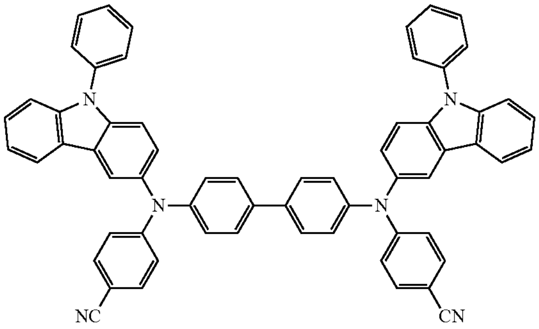
HT32
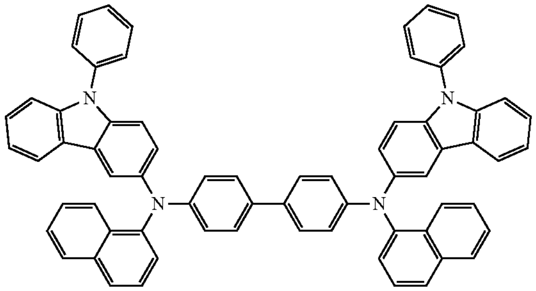
HT33
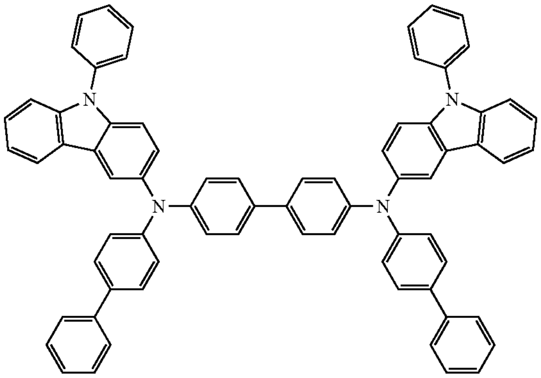
HT34
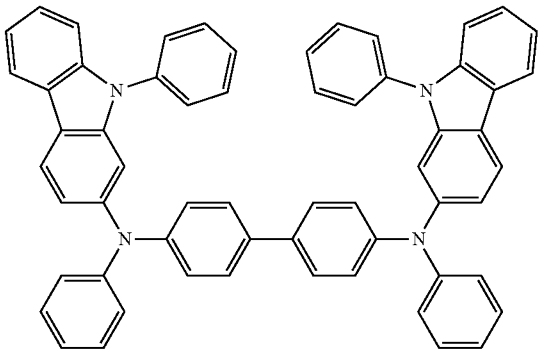
HT35
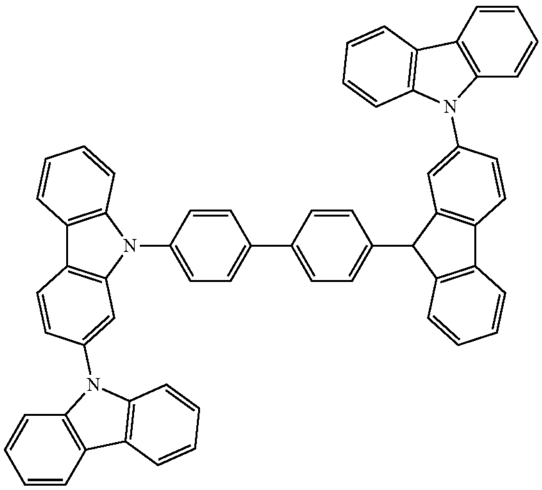

-continued
HT36
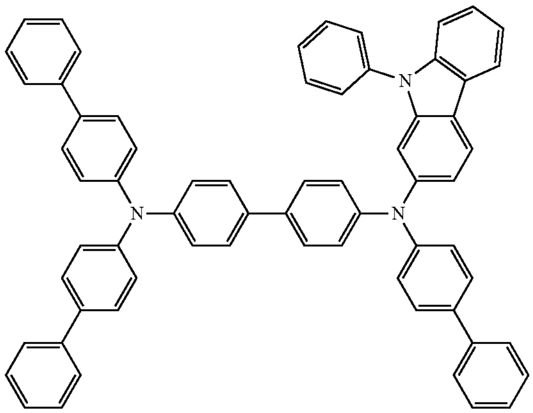
HT37
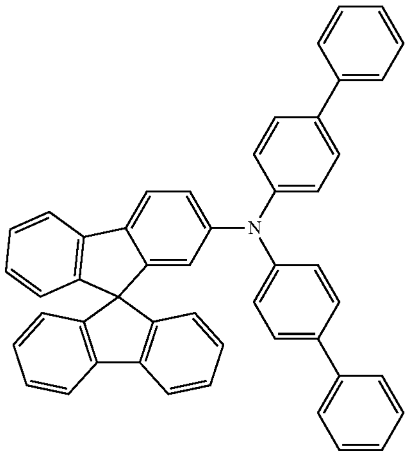
HT38
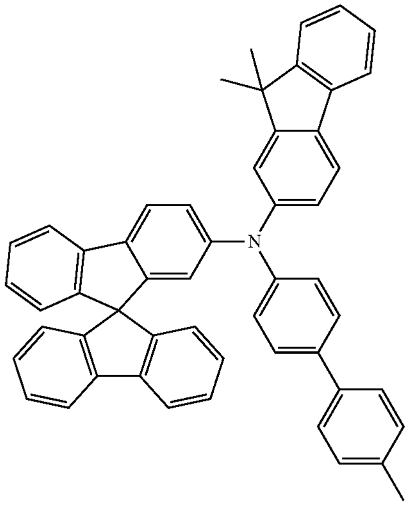
HT39
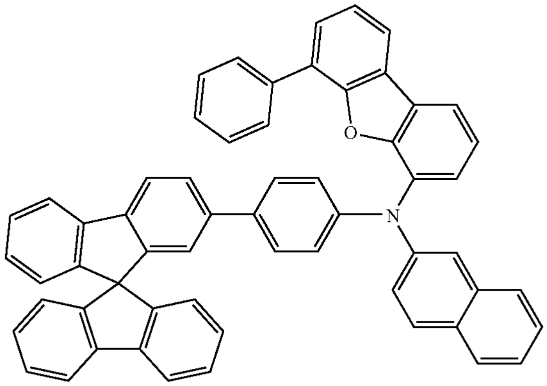
HT40
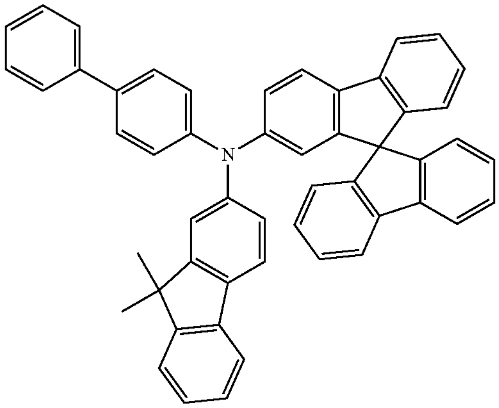
HT41
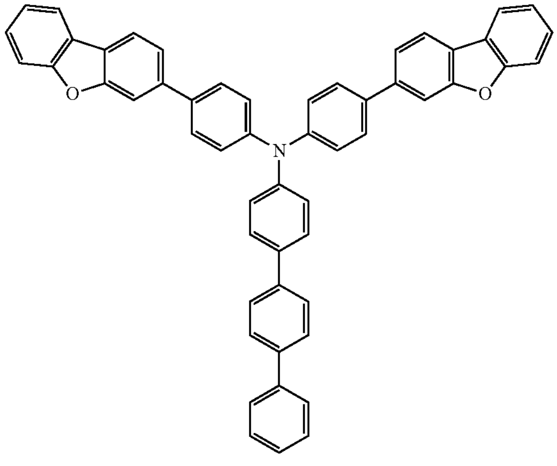

-continued
HT42
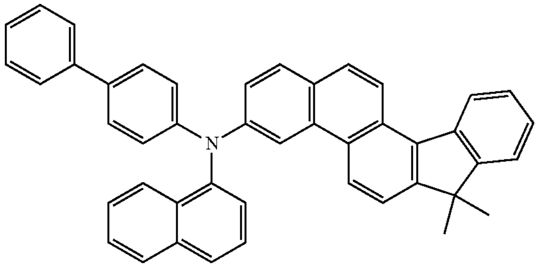
HT43
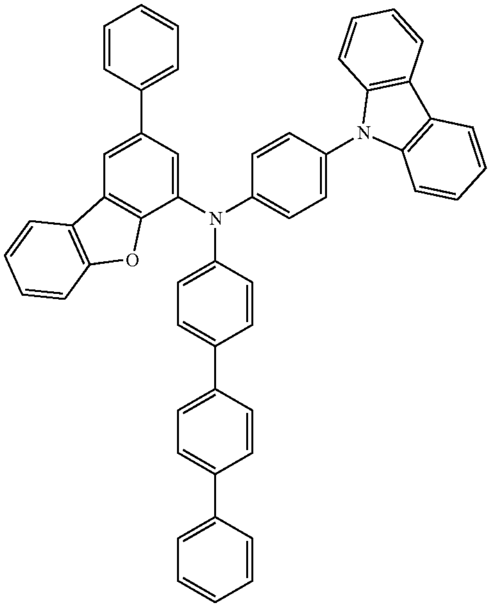
HT44
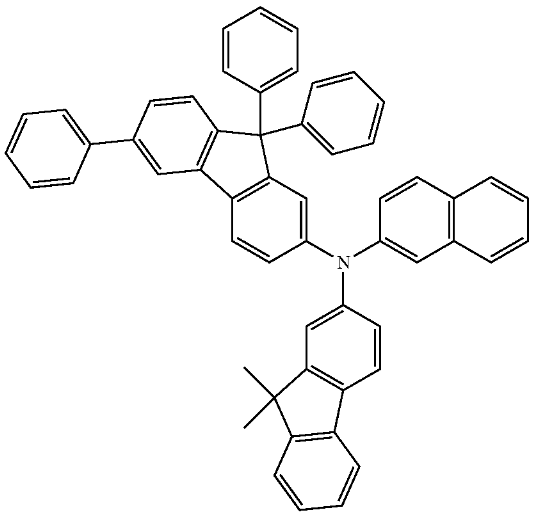
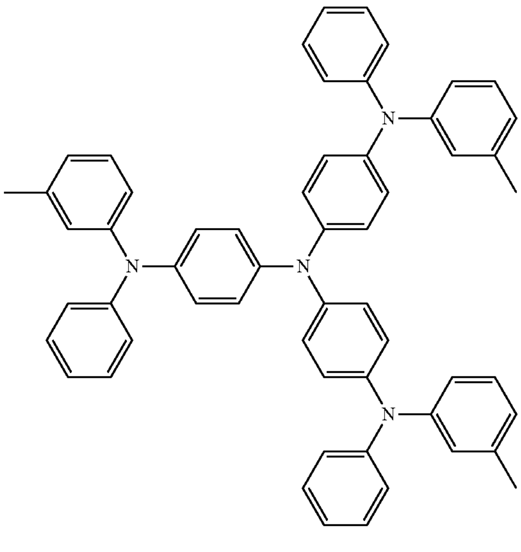
m-MTDATA

-continued
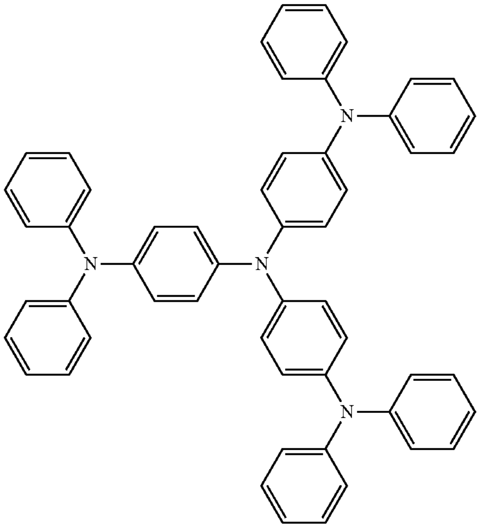
TDATA
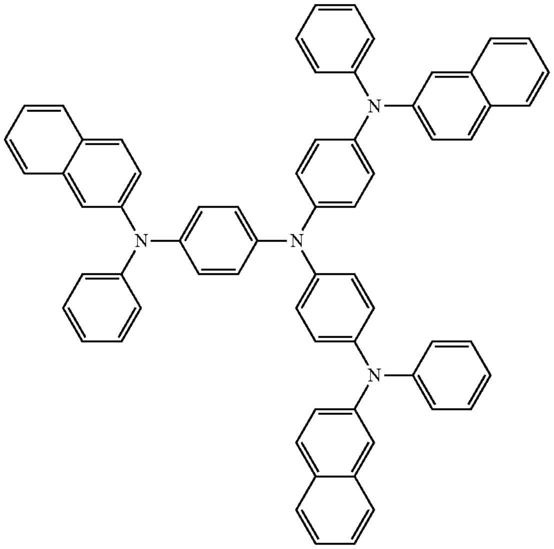
2-TNATA
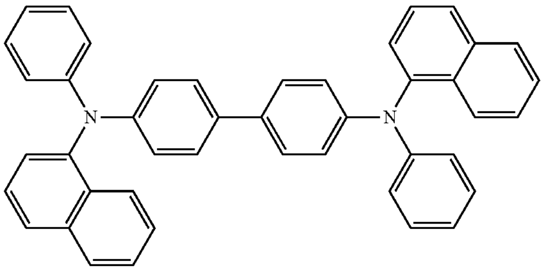
NPB
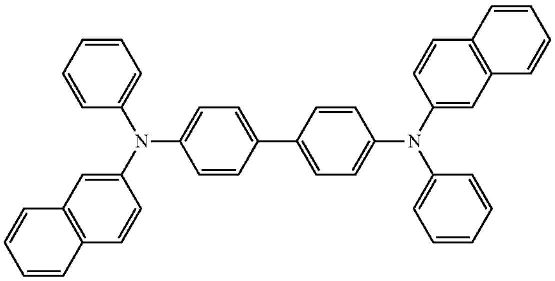
β-NPB
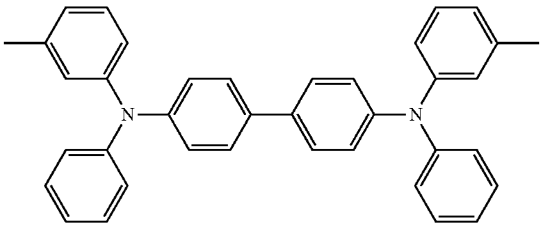
TPD
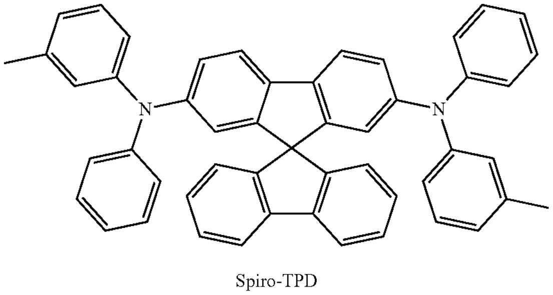
Spiro-TPD
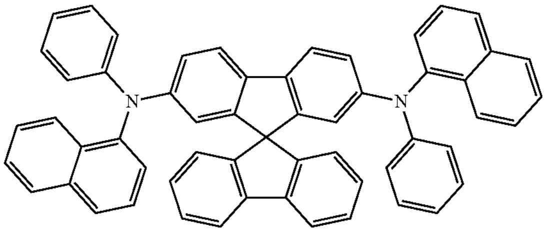
Spiro-NPB
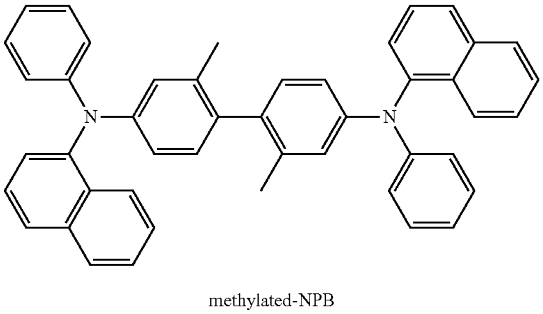
methylated-NPB -continued

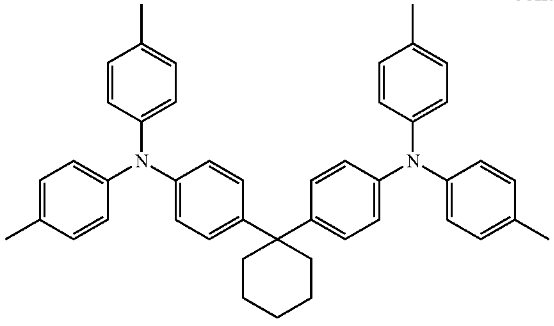

TAPC

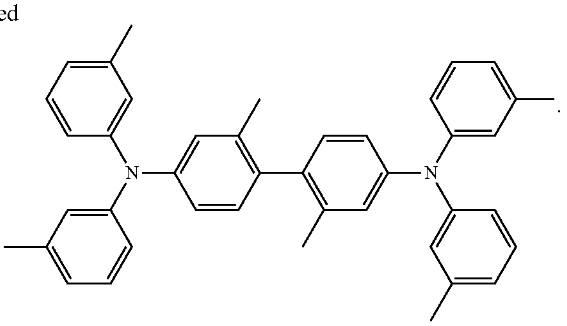

HMTPD

A thickness of the hole transport region 131-1, 131-2, . . . , or 131-*m* may be in a range of about 50 Å to about 10,000 Å, for example, about 100 Å to about 4,000 Å. When the hole transport region 131-1, 131-2, . . . , or 131-*m* includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region 131-1, 131-2, . . . , or 131-*m*, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted from the emission layer, and the electron blocking layer may block the flow of electrons from the electron transport region. The emission auxiliary layer and the electron blocking layer may include the materials as described above.

[p-Dopant]

The hole transport region 131-1, 131-2, . . . , or 131-*m* may further include, in addition to these materials, a charge generation material for the improvement of conductive properties. The charge generation material may be uniformly or non-uniformly dispersed in the hole transport region 131-1, 131-2, . . . , or 131-*m* (for example, in the form of a single layer consisting of a charge generation material).

The charge generation material may be, for example, a p-dopant.

For example, a lowest unoccupied molecular orbital (LUMO) energy level of the p-dopant may be about −3.5 eV or less.

In an embodiment, the p-dopant may include a quinone derivative, a cyano group-containing compound, a compound containing element EL1 and element EL2, or any combination thereof.

Examples of the quinone derivative are TCNQ, F4-TCNQ, and the like.

Examples of the cyano group-containing compound are HAT-CN, a compound represented by Formula 221, and the like:

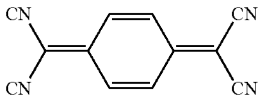

TCNQ

-continued

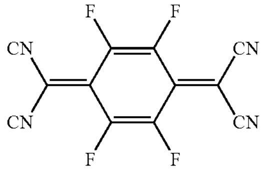

F4-TCNQ

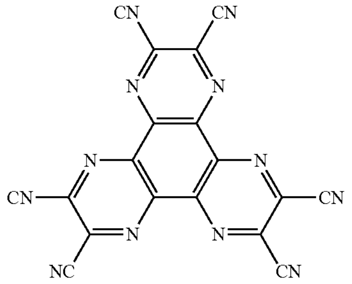

HAT-CN

Formula 221

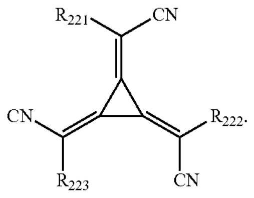

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof, or any combination thereof.

The cyano group-containing compound may be, for example, P-D1:

P-D1

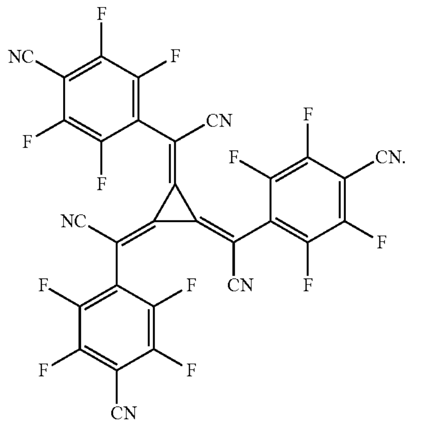

In the compound including element EL1 and element EL2, element EL1 may be metal, metalloid, or any combination thereof, and element EL2 may be non-metal, metalloid, or any combination thereof.

Examples of the metal are: an alkali metal (for example, lithium (Li), sodium (Na), potassium (K), rubidium (Rb), cesium (Cs), and the like); alkaline earth metal (for example, beryllium (Be), magnesium (Mg), calcium (Ca), strontium (Sr), barium (Ba), and the like); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and the like); post-transition metal (for example, zinc (Zn), indium (In), tin (Sn), and the like); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and the like).

Examples of the metalloid are silicon (Si), antimony (Sb), tellurium (Te), and the like.

Examples of the non-metal are oxygen (O), halogen (for example, F, Cl, Br, I, and the like), and the like.

Examples of the compound including element EL1 and element EL2 are metal oxide, metal halide (for example, metal fluoride, metal chloride, metal bromide, metal iodide, and the like), metalloid halide (for example, metalloid fluoride, metalloid chloride, metalloid bromide, metalloid iodide, and the like), metal telluride, or any combination thereof.

Examples of the metal oxide are tungsten oxide (for example, WO, $W_2O_3$, $WO_2$, $WO_3$, $W_2O_5$, and the like), vanadium oxide (for example, VO, $V_2O_3$, $VO_2$, $V_2O_5$, and the like), molybdenum oxide (MoO, $Mo_2O_3$, $MoO_2$, $MoO_3$, $Mo_2O_5$, and the like), rhenium oxide (for example, $ReO_3$ and the like), and the like.

Examples of the metal halide are alkali metal halide, alkaline earth metal halide, transition metal halide, post-transition metal halide, lanthanide metal halide, and the like.

Examples of the alkali metal halide are LiF, a NaF, KF, RbF, CsF, LiCl, a NaCl, KCl, RbCl, CsCl, LiBr, a NaBr, KBr, RbBr, CsBr, LiI, a NaI, KI, RbI, CsI, and the like.

Examples of the alkaline earth metal halide are $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of the transition metal halide are titanium halide (for example, $TiF_4$, $TiCl_4$, $TiBr_4$, $TiI_4$, and the like), zirconium halide (for example, $ZrF_4$, $ZrCl_4$, $ZrBr_4$, $ZrI_4$, and the like), hafnium halide (for example, $HfF_4$, $HfCl_4$, $HfBr_4$, $HfI_4$, and the like), vanadium halide (for example, $VF_3$, $VCl_3$, $VBr_3$, $VI_3$, and the like), niobium halide (for example, $NbF_3$, $NbCl_3$, $NbBr_3$, $NbI_3$, and the like), tantalum halide (for example, $TaF_3$, $TaCl_3$, $TaBr_3$, $TaI_3$, and the like), chromium halide (for example, $CrF_3$, $CrCl_3$, $CrBr_3$, $CrI_3$, and the like), molybdenum halide (for example, $MoF_3$, $MoCl_3$, $MoBr_3$, $MoI_3$, and the like), tungsten halide (for example, $WF_3$, $WCl_3$, $WBr_3$, $WI_3$, and the like), manganese halide (for example, $MnF_2$, $MnCl_2$, $MnBr_2$, $MnI_2$, and the like), technetium halide (for example, $TcF_2$, $TcCl_2$, $TcBr_2$, $TcI_2$, and the like), rhenium halide (for example, $ReF_2$, $ReCl_2$, $ReBr_2$, $ReI_2$, and the like), iron halide (for example, $FeF_2$, $FeCl_2$, $FeBr_2$, $FeI_2$, and the like), ruthenium halide (for example, $RuF_2$, $RuCl_2$, $RuBr_2$, $RuI_2$, and the like), osmium halide (for example, $OsF_2$, $OsCl_2$, $OsBr_2$, $OsI_2$, and the like), cobalt halide (for example, $CoF_2$, $CoCl_2$, $CoBr_2$, $CoI_2$, and the like), rhodium halide (for example, $RhF_2$, $RhCl_2$, $RhBr_2$, $RhI_2$, and the like), iridium halide (for example, $IrF_2$, $IrCl_2$, IrBr2, $IrI_2$, and the like), nickel halide (for example, $NiF_2$, $NiCl_2$, $NiBr_2$, $NiI_2$, and the like), palladium halide (for example, $PdF_2$, $PdCl_2$, $PdBr_2$, $PdI_2$, and the like), platinum halide (for example, $PtF_2$, $PtCl_2$, $PtBr_2$, $PtJ_2$, and the like), copper halide (for example, CuF, CuCl, CuBr, CuI, and the like), silver halide (for example, AgF, AgCl, AgBr, AgI, and the like), gold halide (for example, AuF, AuCl, AuBr, AuI, and the like), and the like.

Examples of the post-transition metal halide are zinc halide (for example, $ZnF_2$, $ZnCl_2$, $ZnBr_2$, $ZnI_2$, and the like), indium halide (for example, $InI_3$ and the like), tin halide (for example, $SnI_2$, and the like), and the like.

Examples of the lanthanide metal halide are YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, $SmI_3$, and the like.

Examples of the metalloid halide antimony halide (for example, $SbCl_5$ and the like) and the like.

Examples of the metal telluride are alkali metal telluride (for example, $Li_2Te$, a $na_2Te$, $K_2Te$, $Rb_2Te$, $Cs_2Te$, and the like), alkaline earth metal telluride (for example, BeTe, MgTe, CaTe, SrTe, BaTe, and the like), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and the like), post-transition metal telluride (for example, ZnTe, and the like), lanthanide metal telluride (for example, LaTe, CeTe, PrTe, NdTe, PmTe, EuTe, GdTe, TbTe, DyTe, HoTe, ErTe, TmTe, YbTe, LuTe, and the like), and the like.

[Emission Layer 132-1, 132-2, . . . , or **132-*m* in interlayer 130**]

The emission layer 132-1, 132-2, . . . , or **132-*m*** may be the same as described herein.

Unless otherwise defined in the above description, the emission layer 132-1, 132-2, . . . , or **132-*m*** may include a host and a dopant. In this regard, the dopant may include a phosphorescent dopant, a fluorescent dopant, a delayed fluorescence material, or any combination thereof.

Unless otherwise defined in the above description, an amount of the dopant in the emission layer 132-1, 132-2, . . . , or 132-*m* may be in a range of about 0.01 parts by weight to about 15 parts by weight based on 100 parts by weight of the host.

In an embodiment, the emission layer 132-1, 132-2, . . . , or 132-*m* may include a quantum dot.

In one or more embodiments, the emission layer 132-1, 132-2, . . . , or 132-*m* may include a delayed fluorescence material. The delayed fluorescence material may act as a host or a dopant in the emission layer 132-1, 132-2, . . . , or 132-*m*.

A thickness of the emission layer 132-1, 132-2, . . . , or 132-*m* may be in a range of about 100 Å to about 1,000 Å, for example, about 200 Å to about 600 Å. When the thickness of the emission layer 132-1, 132-2, . . . , or 132-*m* is within these ranges, excellent luminescence characteristics may be obtained without a substantial increase in driving voltage.

[Host]

In an embodiment, the host may further include a compound represented by Formula 301:

Formula 301

$$[Ar_{301}]_{xb11}\text{-}[(L_{301})_{xb1}\text{-}R_{301}]_{xb21}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer of 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer of 1 to 5, and $Q_{301}$ to $Q_{303}$ may each be the same as described in connection with $Q_1$.

For example, when xb11 in Formula 301 is 2 or more, two or more of $Ar_{301}$ may be linked together via a single bond.

In one or more embodiments, the host may include a compound represented by Formula 301-1, a compound represented by Formula 301-2, or any combination thereof.

Formula 301-1

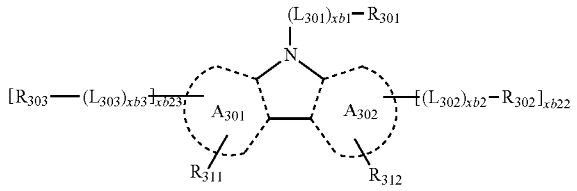

Formula 301-2

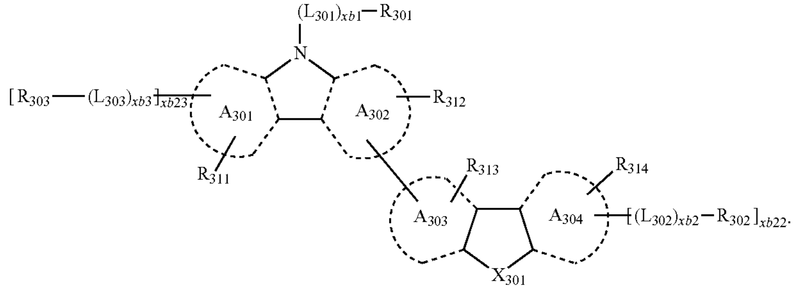

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-$[(L_{304})_{xb4}$-$R_{304}]$, $C(R_{304})(R_{305})$, or $Si(R_{304})(R_{305})$, xb22 and xb23 may each independently be 0, 1, or 2, $L_{301}$, xb1, and $R_{301}$ may each be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each be the same as described in connection with $R_{301}$.

In one embodiment, the host may include an alkaline earth-metal complex. For example, the host may include a Be complex (for example, Compound H55), an Mg complex, a Zn complex, or any combination thereof.

In one or more embodiments, the host may include one of Compounds H1 to H126, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), 2,2',2"-(1,3,5-benzinetriyl)-tris(1-phenyl-1-H-benzimidazole) (TPBi), or any combination thereof, but inventive concepts are not limited thereto:

H1
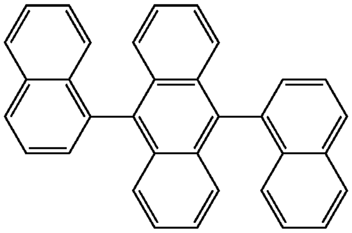
H2
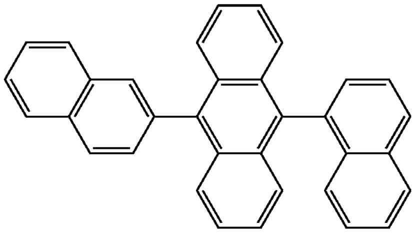
H3
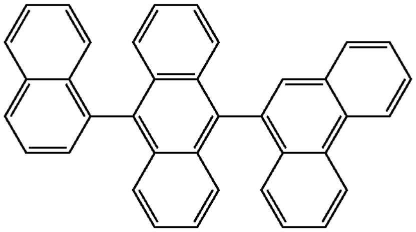
H4
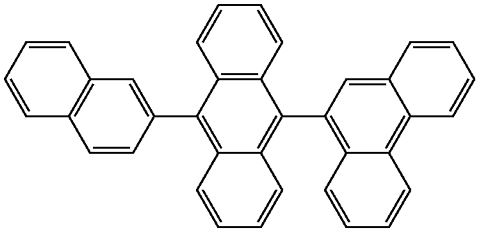
H5
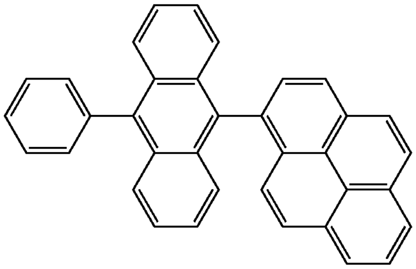
H6
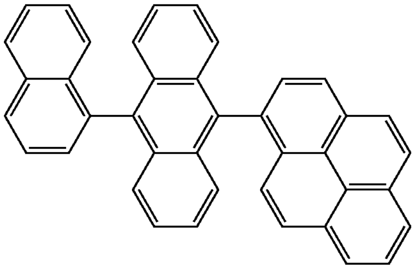
H7
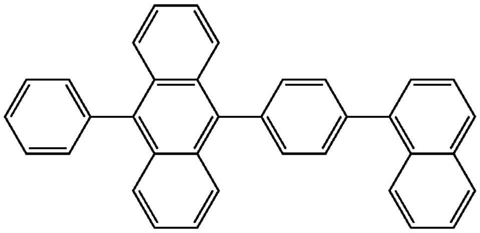
H8
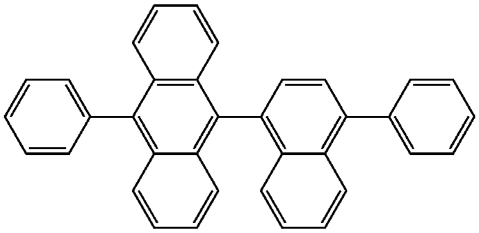
H9
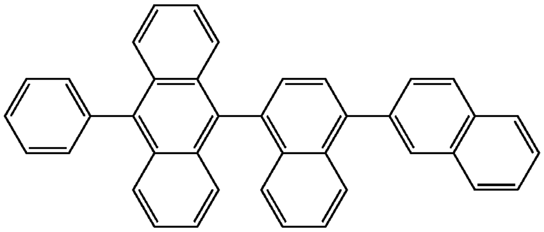
H10
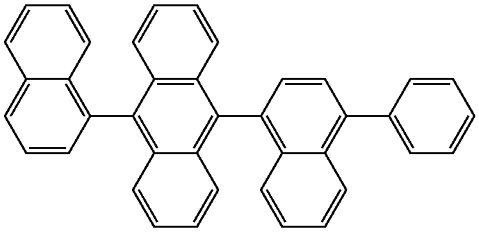
H11
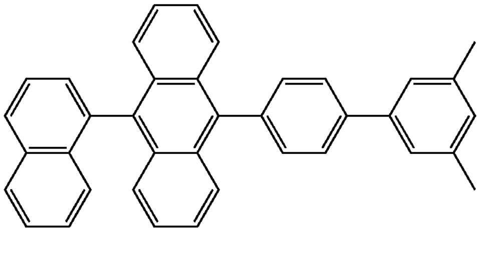
H12
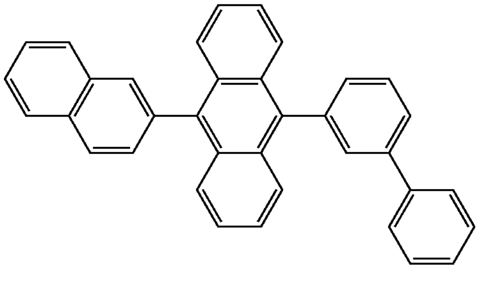

-continued
H13
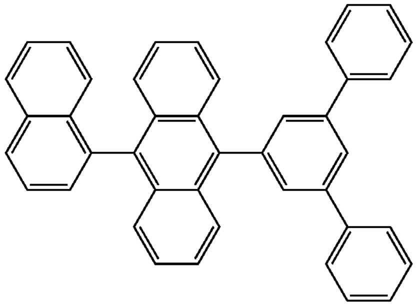
H14
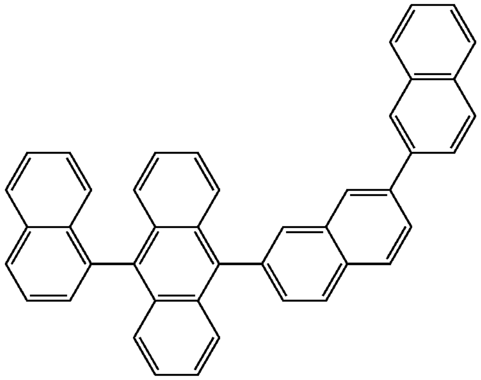
H15
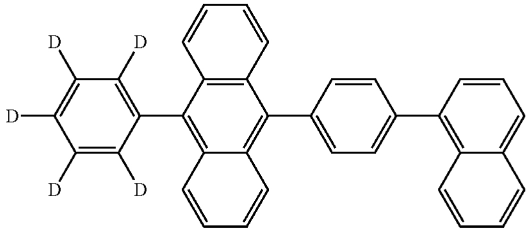
H16
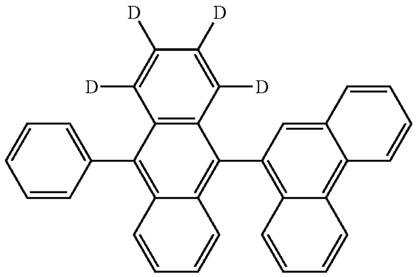
H17
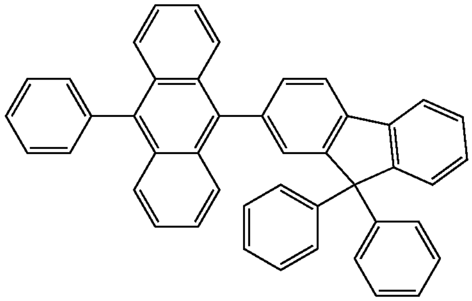
H18
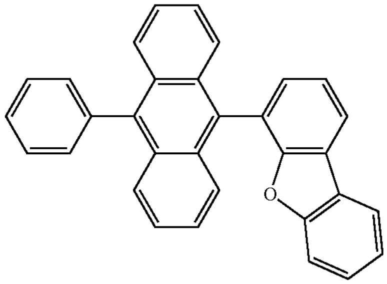
H19
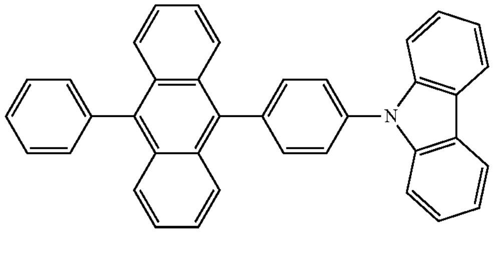
H20
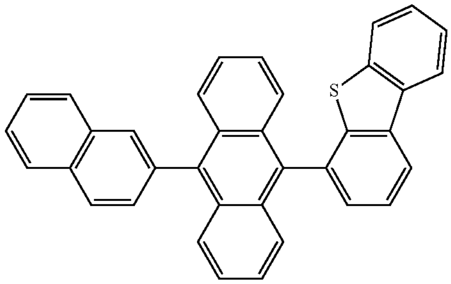

-continued
H21
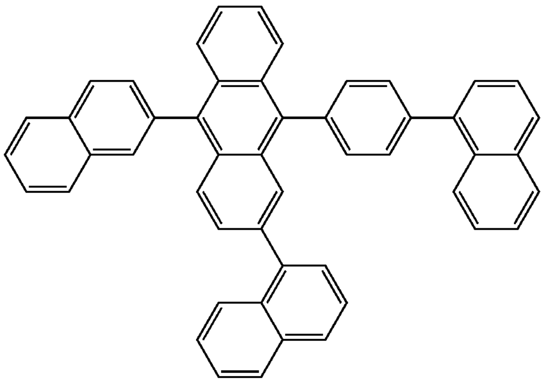
H22
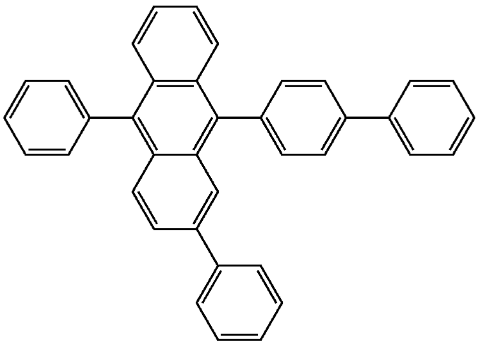
H23
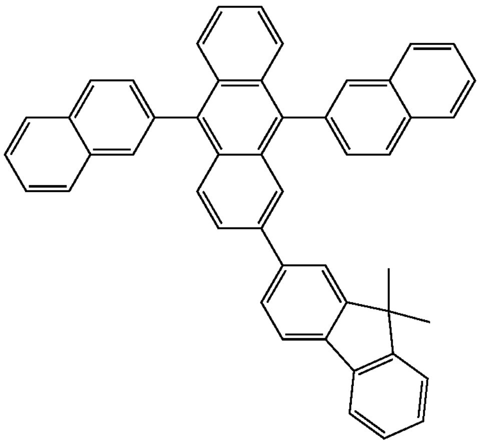
H24
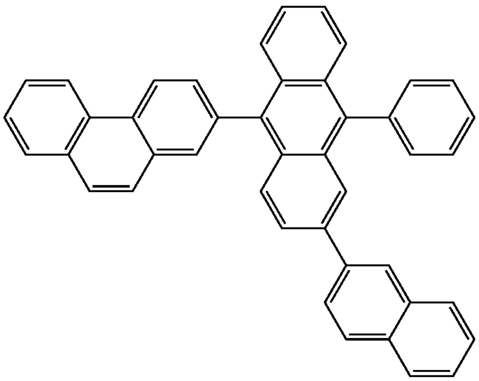
H25
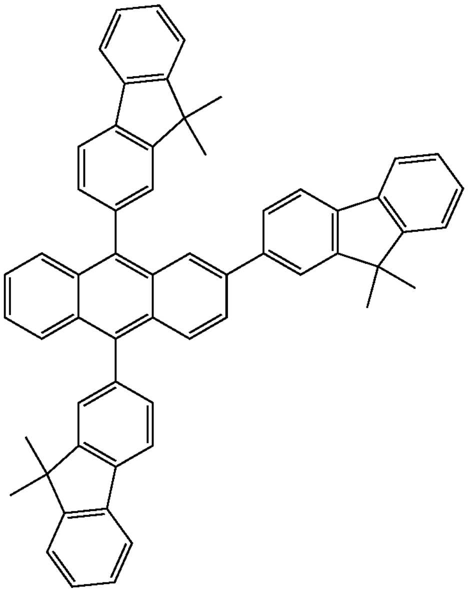
H26
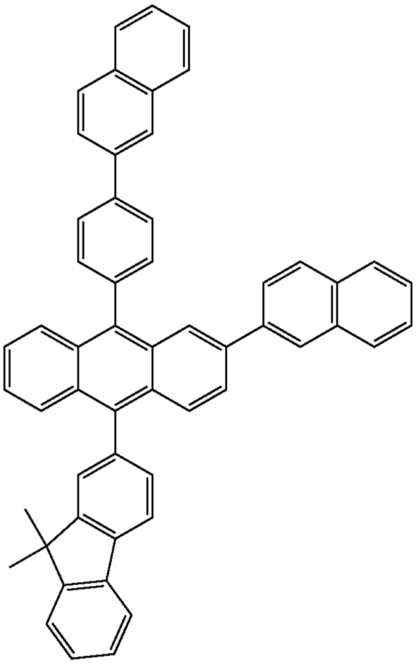

-continued
H27
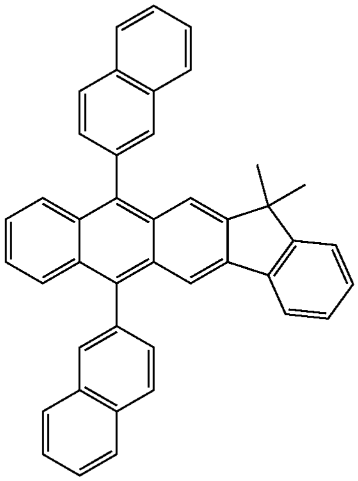
H28
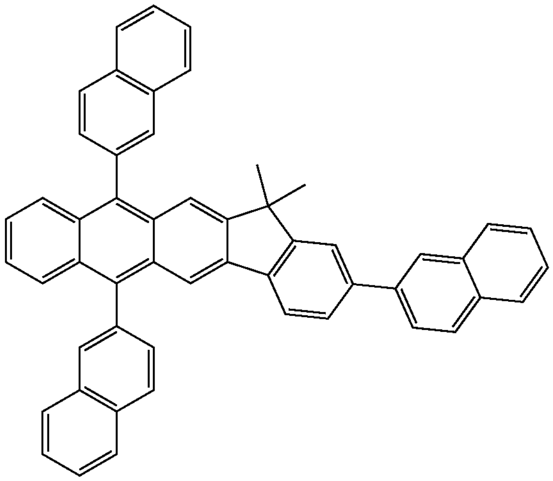
H29
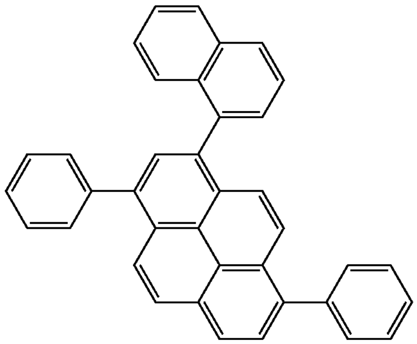
H30
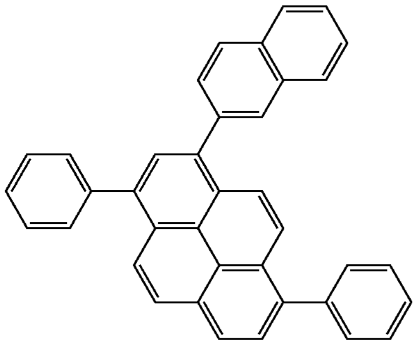
H31
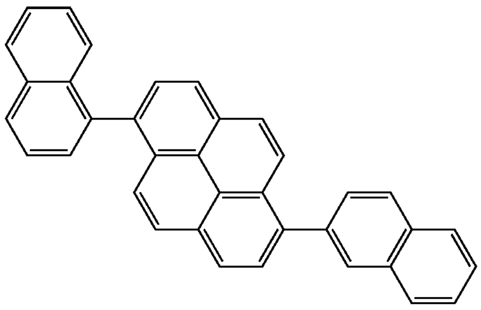
H32
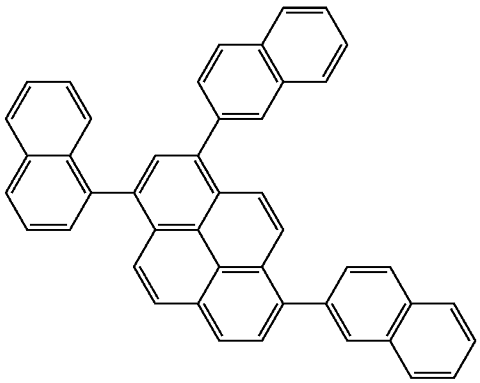
H33
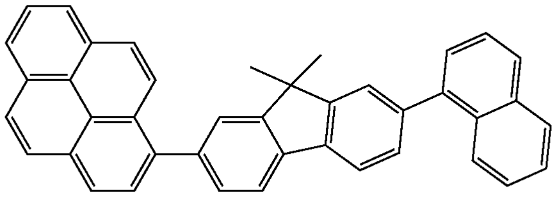

-continued
H34
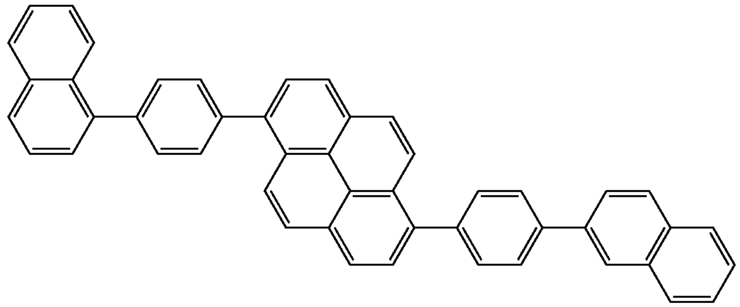
H35
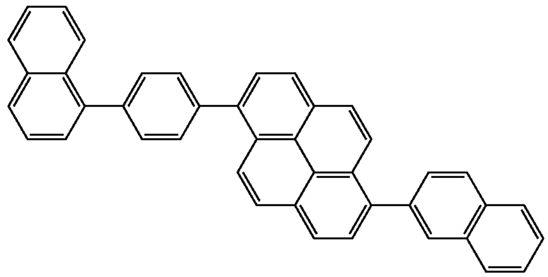
H36
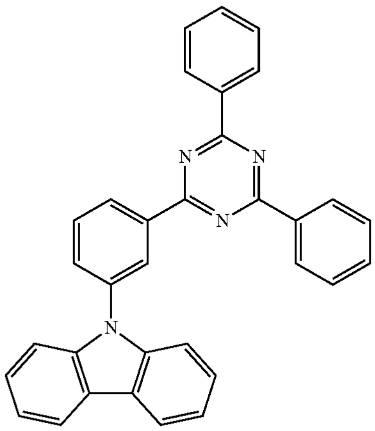
H37
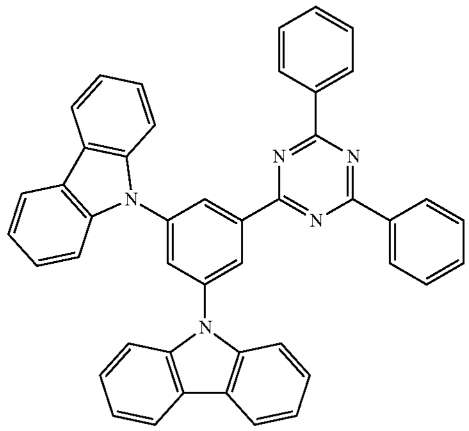
H38
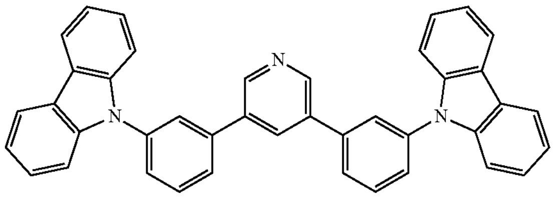

-continued
H39
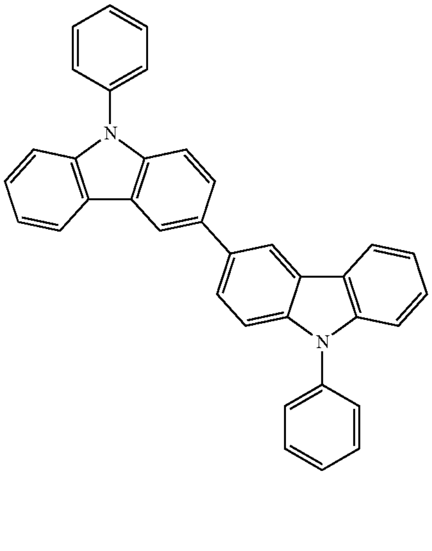
H40
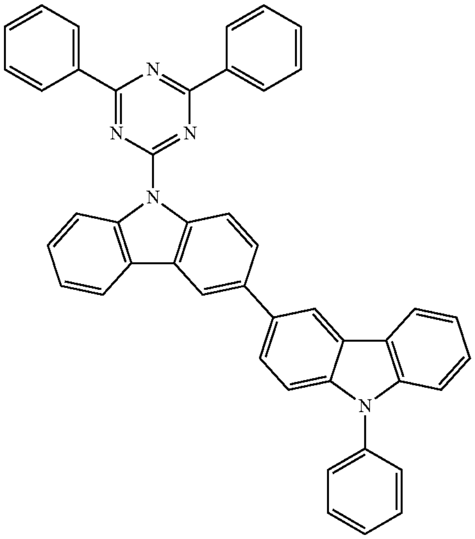
H41
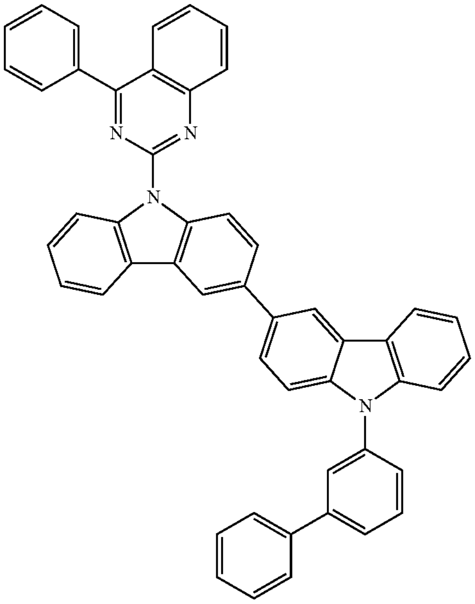
H42
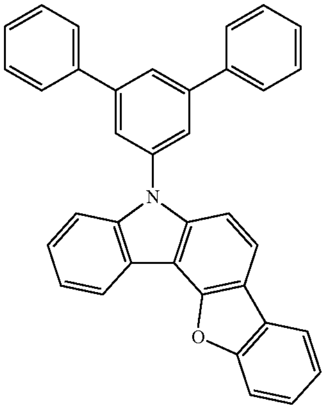
H43
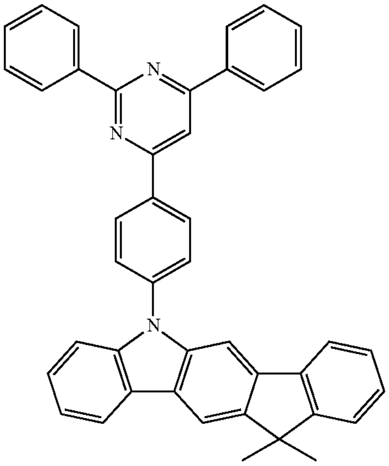
H44
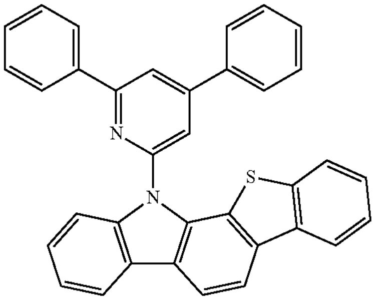

-continued
H45
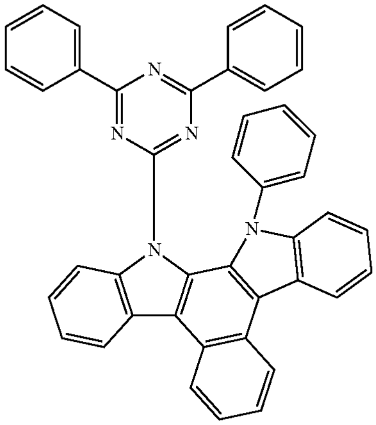
H46
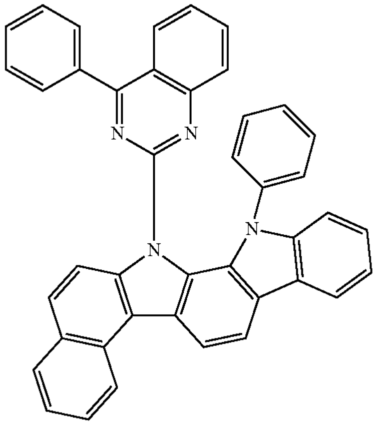
H47
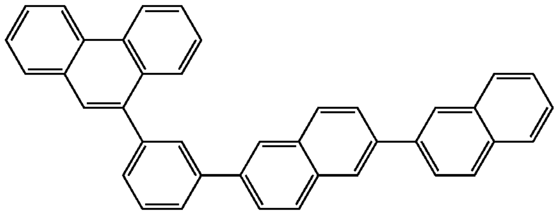
H48
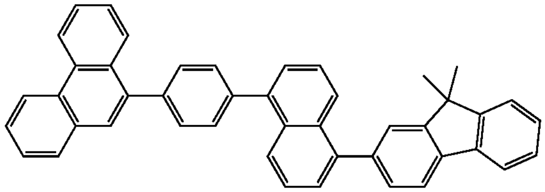
H49
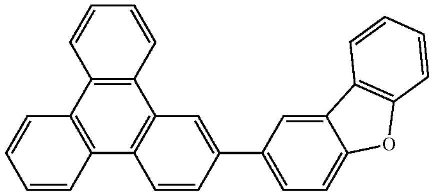
H50
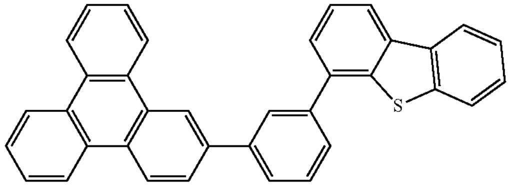
H51
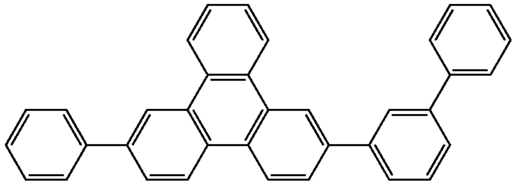
H52
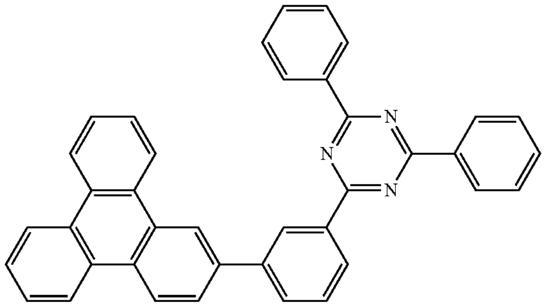
H53
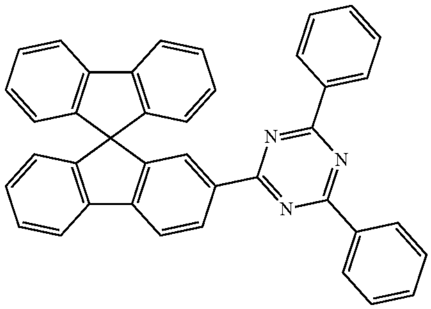

-continued
H54
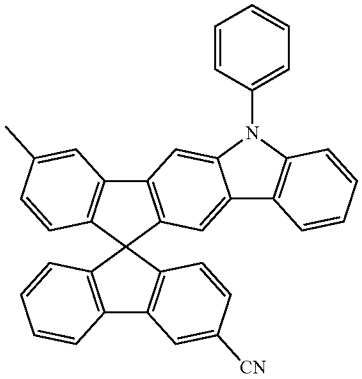
H55
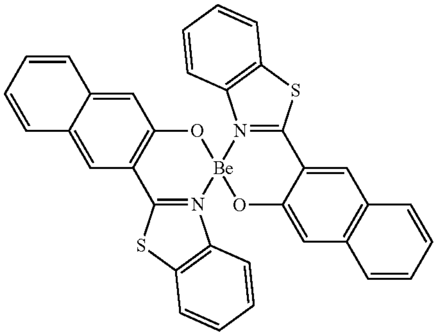
H56
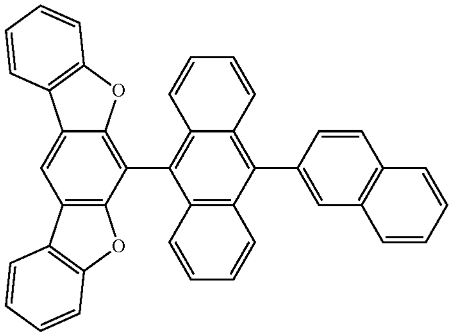
H57
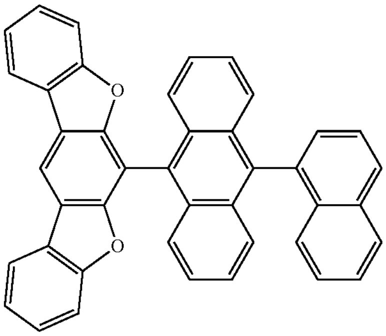
H58
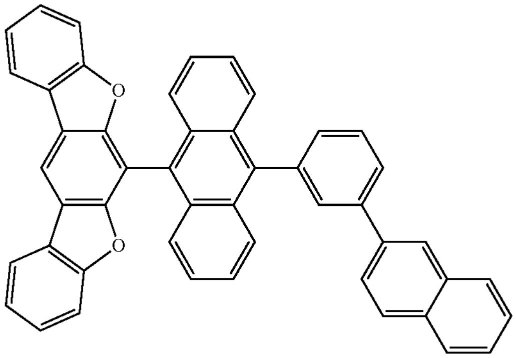
H59
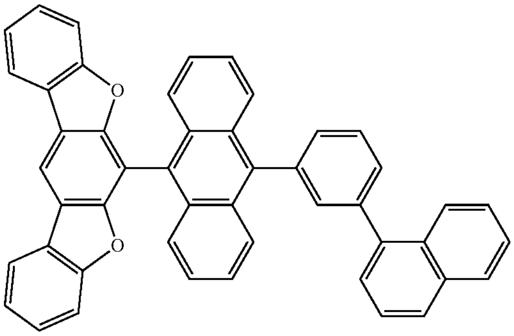
H60
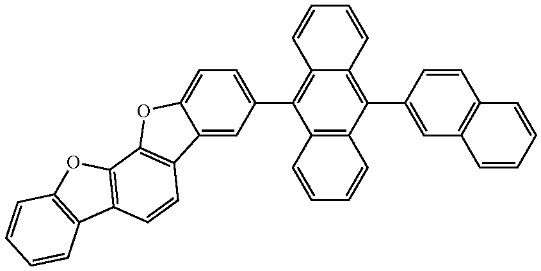
H61
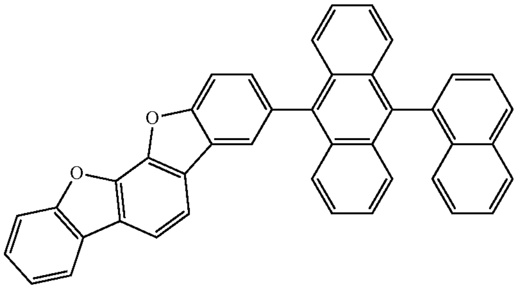

-continued
H62
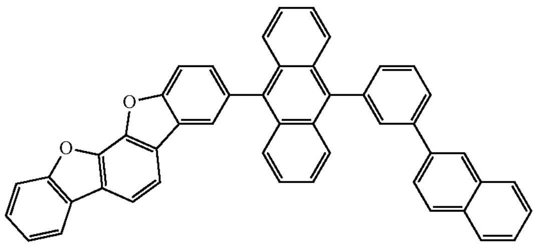
H63
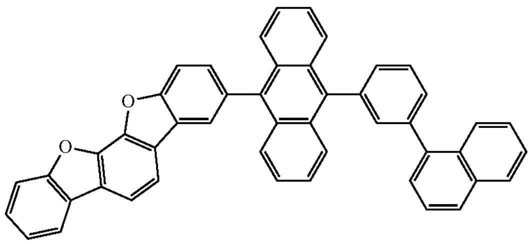
H64
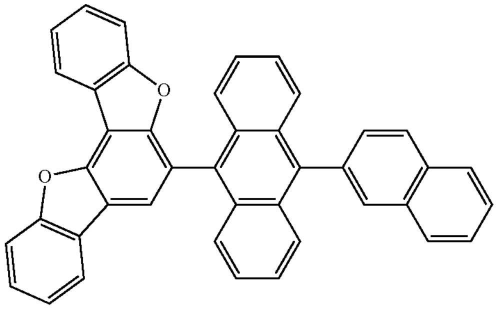
H65
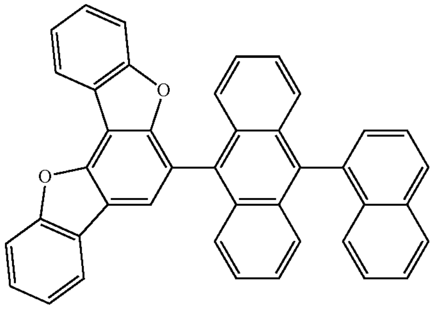
H66
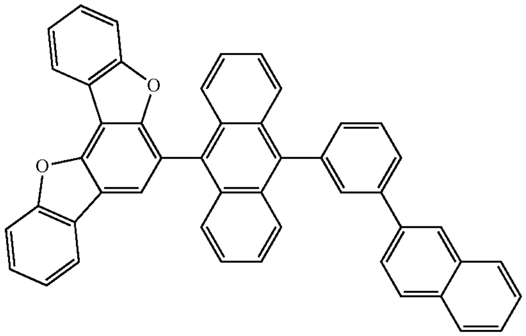
H67
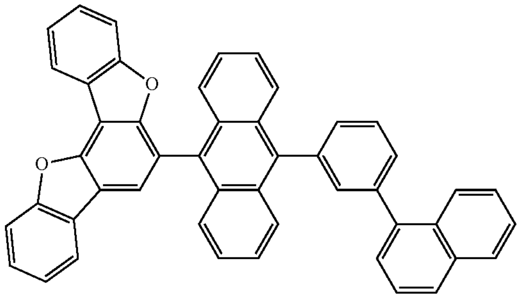
H68
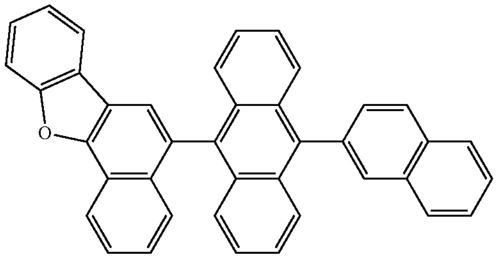
H69
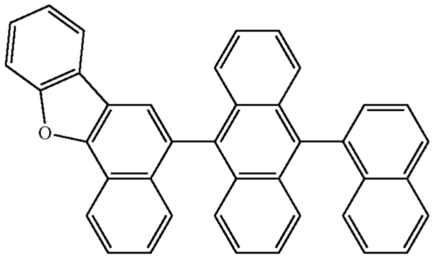
H70
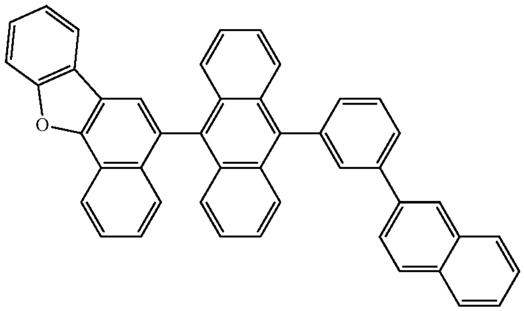
H71
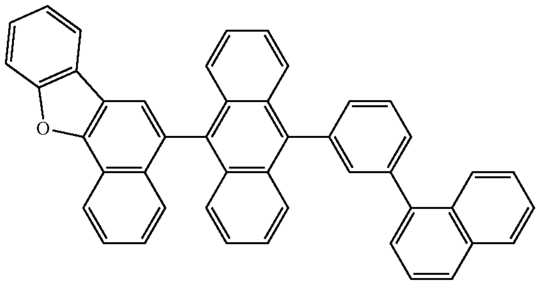

-continued
H72
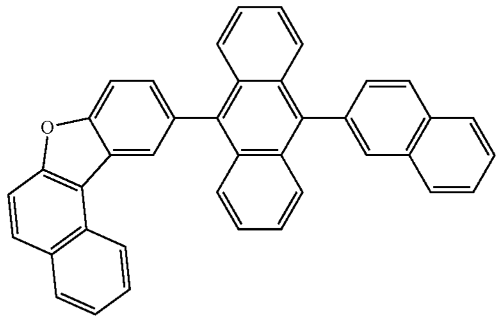
H73
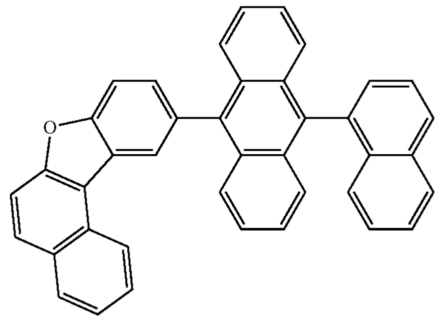
H74
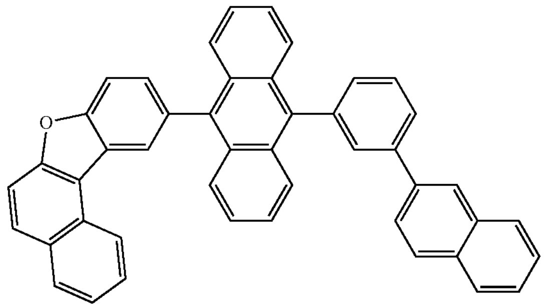
H75
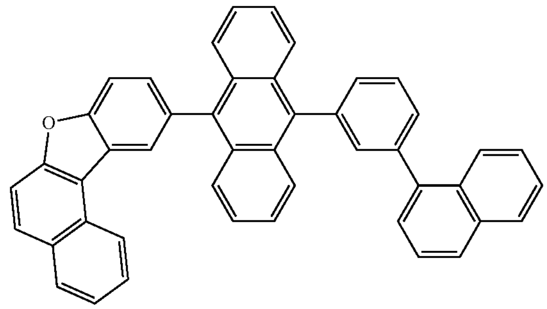
H76
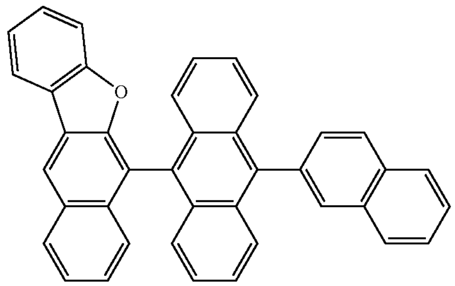
H77
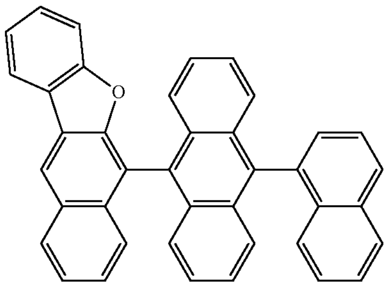
H78
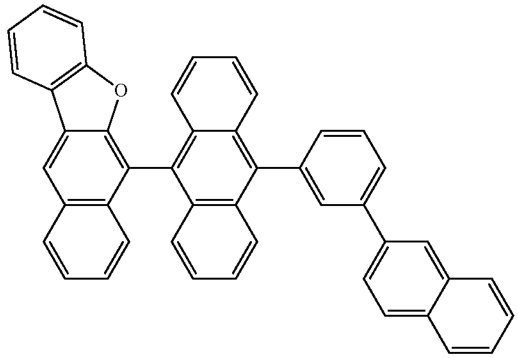
H79
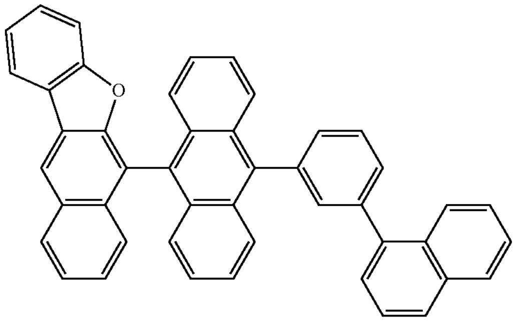

-continued
H80
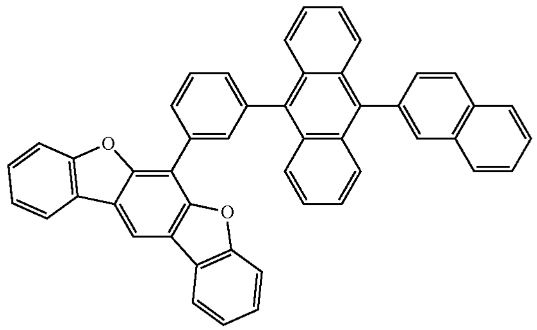
H81
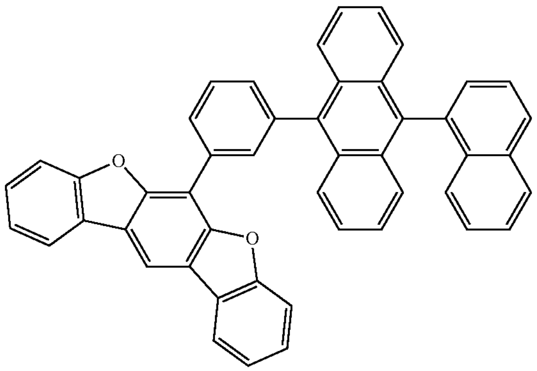
H82
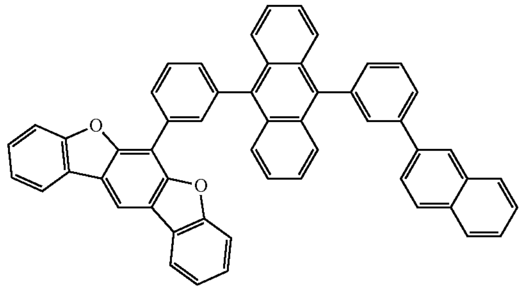
H83
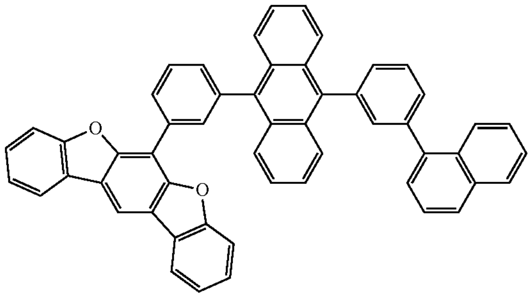
H84
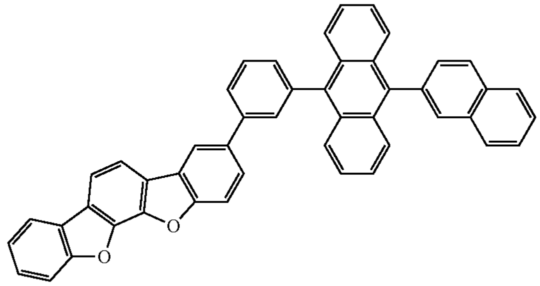
H85
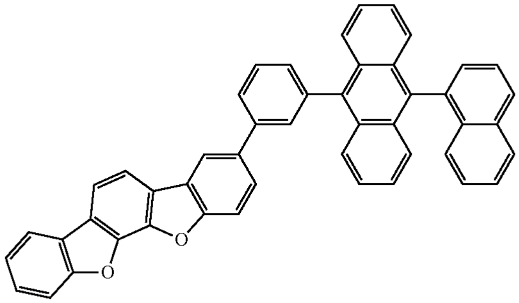
H86
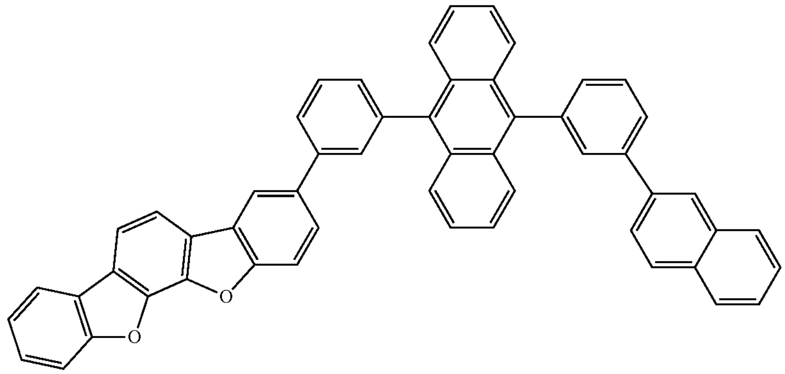

-continued
H87
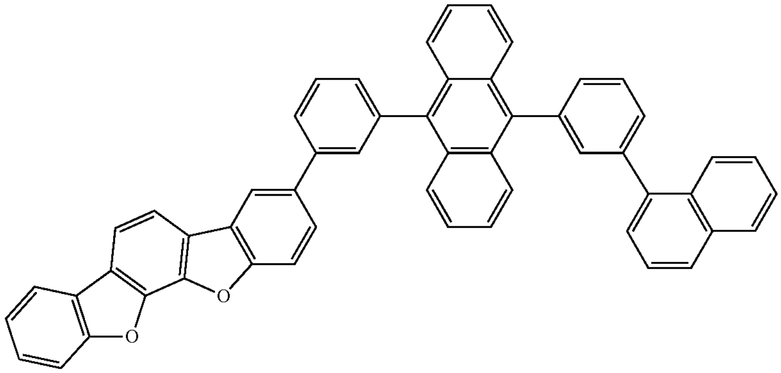
H88
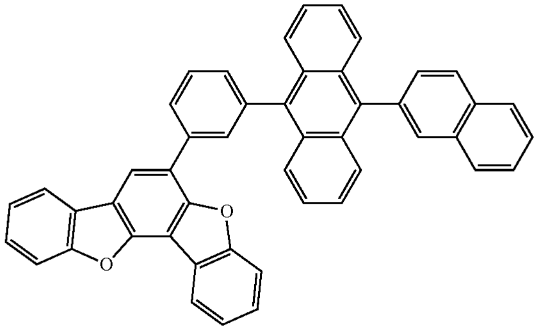
H89
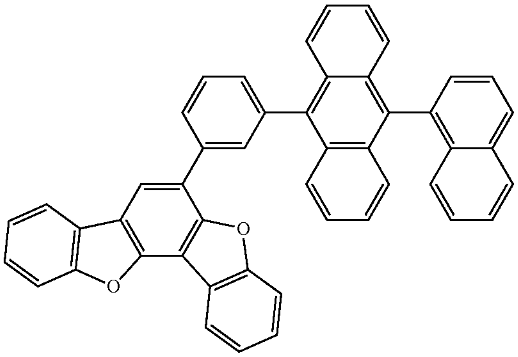
H90
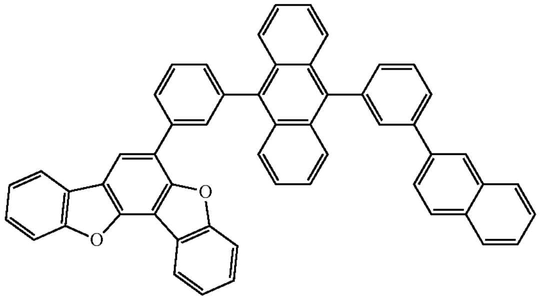
H91
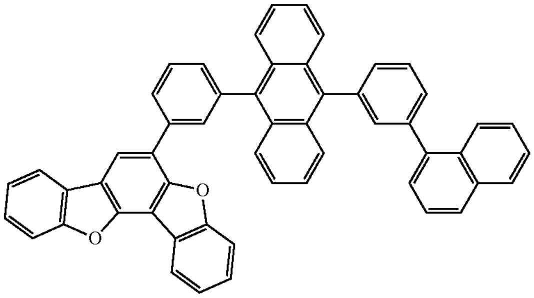
H92
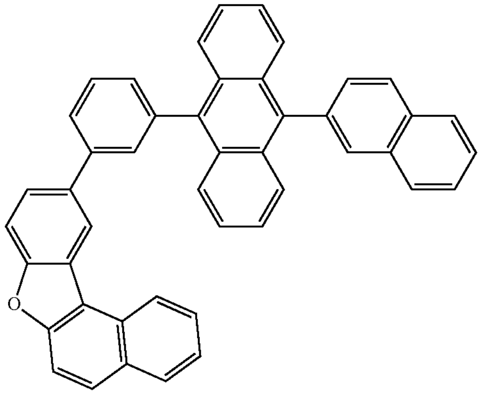
H93
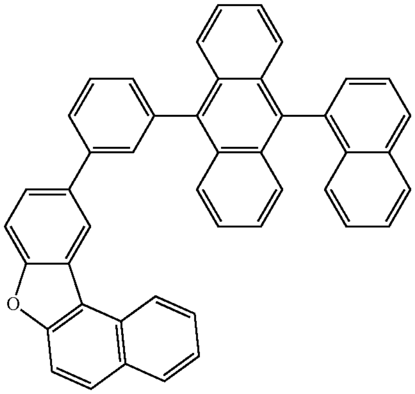

-continued
H94
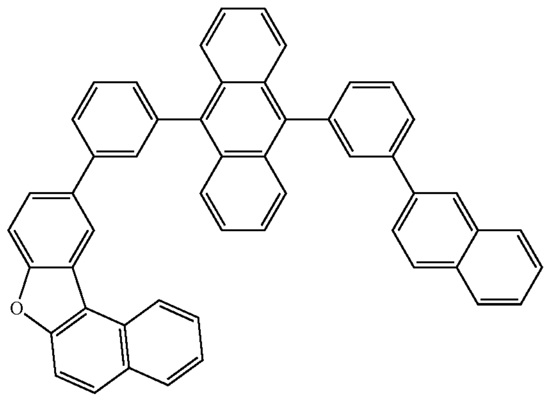
H95
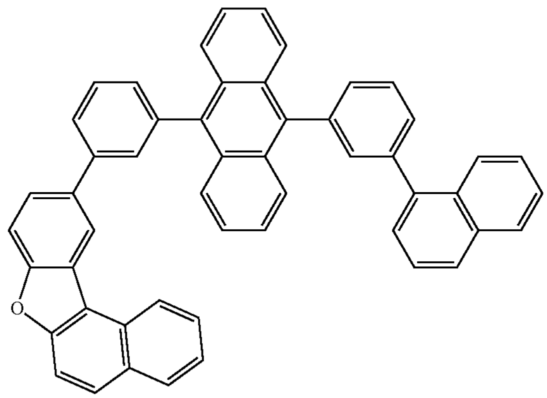
H96
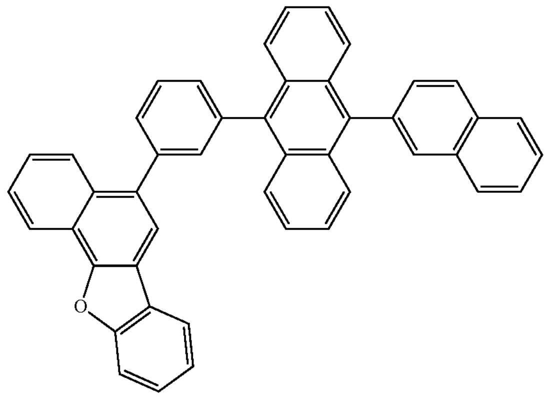
H97
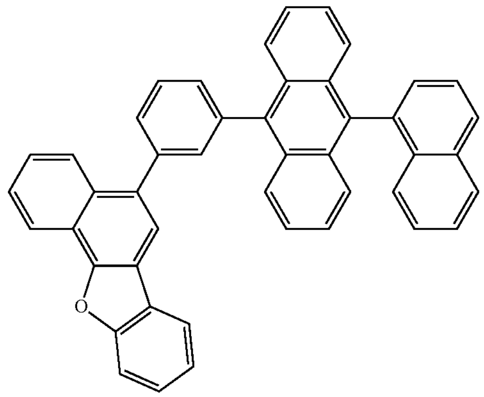
H98
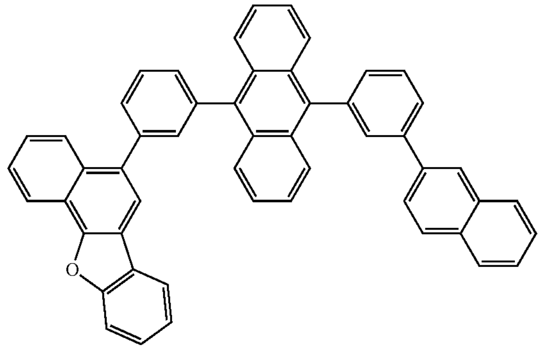
H99
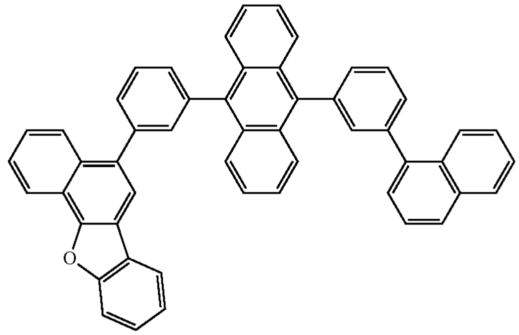
H100
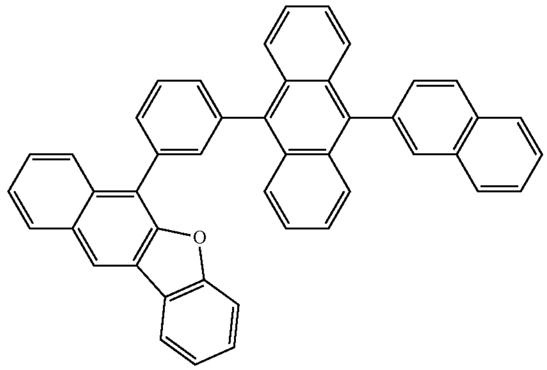
H101
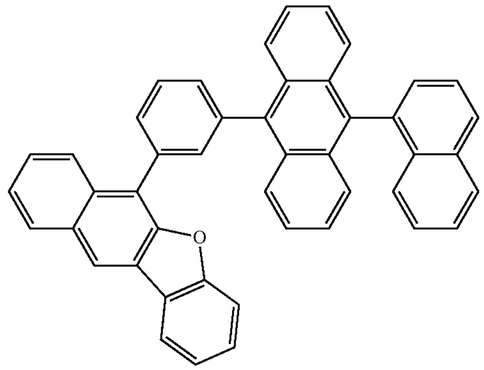

-continued
H102
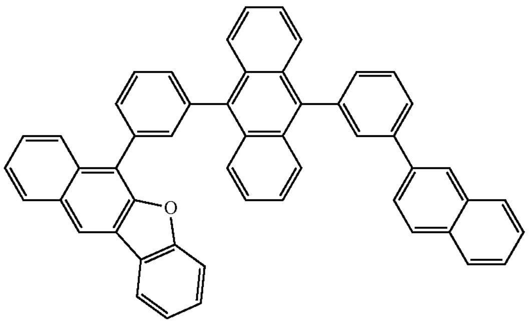
H103
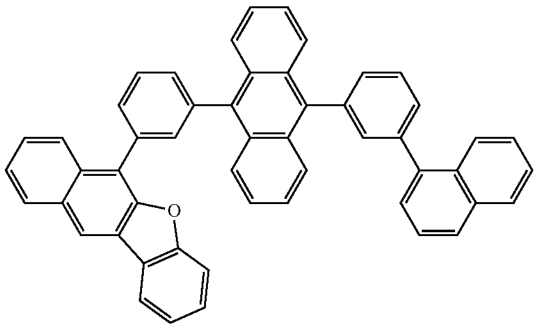
H104
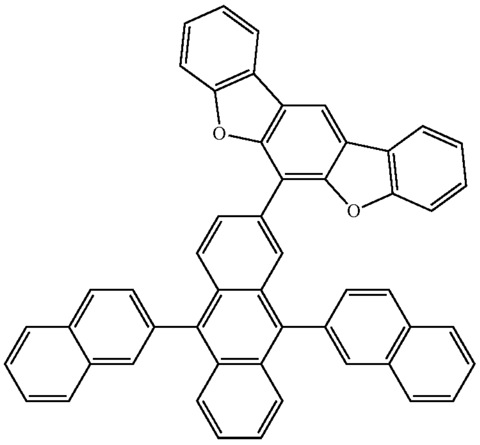
H105
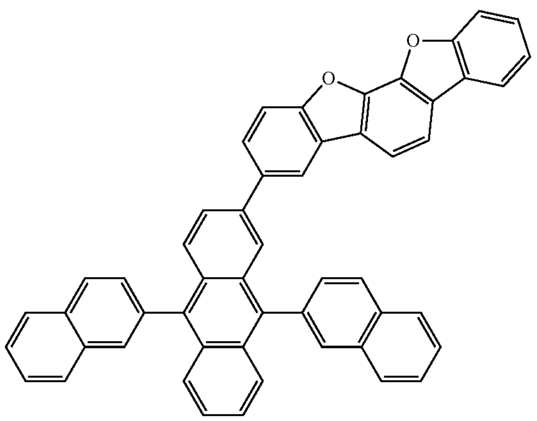
H106
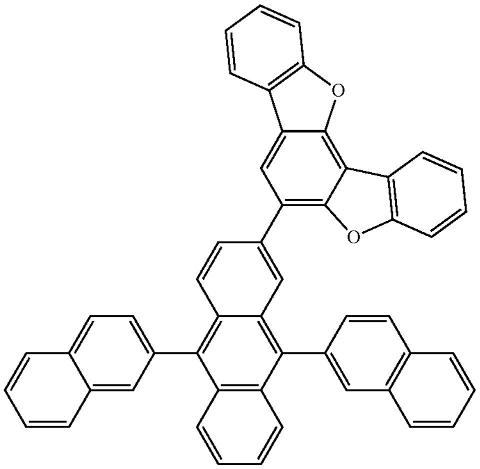
H107
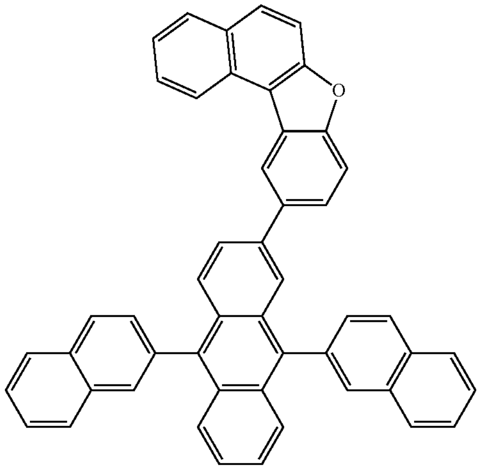

-continued
H108
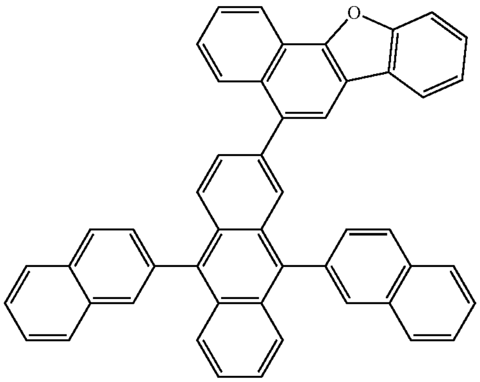
H109
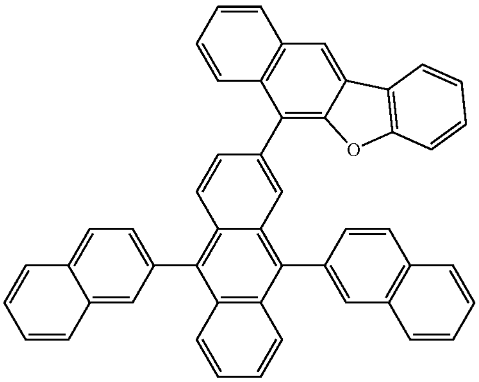
H110
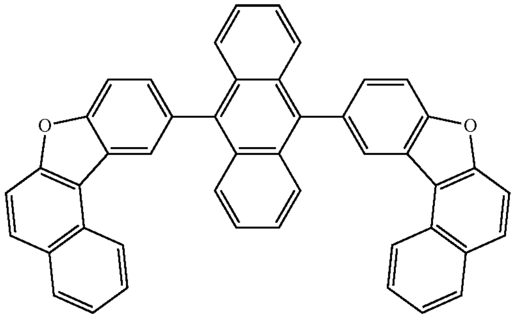
H111
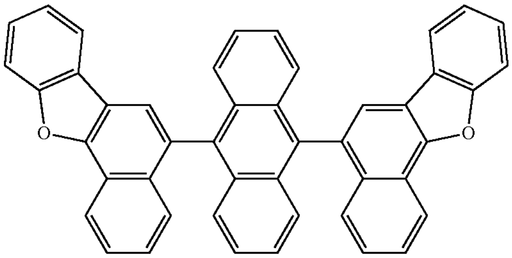
H112
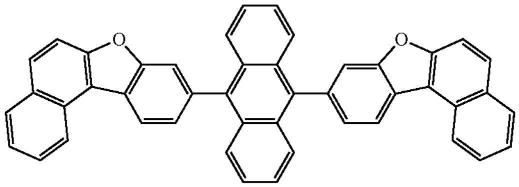
H113
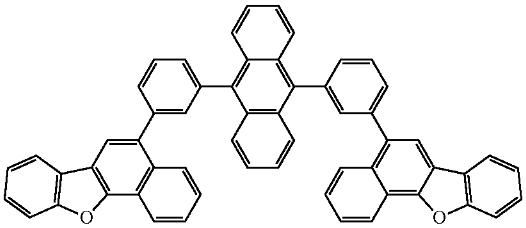
H114
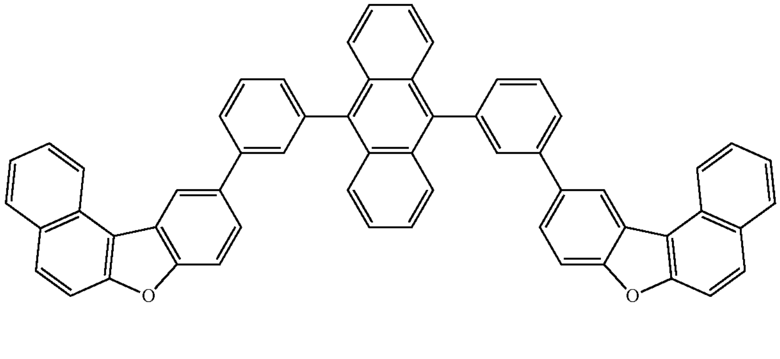

-continued
H115
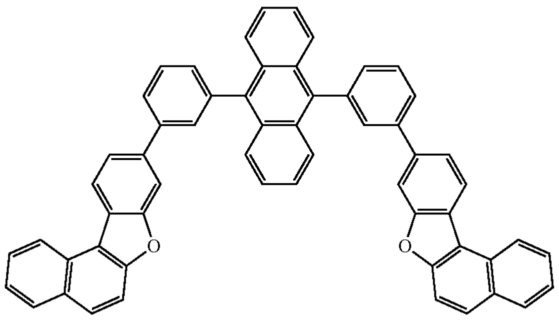
H116
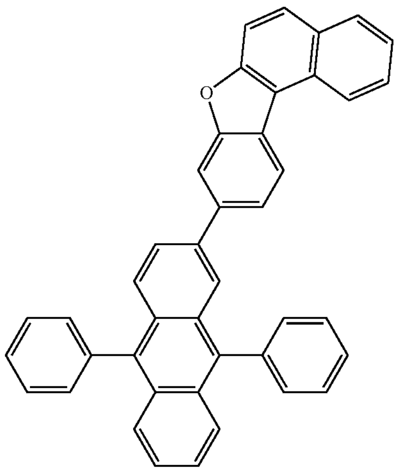
H117
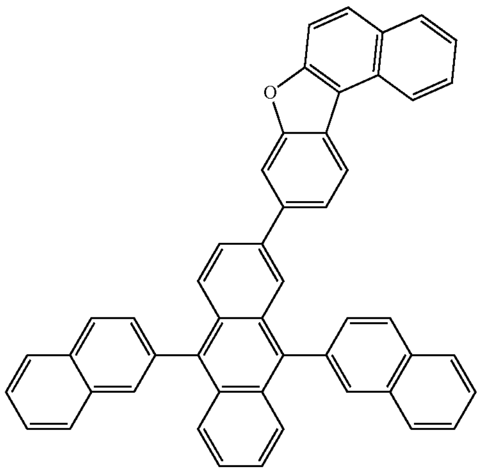
H118
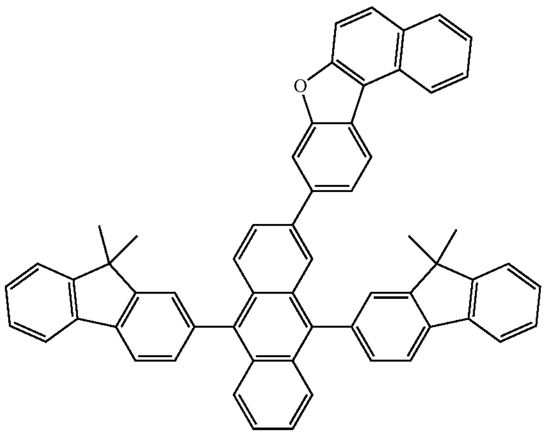
H119
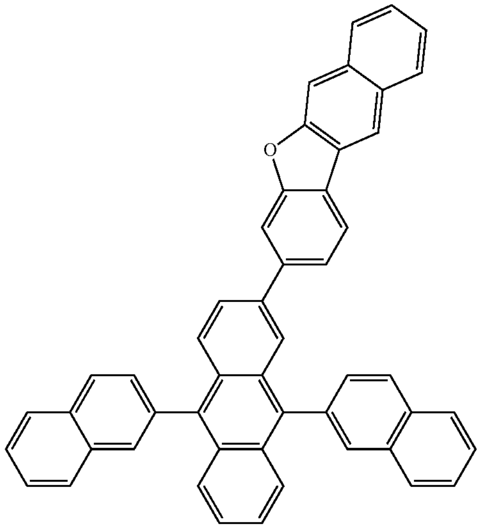
H120
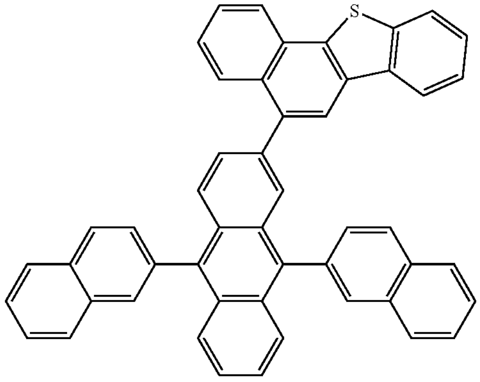

-continued
H121
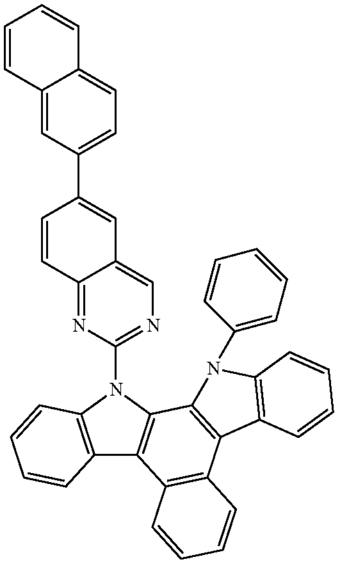
H122
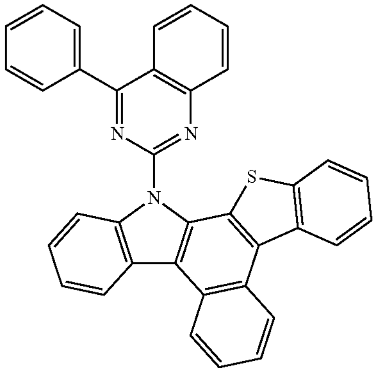
H123
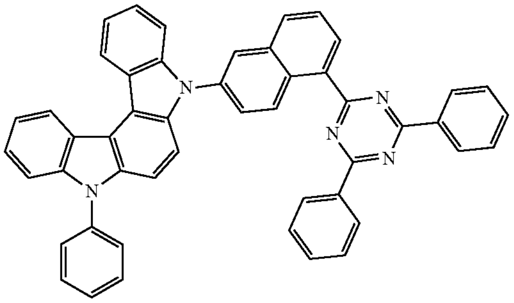
H124
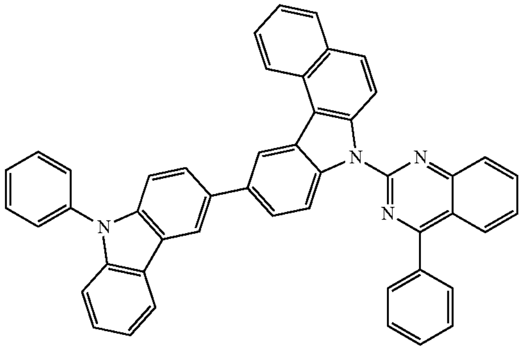
H125
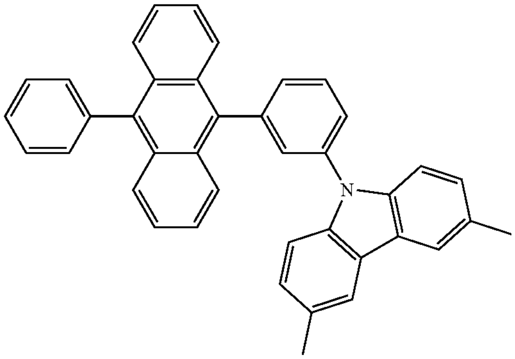
H126
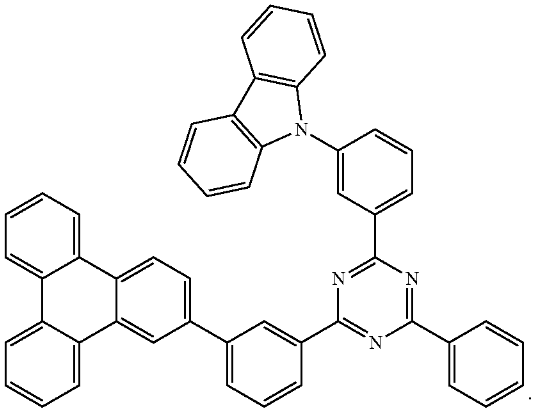
.

[Phosphorescent Dopant]

In an embodiment, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In one or more embodiments, the phosphorescent dopant may include an organometallic compound represented by Formula 401.

Formula 401

$$M(L_{401})_{xc1}(L_{402})_{xc2}$$

Formula 402

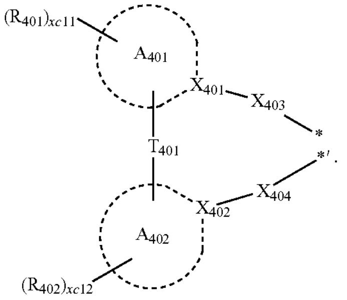

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be the same as described in connection with $Q_1$, xc11 and xc12 may each independently be an integer of 0 to 10, and and *' in Formula 402 each indicates a binding site to M in Formula 401.

For example, in Formula 402, i) $X_{401}$ may be nitrogen, and $X_{402}$ may be carbon, or ii) each of $X_{401}$ and $X_{402}$ may be nitrogen.

In an embodiment, when xc1 in Formula 401 is 2 or more, two ring $A_{401}$(s) among two or more of $L_{401}$(s) may optionally be linked to each other via $T_{402}$, which is a linking group, and two ring $A_{402}$(s) may optionally be linked to each other via $T_{403}$, which is a linking group (see Compounds PD1 to PD4 and PD7). $T_{402}$ and $T_{403}$ may each be the same as described in connection with $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(=O), an isonitrile group, a —CN group, a phosphorus group (for example, a phosphine group, a phosphite group, and the like), or any combination thereof.

The phosphorescent dopant may include, for example, one of compounds PD1 to PD25, or any combination thereof:

PD1

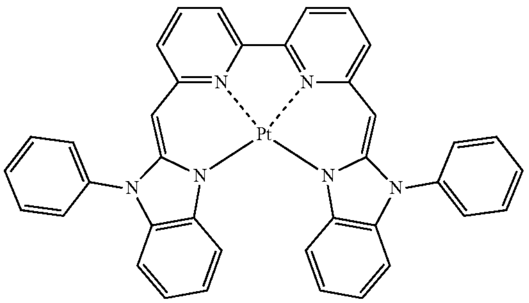

PD2

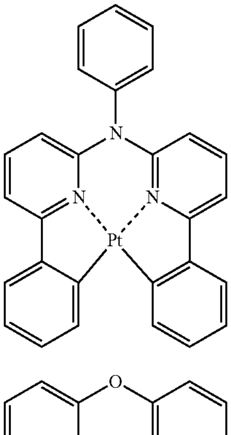

PD3

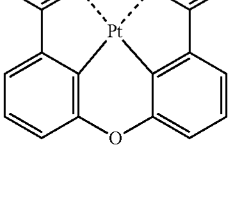

-continued
PD4
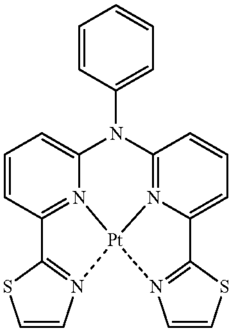
PD5
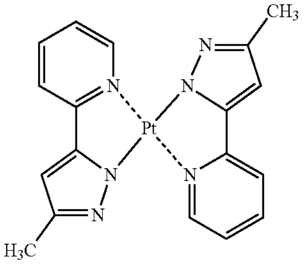
PD6
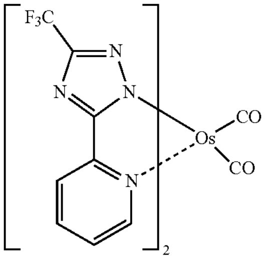
PD7
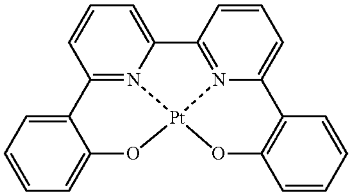
PD8
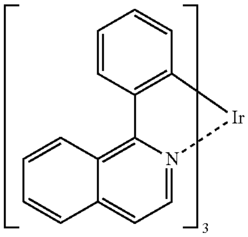
PD9
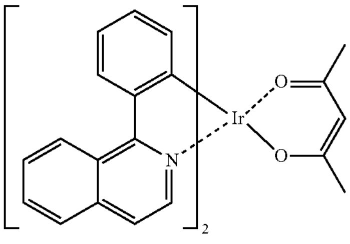
-continued
PD10
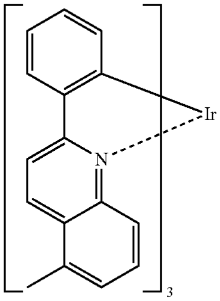
PD11
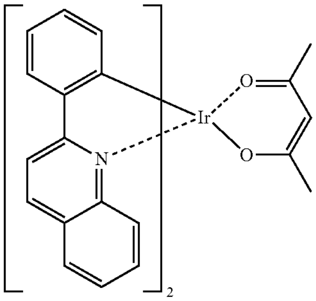
PD12
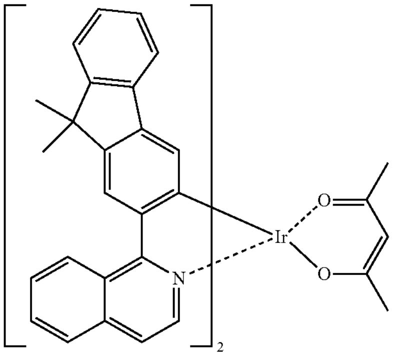
PD13
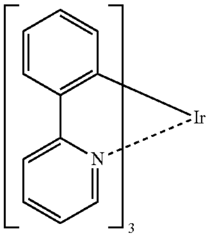
PD14
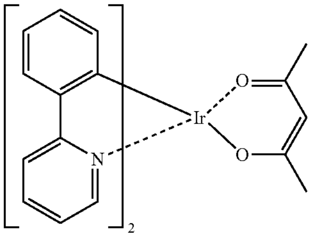

-continued
PD15
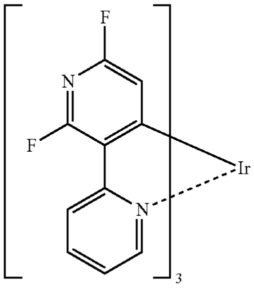
PD16
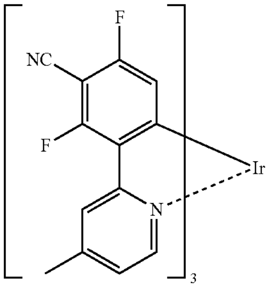
PD17
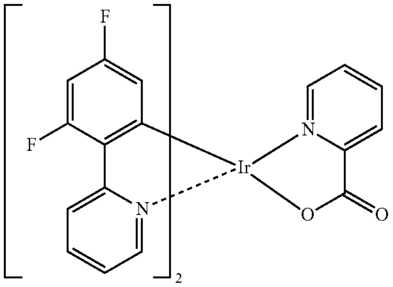
PD18
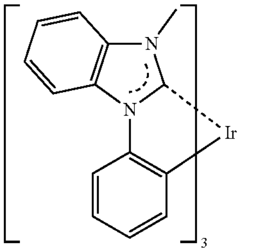
PD19
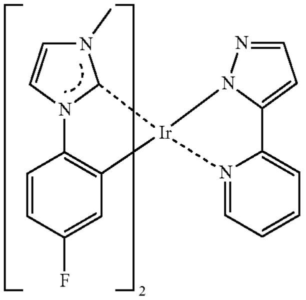
-continued
PD20
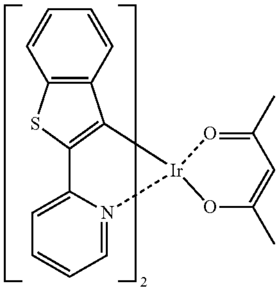
PD21
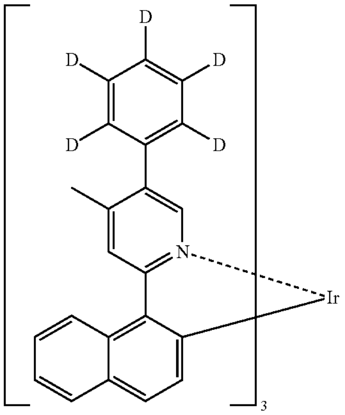
PD22
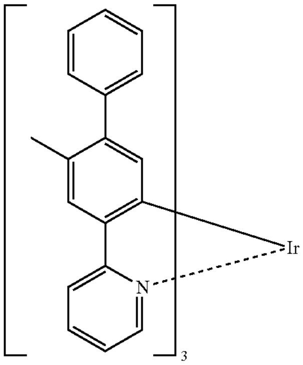
PD23
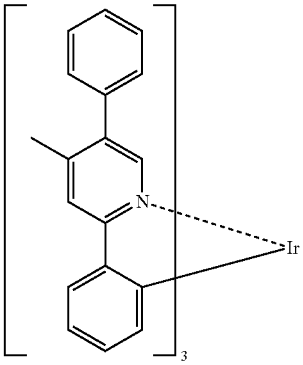

-continued

PD24

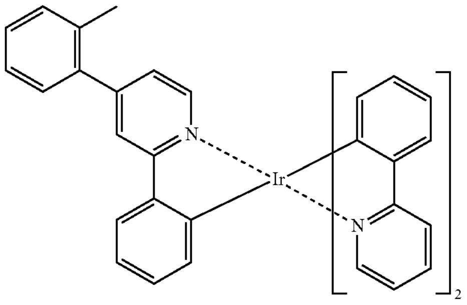

PD25

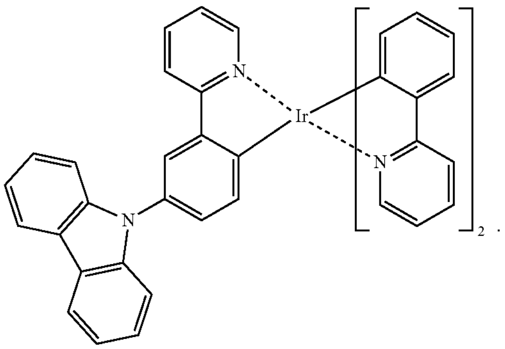

[Fluorescent Dopant]

The fluorescent dopant may include an amine group-containing compound, a styryl group-containing compound, or any combination thereof.

For example, the fluorescent dopant may include a compound represented by Formula 501:

Formula 501

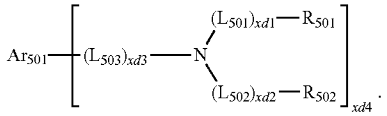

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{501}$ in Formula 501 may be a condensed cyclic group (for example, an anthracene group, a chrysene group, a pyrene group, and the like) in which three or more monocyclic groups are condensed together.

For example, xd4 in Formula 501 may be 2.

In an embodiment, the fluorescent dopant may include: one of Compounds FD1 to FD37; DPVBi; DPAVBi; or any combination thereof:

FD1

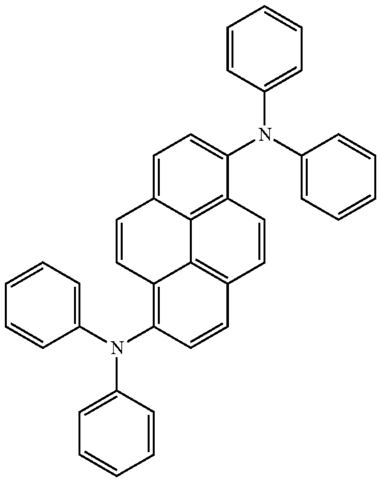

FD2

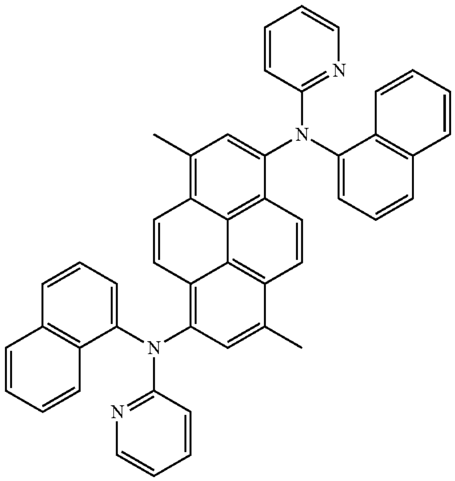

-continued
FD3
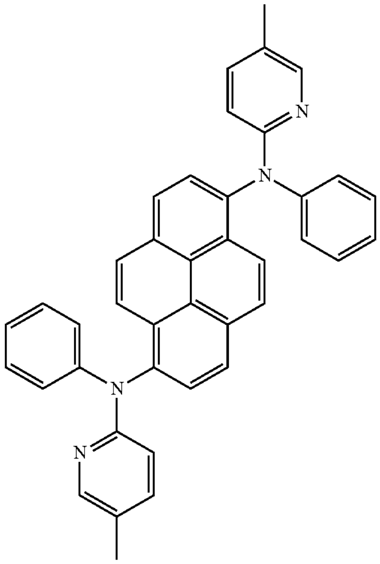
FD4
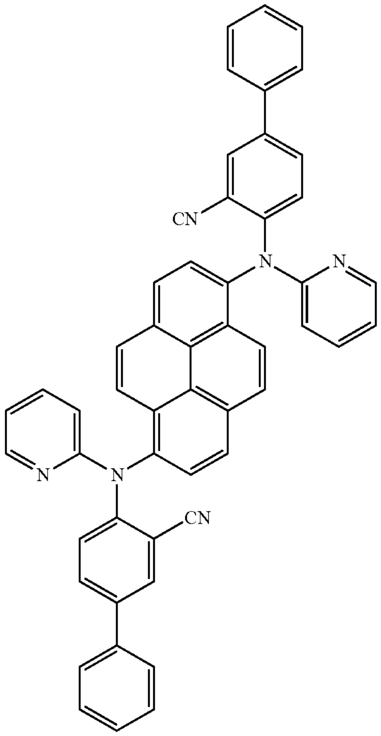
FD5
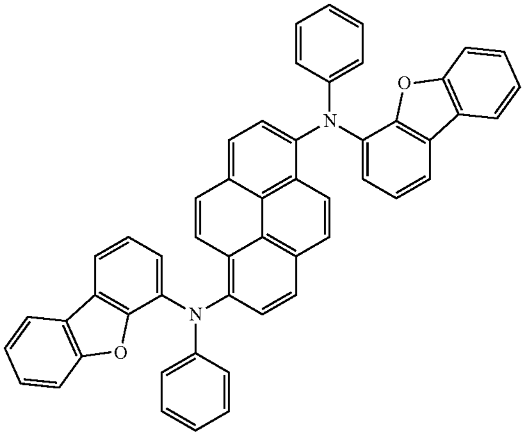
FD6
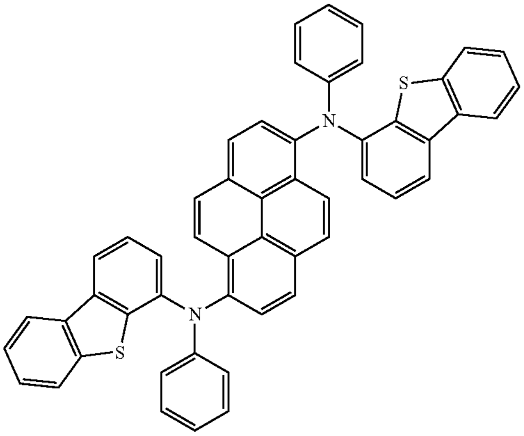

-continued
FD7
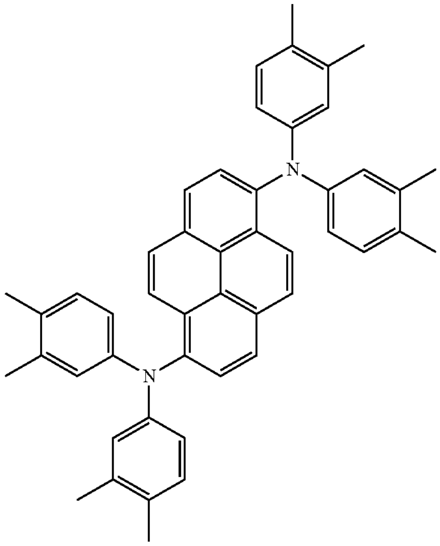
FD8
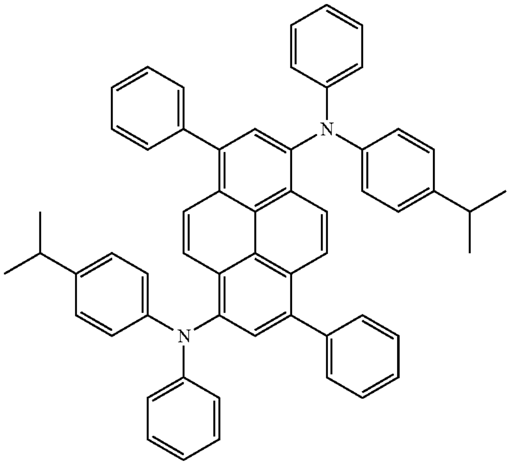
FD9
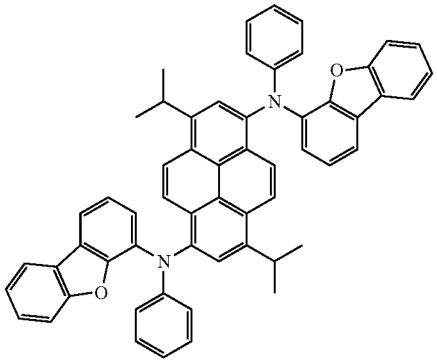
FD10
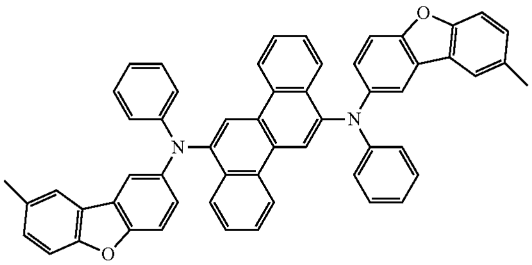
FD11
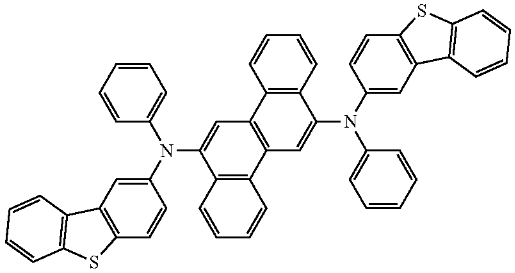
FD12
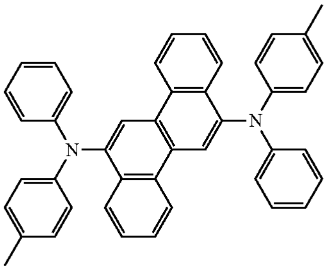
FD13
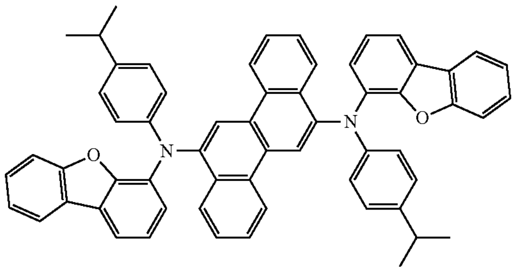
FD14
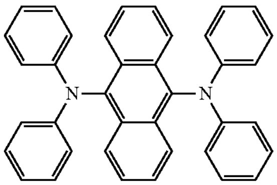

-continued
FD15
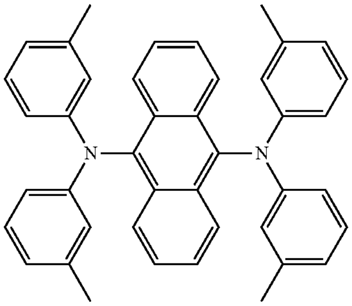
FD16
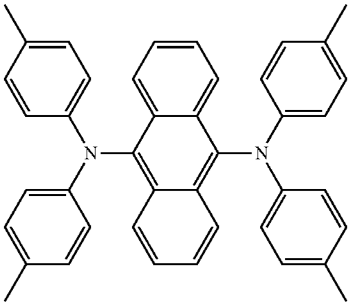
FD17
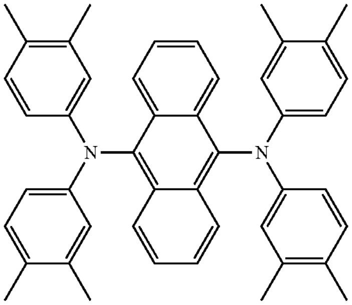
FD18
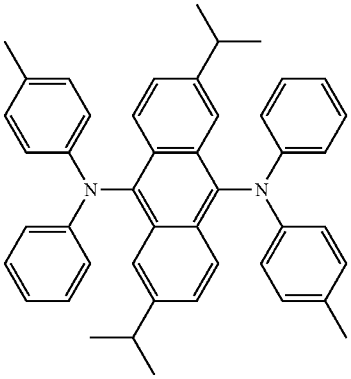
FD19
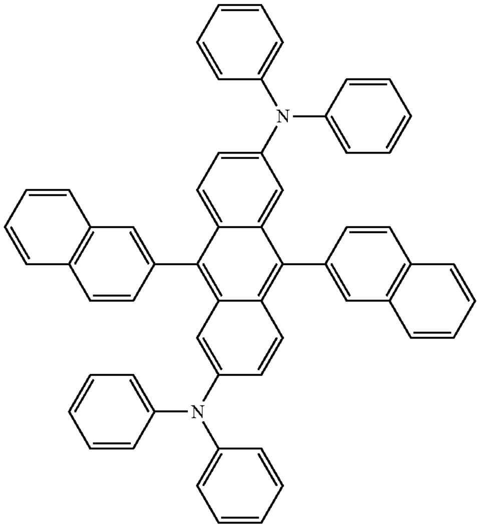
FD20
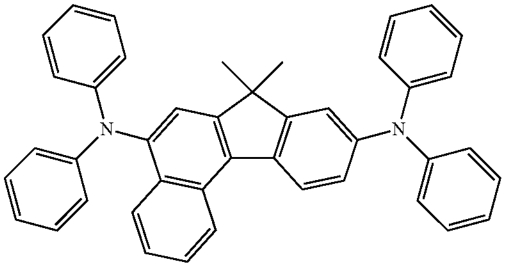
FD21
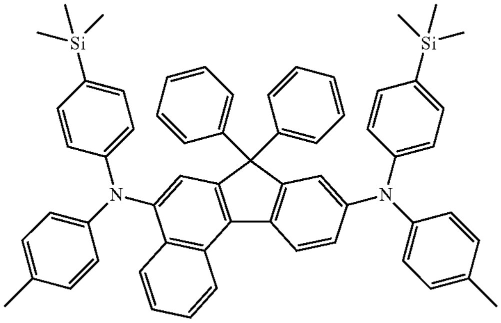
FD22
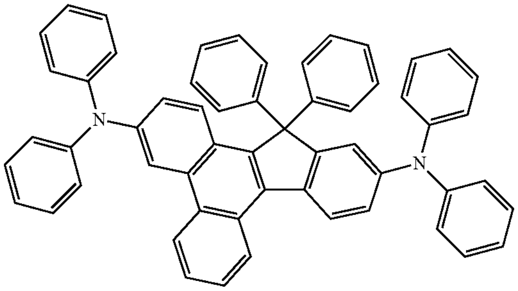

-continued
FD23
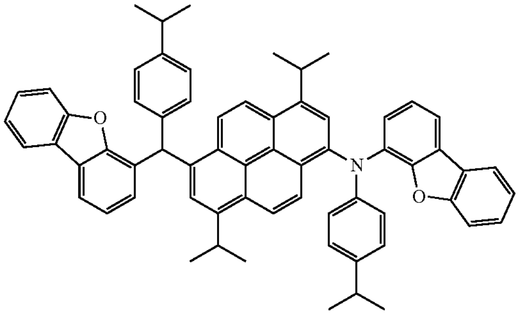
FD24
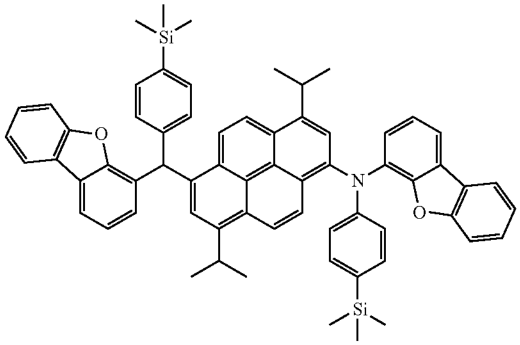
FD25
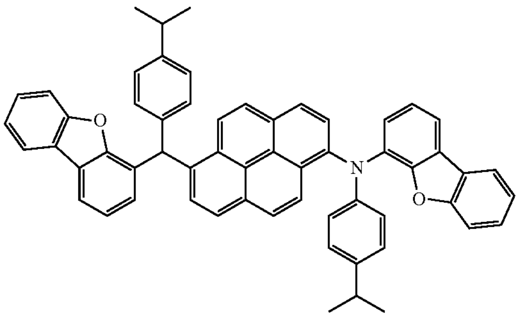
FD26
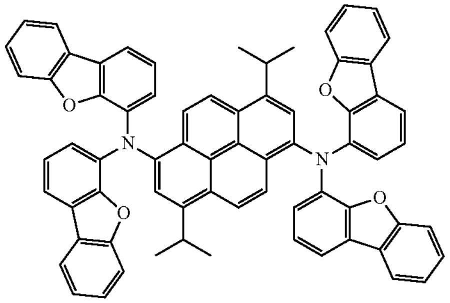
FD27
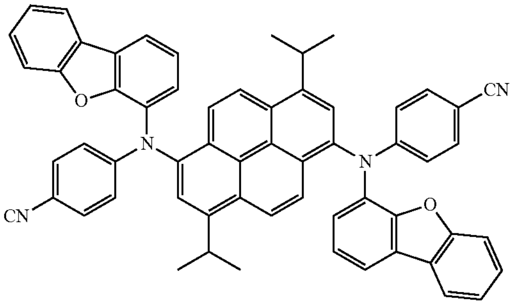
FD28
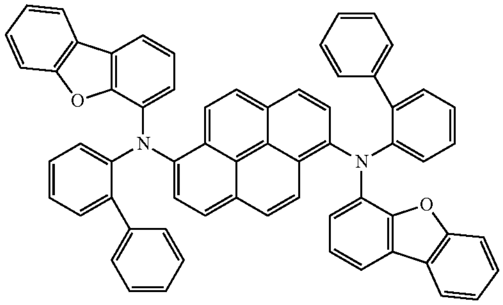
FD29
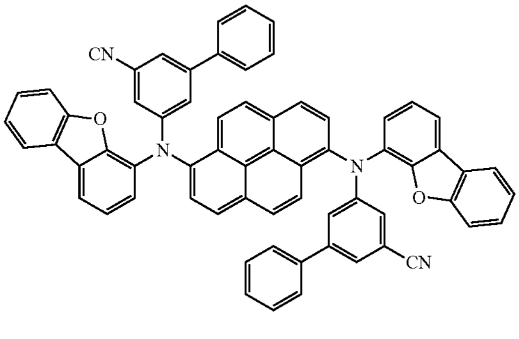
FD30
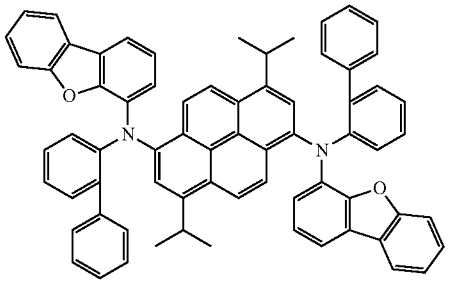

-continued
FD31
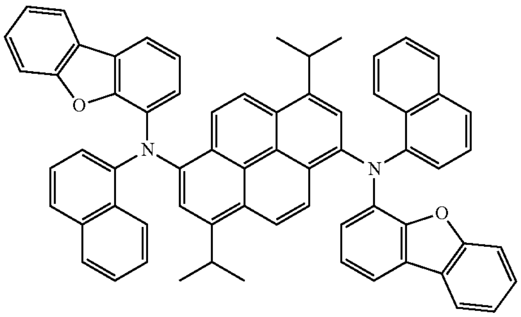
FD32
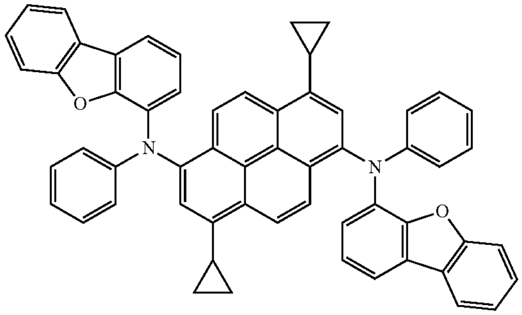
FD33
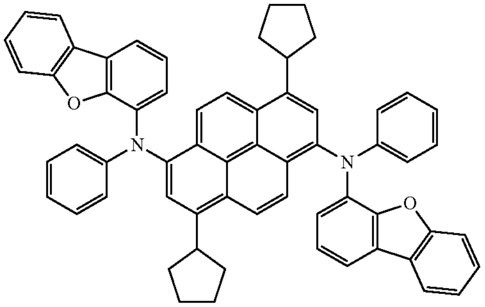
FD34
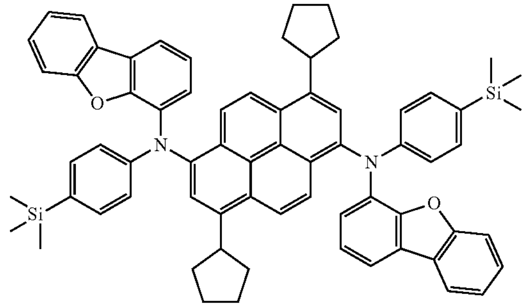
FD35
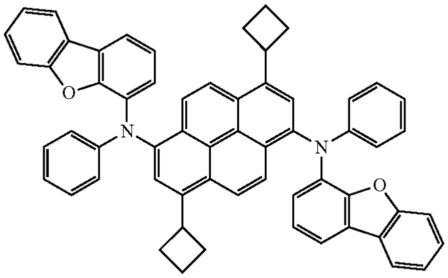
FD36
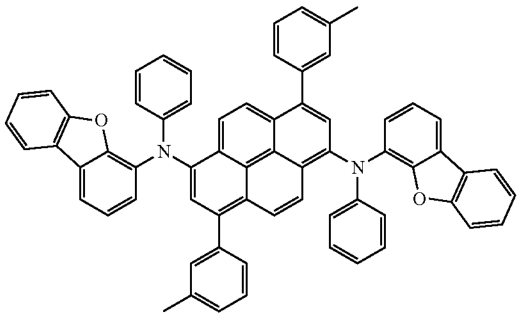
FD37
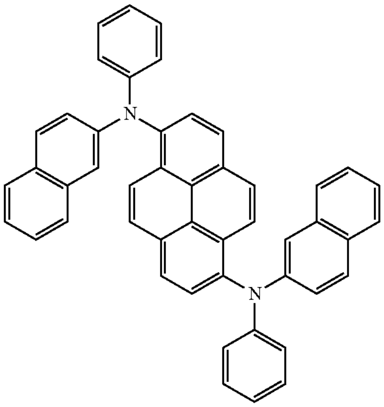
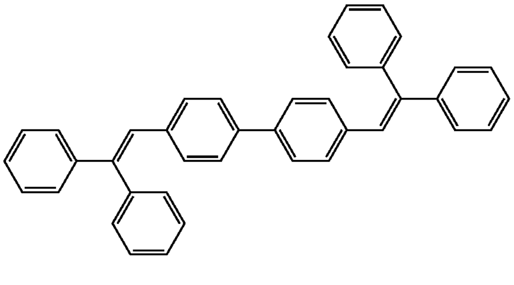
DPVBi -continued

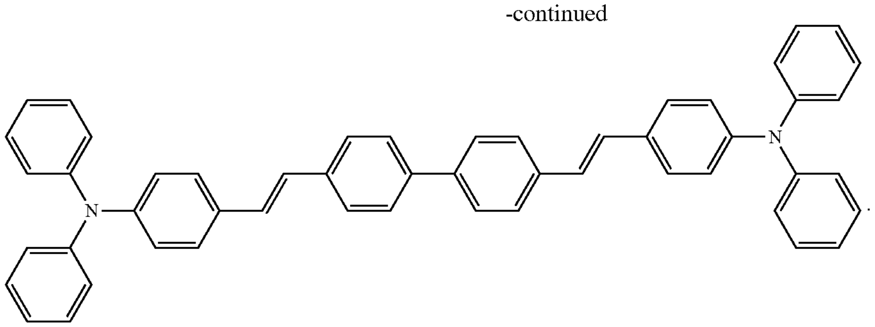

DPAVBi

[Delayed Fluorescence Material]

In the present specification, the delayed fluorescence material may be selected from compounds capable of emitting delayed fluorescence by a delayed fluorescence emission mechanism.

The delayed fluorescence material included in the emission layer may act as a host or a dopant, depending on the type of other materials included in the emission layer.

In detail, the delayed fluorescence material included in the emission layer 132-1, 132-2, . . . , or **132-*m*** may serve as a dopant.

In an embodiment, a difference between a triplet energy level (eV) of the delayed fluorescence material and a singlet energy level (eV) of the delayed fluorescence material may be about 0 eV or more and about 0.5 eV or less. When the difference between the triplet energy level (eV) of the delayed fluorescence material and the singlet energy level (eV) of the delayed fluorescence material is satisfied within the above-described range, up-conversion from the triplet state to the singlet state of the delayed fluorescence materials may effectively occur, thereby improving luminescence efficiency or the like of the light-emitting device 10.

For example, the delayed fluorescence material may include: i) a material including at least one electron donor (for example, a n electron-rich $C_3$-$C_{60}$ cyclic group and the like, such as a carbazole group) and at least one electron acceptor (for example, a sulfoxide group, a cyano group, a n electron-deficient nitrogen-containing $C_1$-$C_{60}$ cyclic group, and the like); and ii) a material including a $C_8$-$C_{60}$ polycyclic group in which two or more cyclic groups are condensed while sharing boron (B).

For example, the delayed fluorescence material may include a condensed cyclic compound represented by Formula 2:

Formula 2

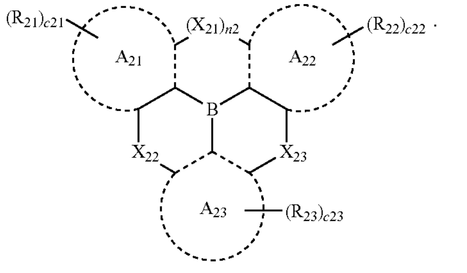

In Formula 2, $A_{21}$ to $A_{23}$ may each independently be a $C_3$-$C_{60}$ carbocyclic group or a $C_1$-$C_{60}$ heterocyclic group, $X_{21}$ to $X_{23}$ may each independently be O, S, N($R_{24}$), C($R_{24}$)($R_{25}$), or Si($R_{24}$)($R_{25}$), n2 may be 0 or 1, wherein, when n2 is O, $A_{21}$ and $A_{22}$ may not be linked to each other, $R_{21}$ to $R_{25}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), c21 to c23 may each independently be an integer of 1 to 6, $R_{10a}$ may be the same as described herein, and $Q_1$ to $Q_3$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, $A_{21}$ to $A_{23}$ in Formula 2 may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a selenophene group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In an embodiment, the condensed cyclic compound represented by Formula 2 may have $\Delta E_{st}$ in a range of about 0 eV to about 0.3 eV, for example, about 0 eV to about 0.2 eV. Therefore, the condensed cyclic compound may use triplet excitons for light emission by the delayed fluorescence emission mechanism. In this regard, the internal quantum efficiency of the first emission layer 132*a*-1 may be greater than the maximum internal quantum efficiency (25%) of fluorescence.

In an embodiment, since the condensed cyclic compound represented by Formula 2 has a little change in geometry, it has small Stoke's Shift characteristics, so that full width of half maximum (FWHM) thereof may be small. For example, the FWHM of the condensed cyclic compound may be in a range of about 5 nm to about 35 nm. The FWHM of the condensed cyclic compound may be a value obtained from an electroluminescence (EL) spectrum of the condensed cyclic compound. Accordingly, by including the condensed cyclic compound as a dopant, the light-emitting device 10 may have improved color purity.

For example, the delayed fluorescence material may include a condensed cyclic compound represented by Formula 2-1:

Formula 2-1

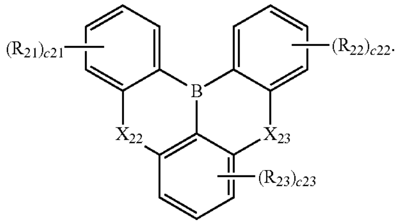

In Formula 2-1, $X_{22}$ and $X_{23}$ may each independently be O, S, or $N(R_{24})$, $R_{21}$ to $R_{24}$ may each be the same as described in Formula 2, c21 and c22 may each independently be an integer of 1 to 4, and c23 may be an integer of 1 to 3.

Examples of the delayed fluorescence material are at least one of Compounds DF1 to DF9:

DF1

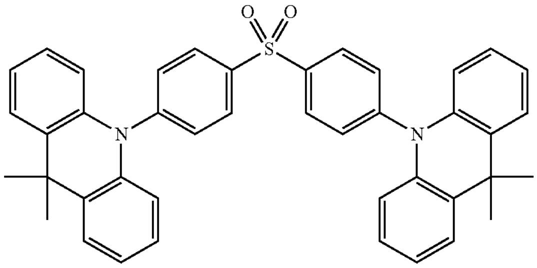

(DMAC-DPS)

DF2

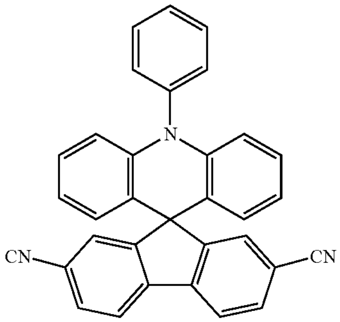

(ACRFLCN)

DF3

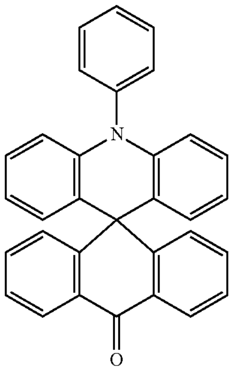

(ACRSA)

-continued

DF4

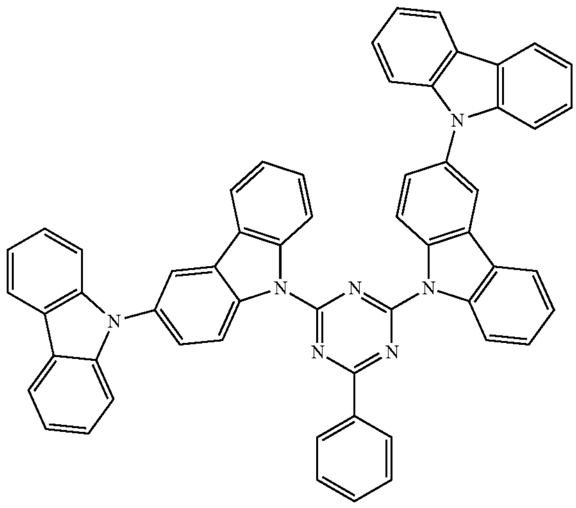

(CC2TA)

DF5

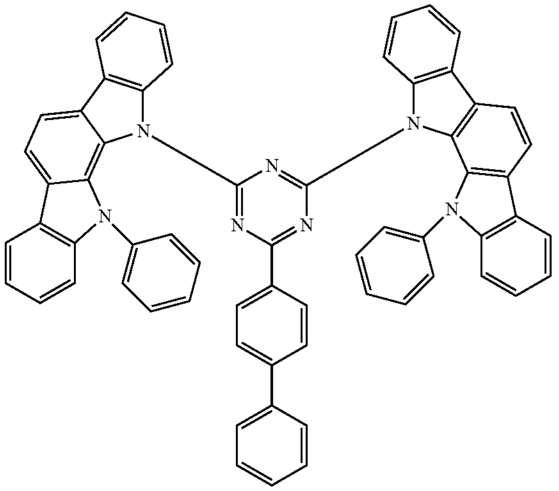

(PIC-TRZ)

DF6

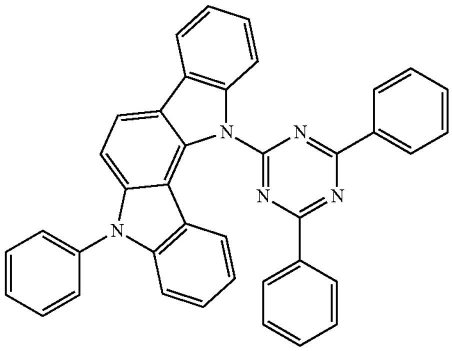

(PIC-TRZ2)

-continued

DF7

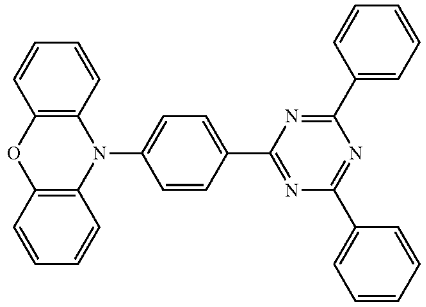

(PXZ-TRZ)

DF8

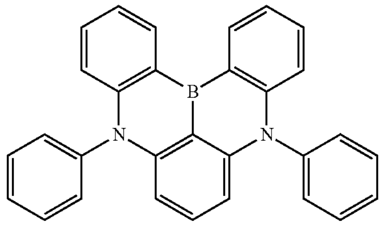

(DABNA-1)

DF9

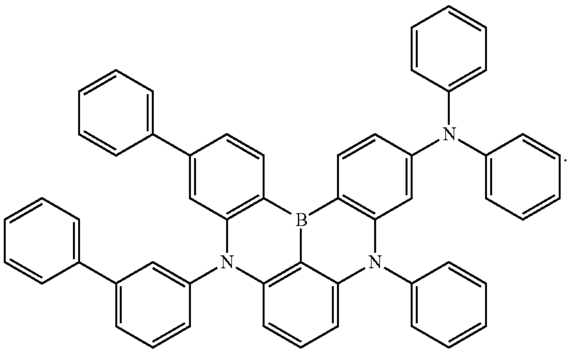

(DABNA-2)

[Quantum Dot]

The term "quantum dot" as used herein refers to a crystal of a semiconductor compound, and may include any material capable of emitting light of various emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process is a method including mixing a precursor material with an organic solvent and then growing a quantum dot particle crystal. When the crystal grows, the organic solvent naturally acts as a dispersant coordinated on the surface of the quantum dot crystal and controls the growth of the crystal so that the growth of quantum dot particles can be controlled through a process which is less expensive, and is easier than vapor deposition methods, such as metal organic chemical vapor deposition (MOCVD) or molecular beam epitaxy (MBE), The quantum dot may include: a Group II-VI semiconductor compound; a Group III-V semiconductor compound;

a Group III-VI semiconductor compound; a Group I-III-VI semiconductor compound; a Group IV-VI semiconductor compound; a Group IV element or compound; or any combination thereof.

Examples of the Group II-VI semiconductor compound are: a binary compound, such as CdSe, CdTe, ZnS, ZnSe, ZnTe, ZnO, HgS, HgSe, HgTe, MgSe, MgS, and the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and the like; a quaternary compound, such as CdZnSeS, CdZnSeTe, CdZnSTe, CdHgSeS, CdHgSeTe, CdHgSTe, HgZnSeS, HgZnSeTe, HgZnSTe, and the like; or any combination thereof.

Examples of the Group III-V semiconductor compound are a binary compound, such as GaN, GaP, GaAs, GaSb, AlN, AlP, AlAs, AlSb, InN, InP, InAs, InSb, or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, or the like; a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or the like; or any combination thereof. The Group III-V semiconductor compound may further include a Group II element. Examples of the Group III-V semiconductor compound further including a Group II element are InZnP, InGaZnP, InAlZnP, and the like.

Examples of the Group III-VI semiconductor compound are: a binary compound, such as GaS, GaSe, $Ga_2Se_3$, GaTe, InS, InSe, $In_2S_3$, $In_2Se_3$, InTe, and the like; a ternary compound, such as $InGaS_3$, $InGaSe_3$, and the like; or any combination thereof.

Examples of the Group I-III-VI semiconductor compound are: a ternary compound, such as AgInS, $AgInS_2$, CuInS, $CuInS_2$, $CuGaO_2$, $AgGaO_2$, AgAlO2, and the like; or any combination thereof.

Examples of the Group IV-VI semiconductor compound are: a binary compound, such as SnS, SnSe, SnTe, PbS, PbSe, PbTe, and the like; a ternary compound, such as SnSeS, SnSeTe, SnSTe, PbSeS, PbSeTe, PbSTe, SnPbS, SnPbSe, SnPbTe, and the like; a quaternary compound, such as SnPbSSe, SnPbSeTe, SnPbSTe, and the like; or any combination thereof.

The Group IV element or compound may include: a single element compound, such as Si, Ge, and the like; a binary compound, such as SiC, SiGe, and the like; or any combination thereof.

Each element included in a multi-element compound, such as the binary compound, the ternary compound, and the quaternary compound, may exist in a particle thereof at a uniform concentration or non-uniform concentration.

The quantum dot may have a single structure or a dual core-shell structure. In the case of the quantum dot having a single structure, a concentration of each element included in the corresponding quantum dot may be uniform. For example, a material included in the core and a material included in the shell may be different from each other.

The shell of the quantum dot may act as a protective layer that prevents chemical degeneration of the core to maintain semiconductor characteristics, and/or as a charging layer that imparts electrophoretic characteristics to the quantum dot. The shell may be a single layer or a multi-layer. The interface between the core and the shell may have a concentration gradient in which the concentration of an element existing in the shell decreases toward the center of the core.

Examples of the shell of the quantum dot are oxide of metal, metalloid, or non-metal, a semiconductor compound, or any combination thereof. Examples of the oxide of metal, metalloid, or non-metal are: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like; a ternary compound, such as $MgAl_2O_4$, $CoFe_2O_4$, $NiFe_2O_4$, $CoMn_2O_4$, and the like; or any combination thereof. Examples of the semiconductor compound are: as described herein, a Group II-VI semiconductor compound; a Group III-V semiconductor compound; a Group III-VI semiconductor compound; a Group I-III-VI semiconductor compound; a Group IV-VI semiconductor compound; or any combination thereof. Examples of the semiconductor compound are CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A FWHM of an emission wavelength spectrum of the quantum dot may be about 45 nm or less, for example, about 40 nm or less, for example, about 30 nm or less, and within these ranges, color purity or color reproducibility may be increased. In addition, since the light emitted through the quantum dot is emitted in all directions, the wide viewing angle may be improved.

In addition, the quantum dot may be specifically, spherical, pyramidal, multi-arm, or cubic nanoparticles, nanotubes, nanowires, nanofibers, or nanoplate particles.

Since the energy band gap may be adjusted by controlling the size of the quantum dot, light having various wavelength bands may be obtained from the emission layer including the quantum dot. Accordingly, by using quantum dot of different sizes, a light-emitting device that emits light of various wavelengths may be implemented. In detail, the size of the quantum dot may be selected in consideration of emitting red light, green light, and/or blue light. In addition, the size of the quantum dot may be configured to emit white light by combination of light of various colors.

[Electron Transport Region 133-1, 133-2, . . . , or 133-*m* in interlayer 130]

The electron transport region 133-1, 133-2, . . . , or 133-*m* may have: i) a single-layered structure consisting of a single layer consisting of a single material, ii) a single-layered structure consisting of a single layer consisting of a plurality of different materials, or iii) a multi-layered structure including a plurality of layers including different materials.

The electron transport region 133-1, 133-2, . . . , or 133-*m* may include a buffer layer, a hole blocking layer, an electron transport layer, an electron injection layer, or any combination thereof.

For example, the electron transport region 133-1, 133-2, . . . , or 133-*m* may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the constituent layers of each structure are sequentially stacked from the emission layer.

The electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region 133-1, 133-2, . . . , or 133-*m* may include a compound represented by Formula 601:

Formula 601

$[Ar_{601}]_{xe11}$-$[(L_{601})_{xe1}$-$R_{601}]_{xe21}$ wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$ may be linked together via a single bond.

In one or more embodiments, $Ar_{601}$ in Formula 601 may be a substituted or unsubstituted anthracene group.

In one or more embodiments, the electron transport region 133-1, 133-2, . . . , or 133-*m* may include a compound represented by Formula 601-1:

Formula 601-1

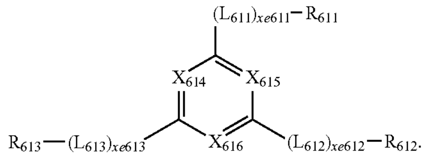

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each be the same as described in connection with $L_{601}$, xe611 to xe613 may each be the same as described in connection with xe1, $R_{611}$ to $R_{613}$ may each be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region 133-1, 133-2, . . . , or 133-*m* may include one of Compounds ET1 to ET47, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

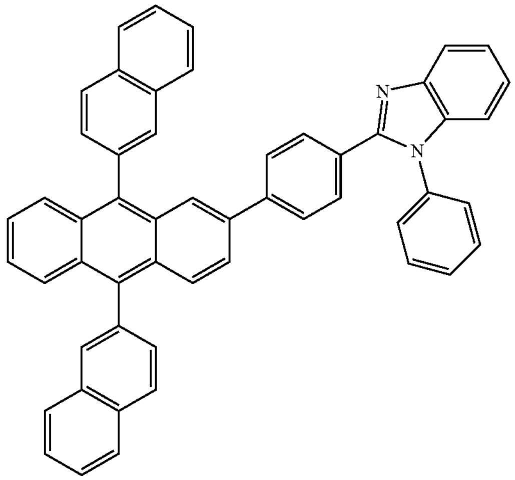

ET2

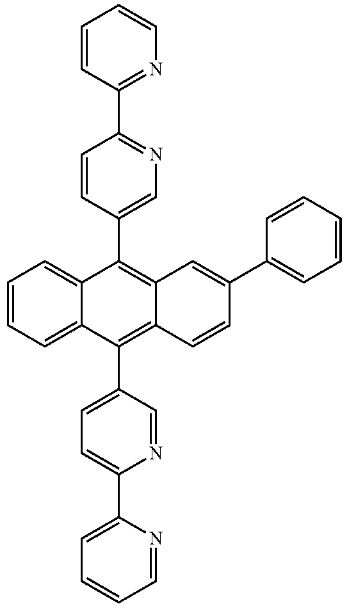

ET3

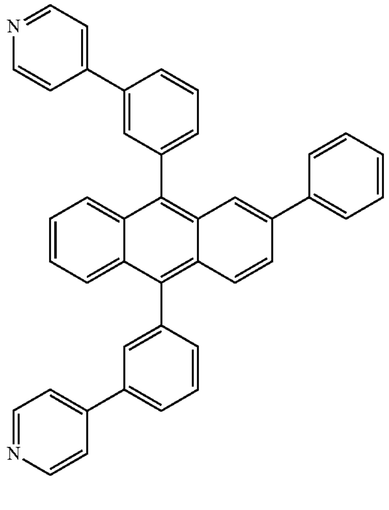

-continued
ET4
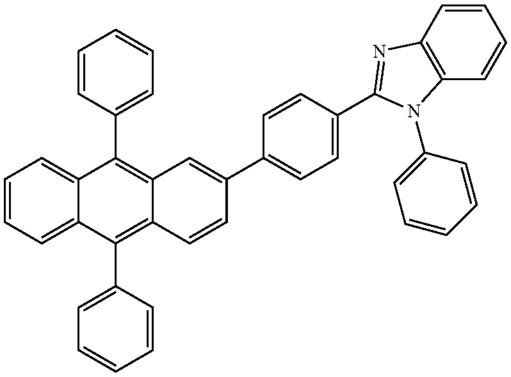
ET5
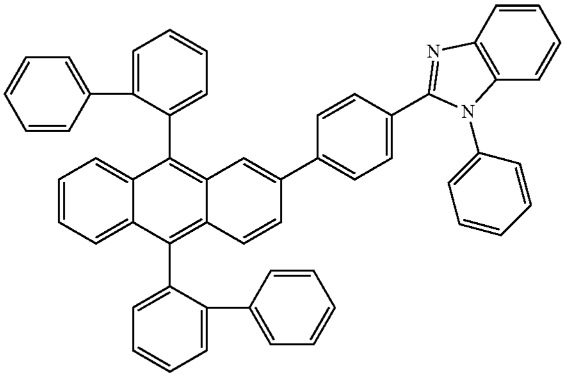
ET6
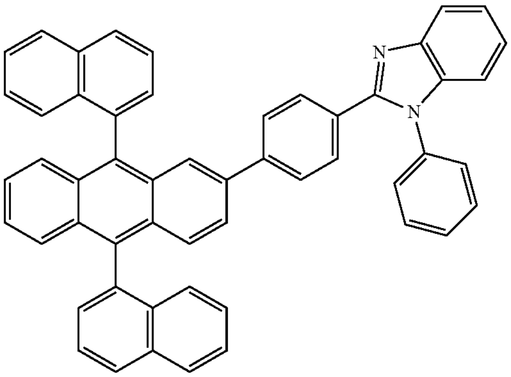
-continued
ET7
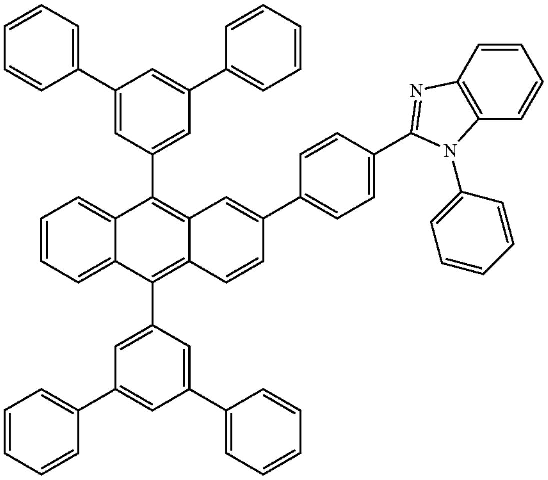
ET8
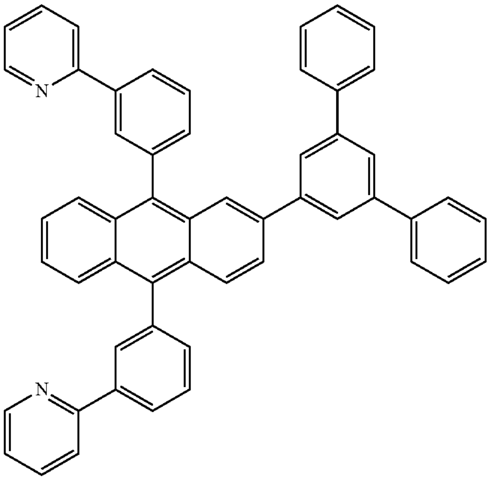
ET9
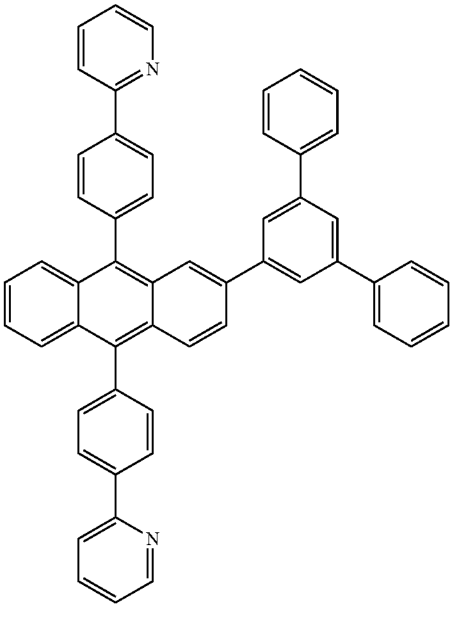

-continued
ET10
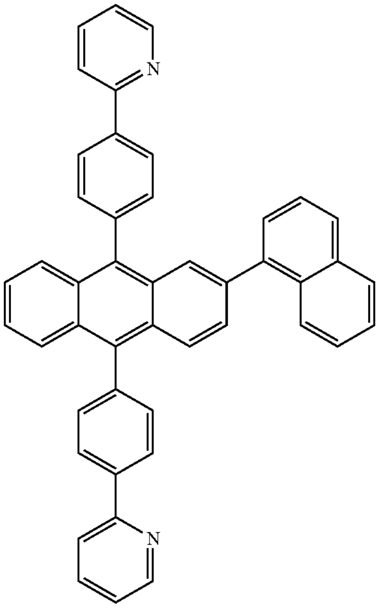
ET11
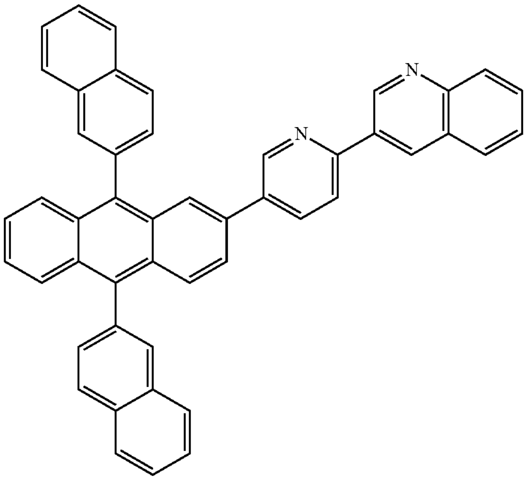
ET12
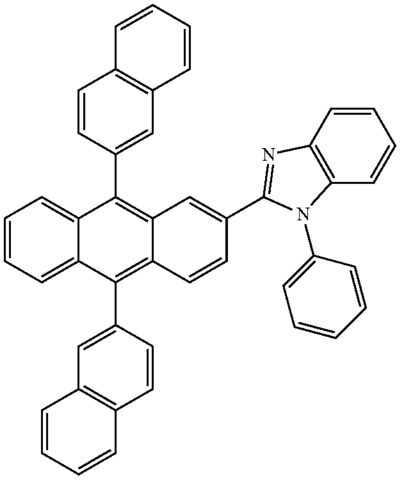
-continued
ET13
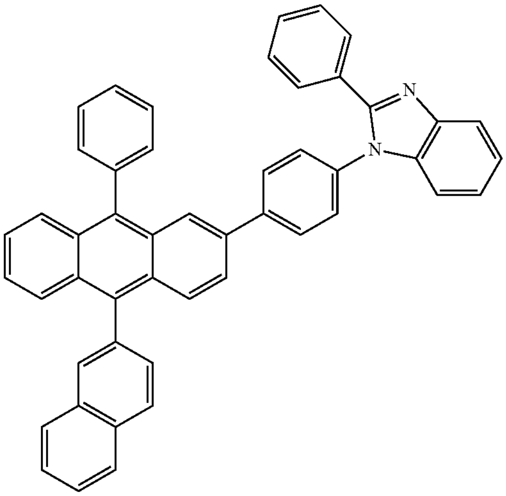
ET14
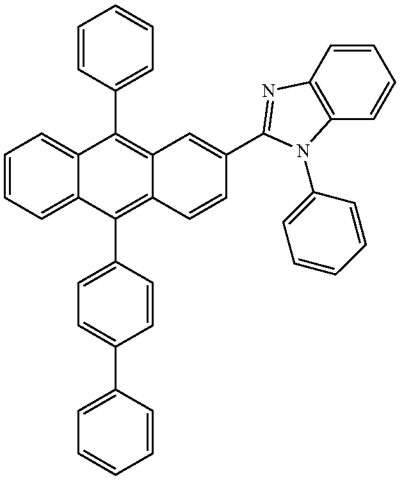
ET15
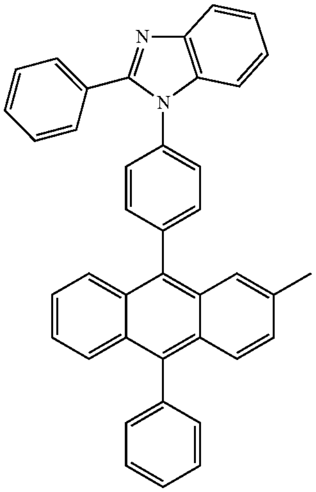

-continued
ET16
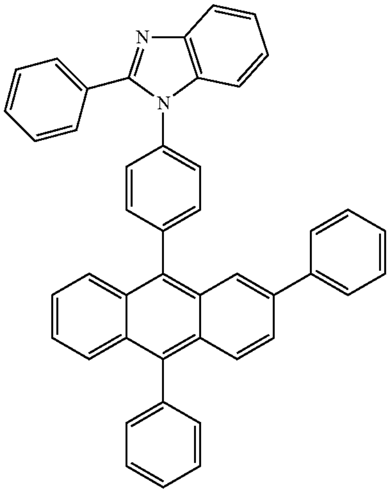
ET17
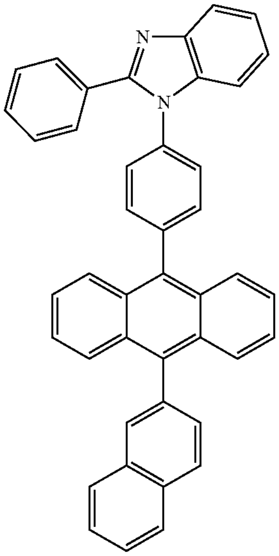
ET18
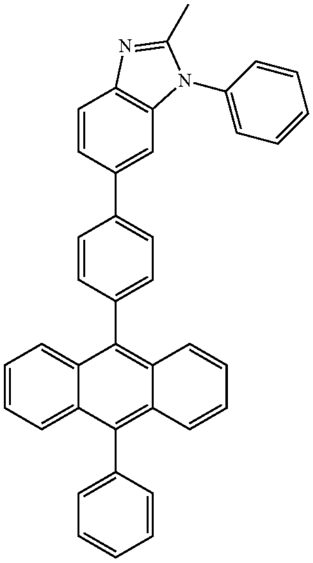
-continued
ET19
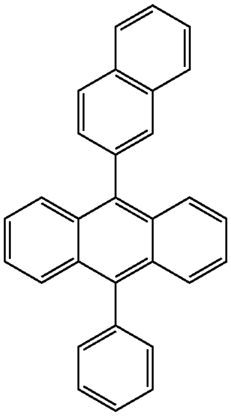
ET20
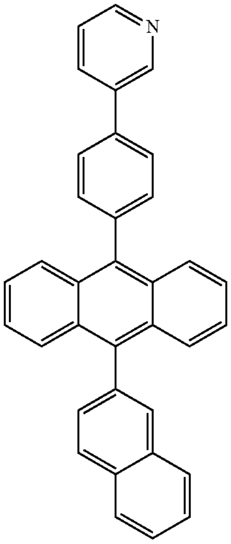
ET21
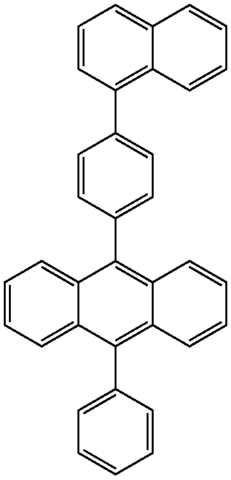

-continued
ET22
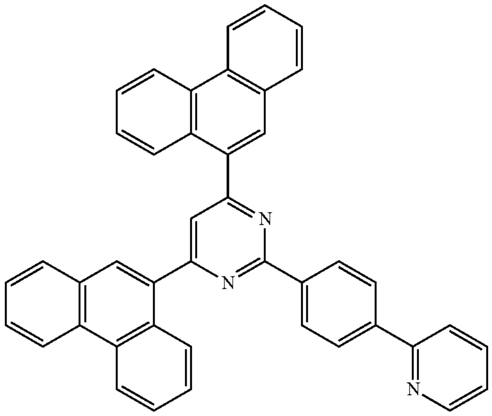
ET23
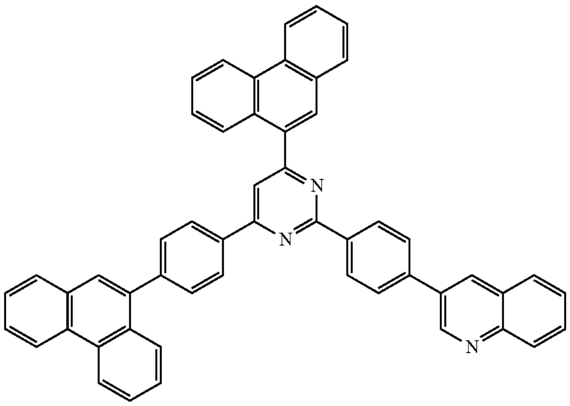
ET24
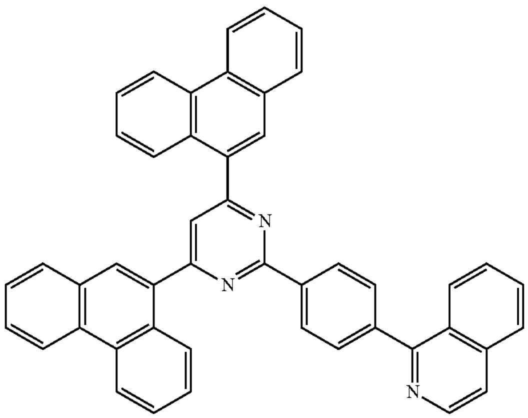
-continued
ET25
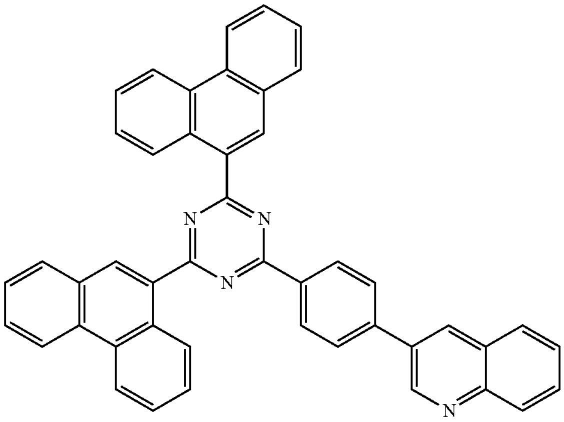
ET26
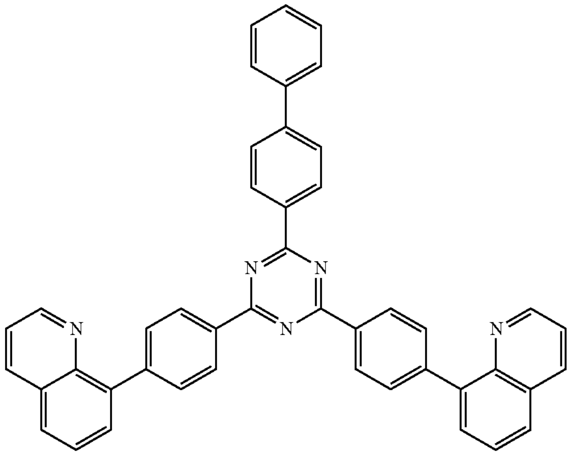
ET27
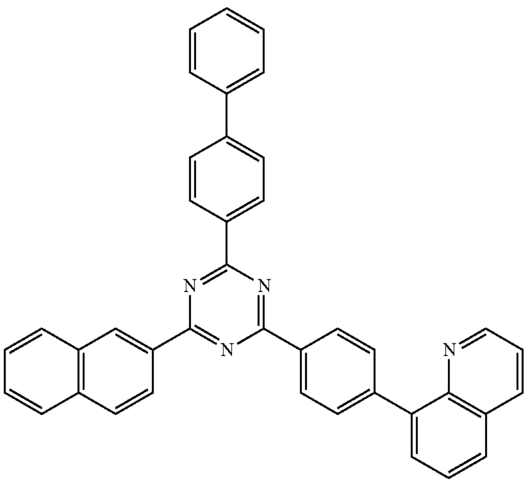

-continued
ET28
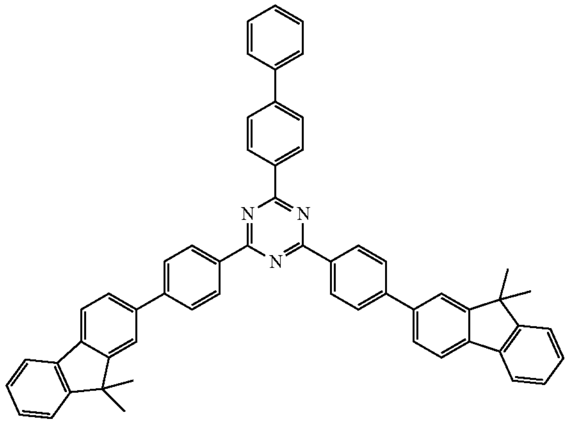
ET29
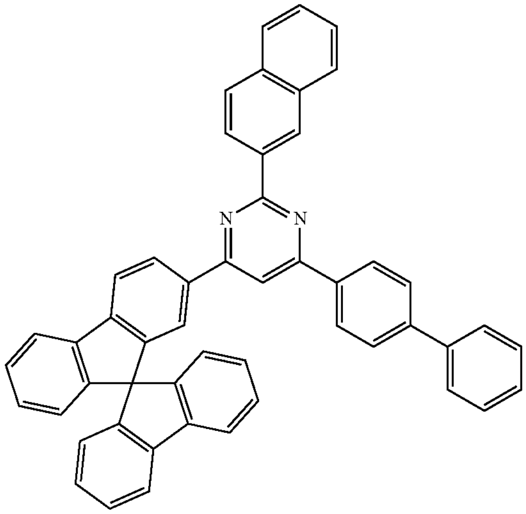
ET30
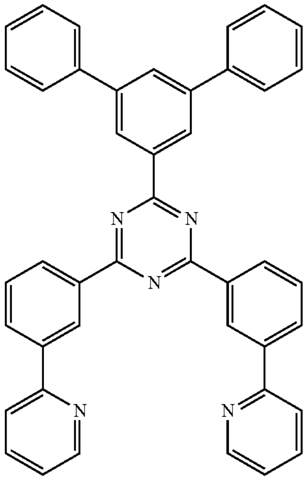
-continued
ET31
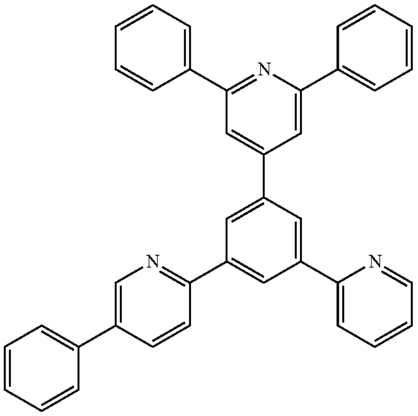
ET32
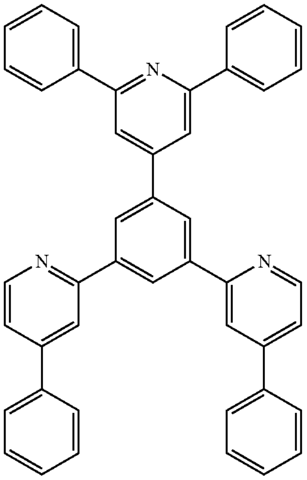
ET33
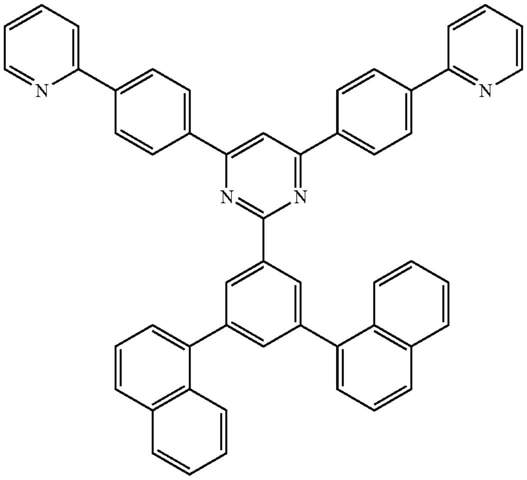

-continued
ET34
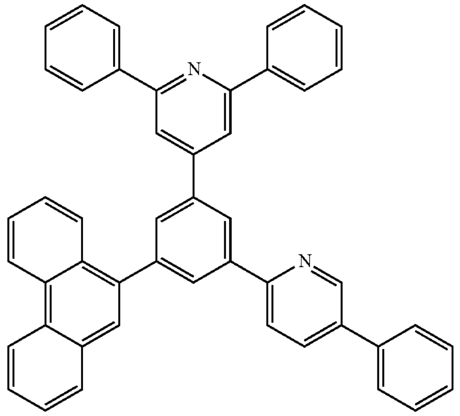
ET35
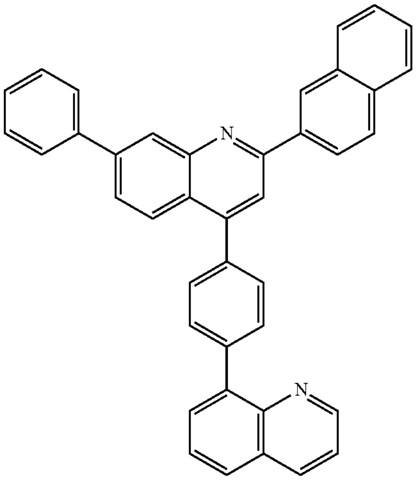
ET36
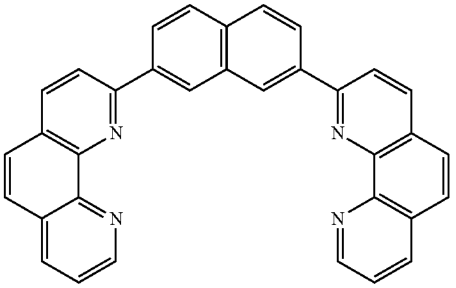
ET37
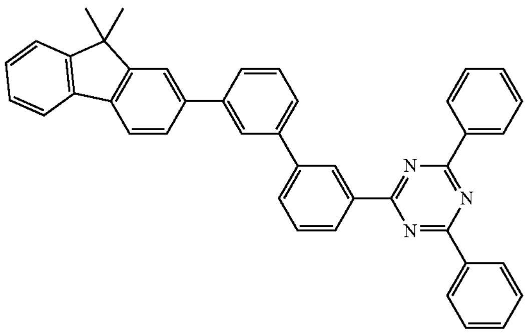
-continued
ET38
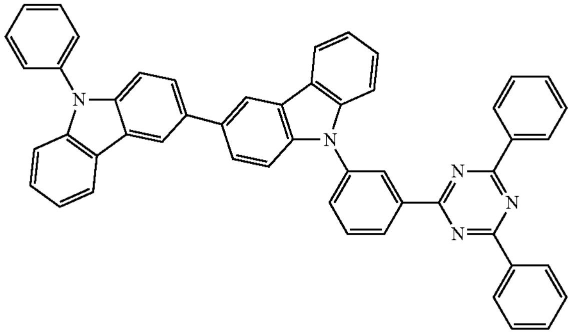
ET39
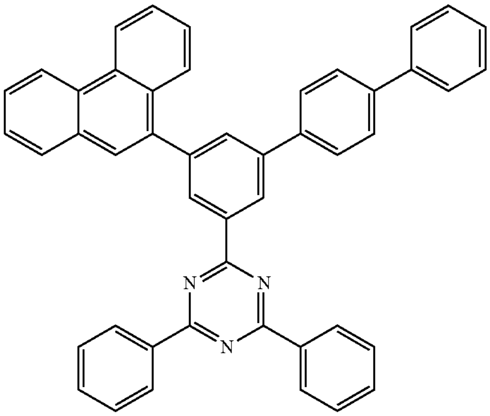
ET40
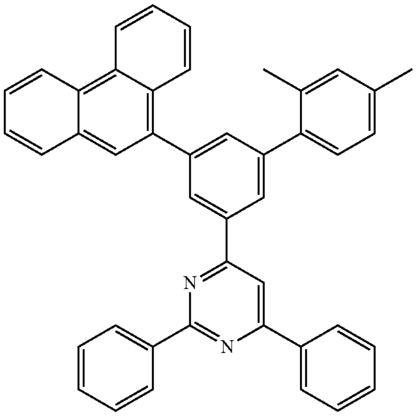

-continued
ET41
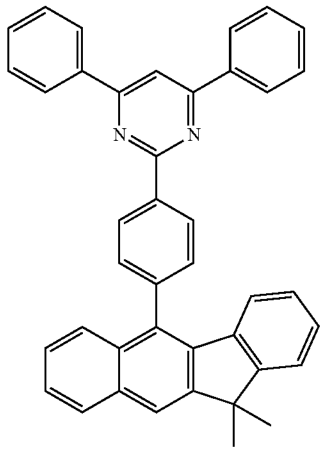
ET42
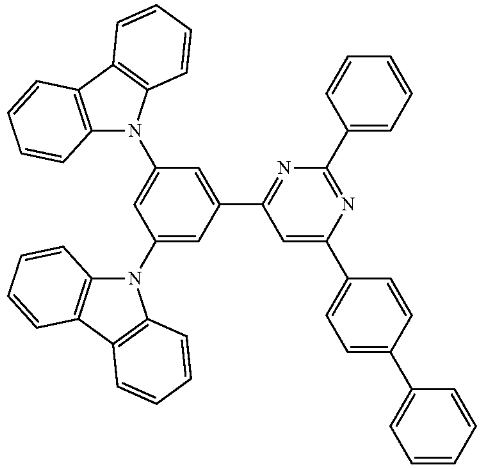
ET43
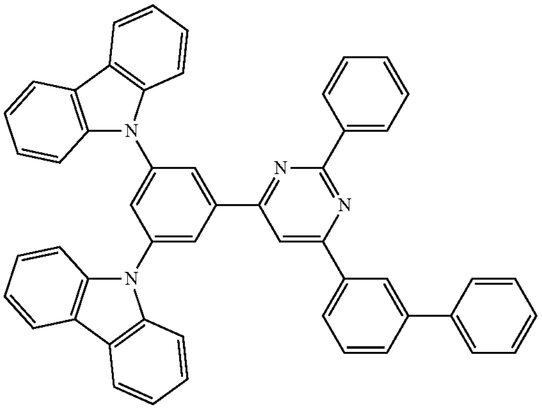
-continued
ET44
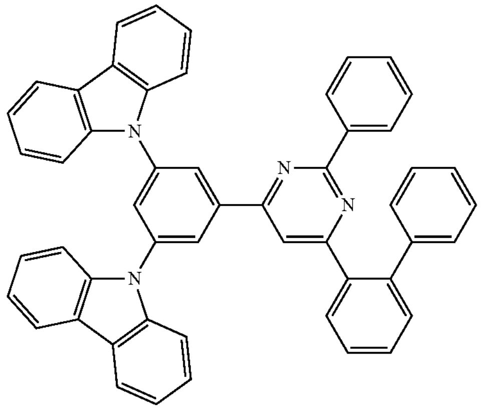
ET45
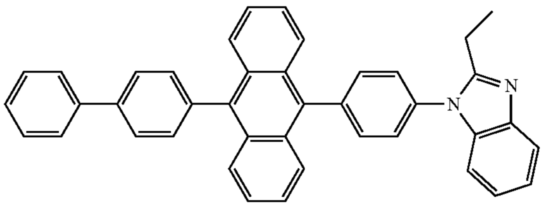
ET46
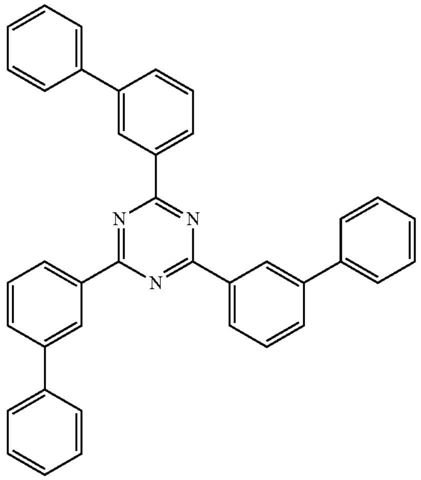
ET47
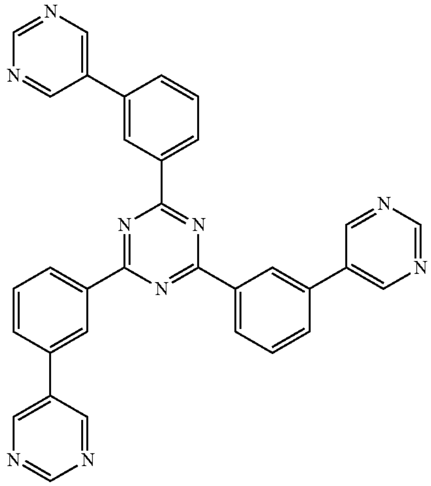

-continued

Alq3

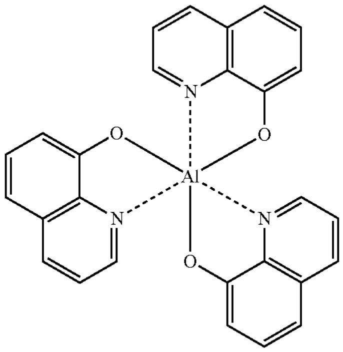

BAlq

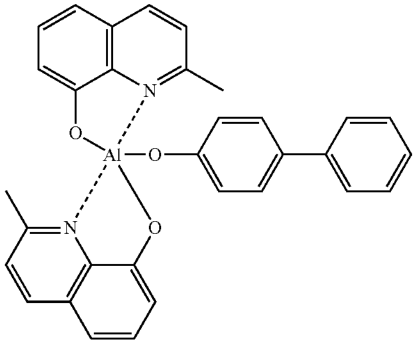

TAZ

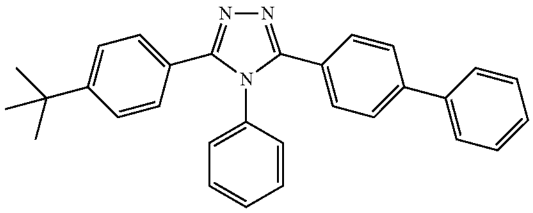

NTAZ

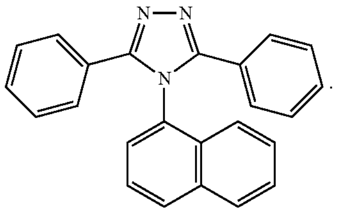

A thickness of the electron transport region 133-1, 133-2, . . . , or 133-*m* may be in a range of about 160 Å to about 5,000 Å, for example, about 100 Å to about 4,000 Å. When the electron transport region 133-1, 133-2, . . . , or 133-*m* includes a buffer layer, a hole blocking layer, an electron control layer, an electron transport layer, or any combination thereof, a thickness of the buffer layer, the hole blocking layer, or the electron control layer may be in a range of about 20 Å to about 1000 Å, for example, about 30 Å to about 300 Å, and a thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport layer are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or ET-D2:

ET-D1

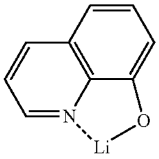

ET-D2

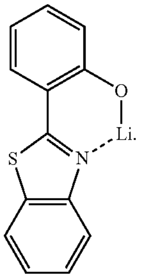

The electron transport region 133-1, 133-2, . . . , or 133-*m* may include the electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, iodides, and the like), or tellurides of the alkali metal, the alkaline earth metal, and the rare earth metal, or any combination thereof.

The alkali metal-containing compound may include alkali metal oxides, such as $Li_2O$, $Cs_2O$, $K_2O$, and the like, alkali metal halides, such as LiF, NaF, CsF, KF, LiI, NaI, CsI, KI, and the like, or any combination thereof. The alkaline earth metal-containing compound may include an alkaline earth metal compound, such as BaO, SrO, CaO, $Ba_xSr_{1-x}O$ (wherein x is a real number satisfying the condition of $0<x<1$), $Ba_xCa_{1-x}O$ (wherein x is a real number satisfying the condition of $0<x<1$), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, ScI3, $TbI_3$, or any combination thereof. For example, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth-metal complex, and the rare earth metal complex may include: i) one of ions of the alkali metal, the alkaline earth metal, and the rare earth metal; and ii), as a ligand linked to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

In an embodiment, the electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, the compound represented by Formula 601).

In one or more embodiments, the electron injection layer may consist of: i) an alkali metal-containing compound (for example, an alkali metal halide); or ii) a) an alkali metal-containing compound (for example, an alkali metal halide), and b) an alkali metal, an alkaline earth metal, a rare earth metal, or any combination thereof. In one or more embodiments, the electron injection layer may be a KI:Yb co-deposited layer, an RbI:Yb co-deposited layer, and the like.

When the electron injection layer further includes an organic material, alkali metal, alkaline earth metal, rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer may be in a range of about 1 Å to about 100 Å, for example, about 3 Å to about 90 Å. When the thickness of the electron injection layer is within these ranges, satisfactory electron injection characteristics may be obtained without a substantial increase in driving voltage.

[Second Electrode 150]

The second electrode 150 may be located on the interlayer 130 having a structure as described above. The second electrode 150 may be a cathode, which is an electron injection electrode, and as the material for the second electrode 150, a metal, an alloy, an electrically conductive compound, or any combination thereof, each having a low-work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including a plurality of layers.

Figure 2:
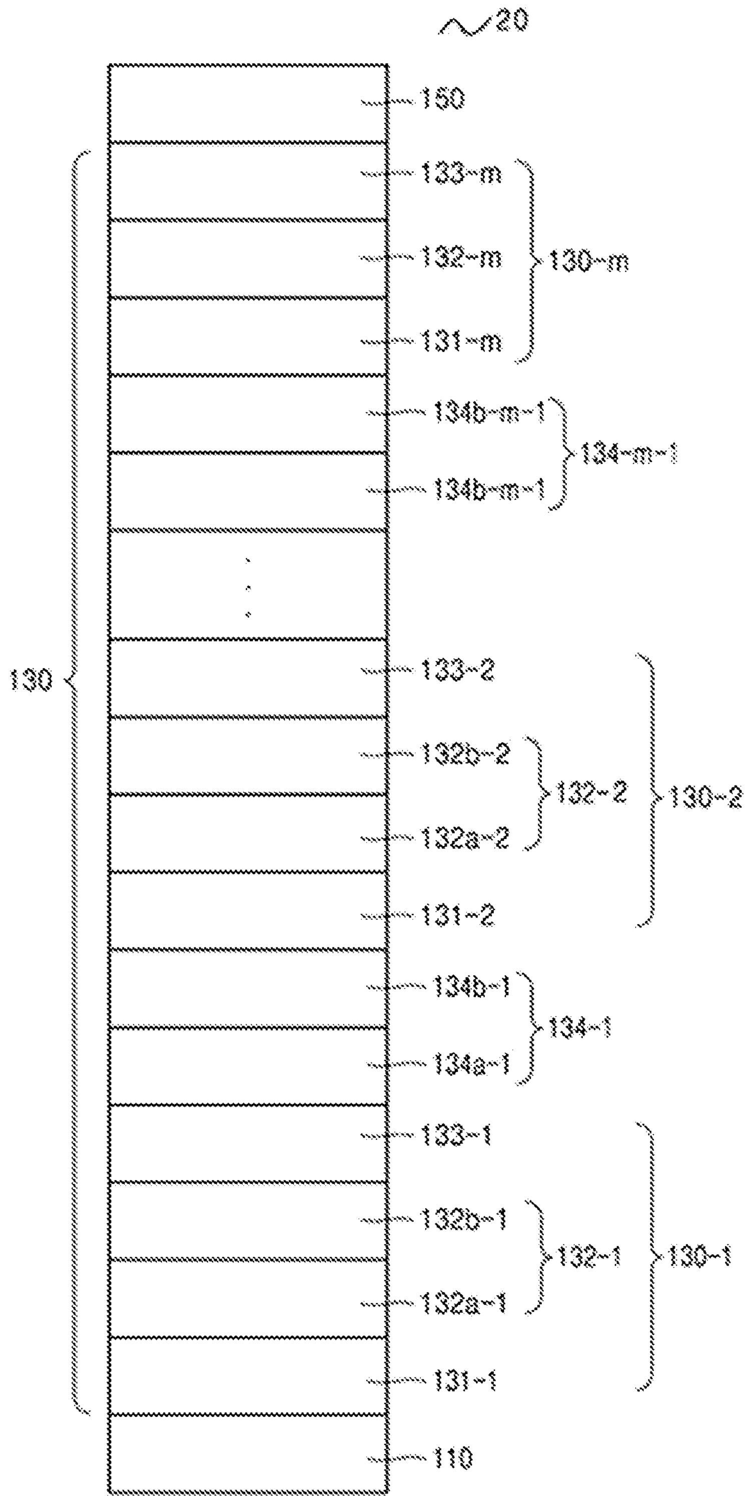

FIG. 2 is a schematic cross-sectional view of a light-emitting device 20 according to another embodiment.

As shown in FIG. 2, the light-emitting device 20 according to an embodiment may include: a first electrode 110; a second electrode 150 facing the first electrode 110; m emitting units 130-1, 130-2, . . . , and **130-*m* located between the first electrode 110 and the second electrode 150; and m−1 charge generation units 134-1, . . . , and 134-*m*−1, each located between two neighboring emitting units among the m emitting units 130-1, 130-2, . . . , and 130-*m* and including an n-type charge generation layer 134*a*−1, . . . , or 134*a*-*m*−1 and a p-type charge generation layer 134*b*−1, . . . , or 134*b*-*m***−1.

FIG. 2 shows an embodiment of the light-emitting device 20 in which two neighboring emitting units 130-1 and 130-2 to the first electrode 110 among the m emitting units 130-1, 130-2, . . . , and **130-*m* include the emission layers 132-1 and 132-2, respectively, wherein the emission layers 132-1 and 132-2 include first emission layers 132*a*−1 and 132*a*−2 and second emission layer 132*b*−1 and 132*b*−2, respectively. However, various modifications may be available, including an embodiment in which the light-emitting device 20** includes three or more emission layers that each include the first emission layer and the second emission layer or an embodiment in which the emission layer including the first emission layer and the second emission layer is spaced apart from each other instead of being in a neighboring emitting unit.

Each component of the light-emitting device 20 has the same or similar function to the corresponding component in the light-emitting device 10 of FIG. 1 as described above, so that detailed descriptions thereof will be omitted.

In an embodiment, a maximum emission wavelength of light emitted from at least one of the m emitting units 130-1, 130-2, . . . , and **130-*m* may be different from a maximum emission wavelength of light emitted from at least one of the other emitting units. Since the first emitting unit 130-1 and the second emitting unit 130-2 respectively include the multi-layered emission layers 132-1 and 132-2 as described above, light emitted from each of the first emitting unit 130-1 and the second emitting unit 130-2 may be mixed color light. In detail, light emitted from each of the first emitting unit 130-1 and the second emitting unit 130-2 may have the same maximum emission wavelengths to each other. In addition, the emission layer 132-*m* of the $m^{th}$ emitting unit 130-*m* may have i) a single-layered structure including a single layer including a single material, ii) a single-layered structure including a single layer including a plurality of different materials, or iii) a multi-layered structure having a plurality of layers including a plurality of different materials. In this regard, light emitted from the $m^{th}$ emitting unit 130**-*m* may be single color light or mixed color light. In an embodiment, the maximum emission wavelength of light emitted from the second emitting unit 130-2 may be the same as a maximum emission wavelength of light emitted from the $m^{th}$ emitting unit 130-*m*, but may be different from the maximum emission wavelength of light emitted from the first emitting unit 130-1.

In an embodiment, the m−2 emission layers 132-*m* included in the m−2 emitting units may each independently include a phosphorescent dopant, a fluorescent dopant, a delayed fluorescence material, or any combination thereof.

In one or more embodiments, all the m−2 emission layers 132-*m* may include: a phosphorescent dopant; a fluorescent dopant; or a delayed fluorescence material.

In one or more embodiments, at least one of the m−2 emission layers 132-*m* may include a phosphorescent dopant and the remaining emission layers may include a fluorescent dopant. In one or more embodiments, at least one of the m−2 emission layers 132-*m* may include a phosphorescent dopant and the remaining emission layers may include a delayed fluorescence material. In one or more embodiments, at least one of the m−2 emission layers 132-*m* may include a fluorescent dopant and the remaining emission layers may include a delayed fluorescence material.

In one or more embodiments, at least one of the m−2 emission layers 132-*m* may include a phosphorescent dopant, at least one of the remaining emission layers may include a fluorescent dopant, and the remaining emission layers may include a delayed fluorescence material.

For example, all dopants included in the m−2 emission layers 132-*m* may be identical to or different from each other.

In particular, when m is 4 and considering that the first emitting unit 130-1 and the second emitting unit 130-2 respectively include the multi-layered emission layers 132-1 and 132-2 as described above, light emitted from the first emitting unit 130-1 and the second emitting unit 130-2 may each be mixed color light, the third emitting unit (not shown) may emit blue fluorescence, and the fourth light emitting unit 130-*m* may emit green phosphorescence.

Figure 3:
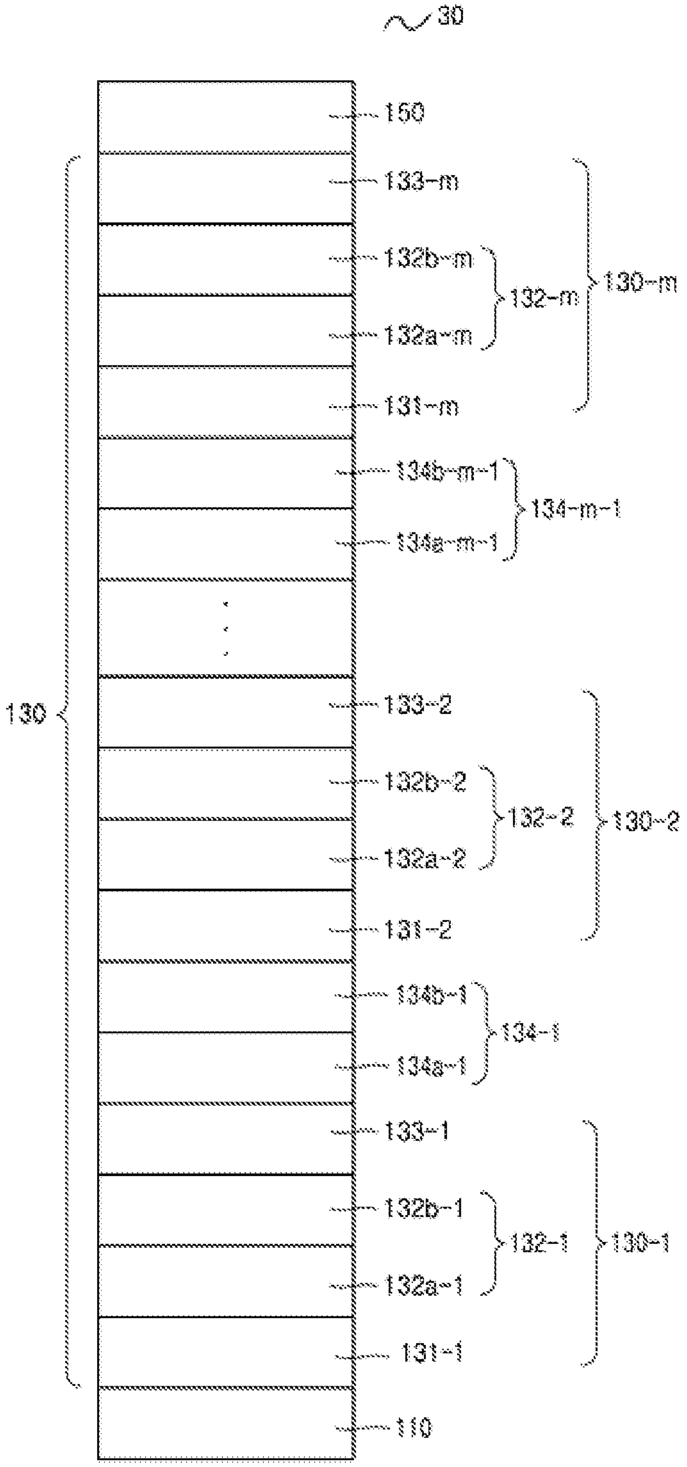

FIG. 3 is a schematic cross-sectional view of a light-emitting device 30 according to another embodiment.

As shown in FIG. 3, the light-emitting device 30 according to an embodiment may include: a first electrode 110; a second electrode 150 facing the first electrode 110; m emitting units 130-1, 130-2, . . . , and 130-*m* located between the first electrode 110 and the second electrode 150; and m−1 charge generation units 134-1, . . . , and 134-*m*−1, each located between two neighboring emitting units among the m emitting units 130-1, 130-2, . . . , and 130-*m* and including an n-type charge generation layer 134*a*−1, . . . , or 134*a*-*m*−1 and a p-type charge generation layer 134*b*−1, . . . , or 134*b*-*m*−1.

FIG. 3 shows an embodiment of a light-emitting device 30 in which m emission layers 131-1, 132-2, . . . , and 132-*m* of the m emitting units 130-1, 130-2, . . . , and 130-*m* include first emission layers 132*a*−1, . . . , and 132*a*-*m*, respectively, and second emission layers 132*b*−1, 132*b*−2, . . . , and 132*b*-*m*, respectively.

Each component of the light-emitting device 30 has the same or similar function to the corresponding component in the light-emitting device 10 of FIG. 1 as described above, so that detailed descriptions thereof will be omitted.

In an embodiment, a maximum emission wavelength of light emitted from each of the m emitting units 130-1, 130-2, . . . 130-*m* may be identical to each other.

Since the m emitting units 130-1, 130-2, . . . , and 130-*m* may respectively include the multi-layered emission layers 132-1, 132-2, . . . , and 132-*m*, as described above, light emitted from each of the m emitting units 130-1, 130-2, . . . , and 130-*m* may be mixed color light.

In particular, when m is 4 and considering that the m emitting units 130-1, 130-2, and 130-*m* respectively include the multi-layered emission layers 132-1, 132-2, . . . , and 132-*m*, as described above, light emitted from each of the m emitting units 130-1, 130-2, . . . , and 130-*m* may be mixed color light.

[Capping Layer]

A first capping layer may be located outside the first electrode 110, and/or a second capping layer may be located outside the second electrode 150. In particular, the light-emitting device 10 may have a structure in which the first capping layer, the first electrode 110, the interlayer 130, and the second electrode 150 are sequentially stacked in the stated order, a structure in which the first electrode 110, the interlayer 130, the second electrode 150, and the second capping layer are sequentially stacked in the stated order, or a structure in which the first capping layer, the first electrode 110, the interlayer 130, the second electrode 150, and the second capping layer are sequentially stacked in the stated order.

Light generated in the emission layer of the interlayer 130 of the light-emitting device 10 may be extracted toward the outside through the first electrode 110 which is a semi-transmissive electrode or a transmissive electrode, and the first capping layer. Light generated in the emission layer of the interlayer 130 of the light-emitting device 10 may be extracted toward the outside through the second electrode 150 which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the luminescence efficiency of the light-emitting device 10 may be improved.

Each of the first capping layer and the second capping layer may include a material having a refractive index of 1.6 or more (at 589 nm).

The first capping layer and the second capping layer may each independently be an organic capping layer including an organic material, an inorganic capping layer including an inorganic material, or a composite capping layer including an organic material and an inorganic material.

In an embodiment, at least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may each optionally be substituted with a substituent including O, N, S, Se, Si, F, Cl, Br, I, or any combination thereof.

In one or more embodiments, at least one of the first capping layer and the second capping layer may each independently include an amine group-containing compound.

In one or more embodiments, at least one of the first capping layer and the second capping layer may each independently include a compound represented by Formula 201, a compound represented by Formula 202, or any combination thereof.

In one or more embodiments, at least one of the first capping layer and the second capping layer may each independently include one of Compounds HT28 to HT33, one of Compounds CP1 to CP6, β-NPB, or any combination thereof:

CP1

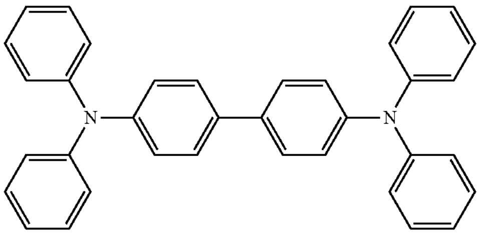

CP2

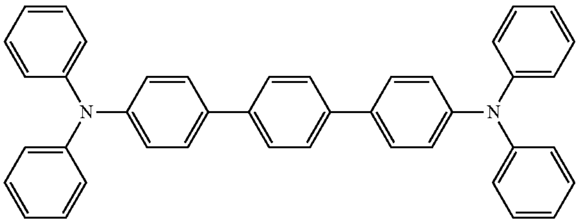

CP3

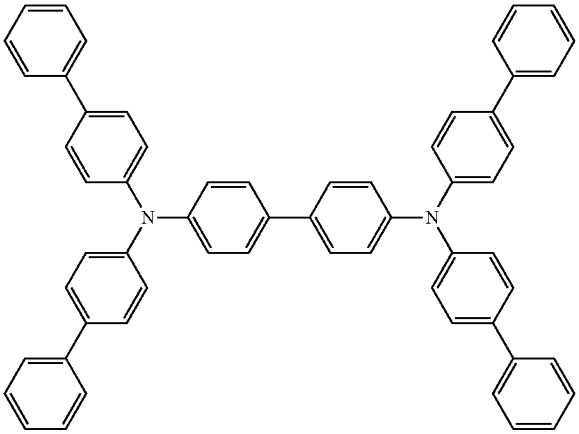

CP4

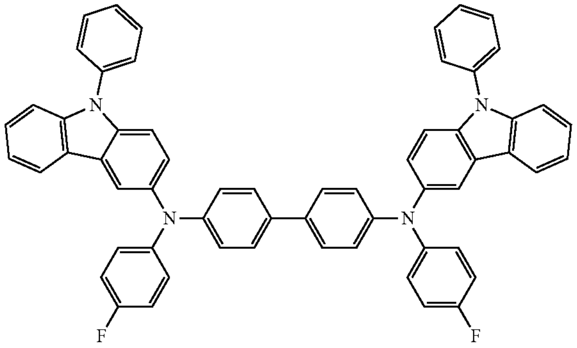

-continued

CP5

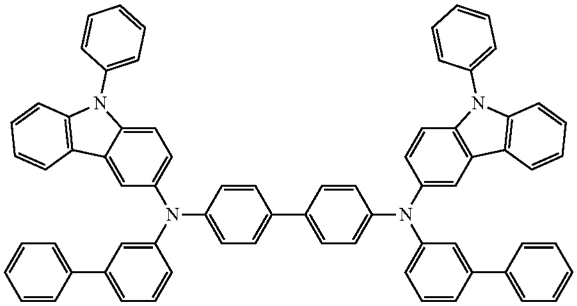

CP6

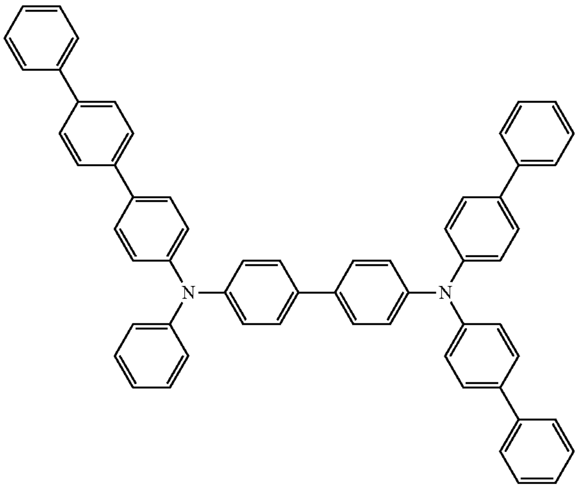

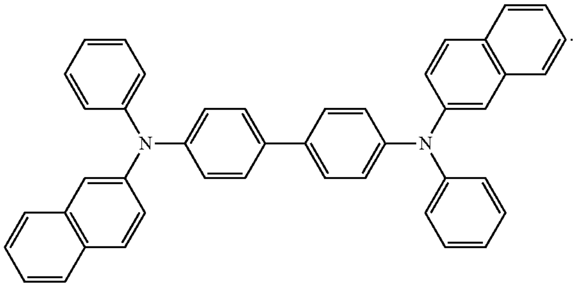

β-NPB

[Electronic Apparatus]

In an embodiment, an electronic apparatus may include quantum dots or an optical member including the quantum dots located in at least one traveling direction of light emitted from the light-emitting device.

The light-emitting device may be included in various electronic apparatuses. For example, an electronic apparatus including the light-emitting device may be a light-emitting apparatus, an authentication apparatus, or the like.

The electronic apparatus (for example, a light-emitting apparatus) may further include, in addition to the light-emitting device, i) an optical filter, such as a color filter, ii) a color conversion layer, or iii) both a color filter and a color conversion layer. The color filter and/or the color conversion layer may be located in at least one traveling direction of light emitted from the light-emitting device. For example, light emitted from the light-emitting device may be blue light or white light. Details for the light-emitting device may be the same as described herein. In an embodiment, the color conversion layer may include quantum dots. The quantum dots may be, for example, the same as described herein.

Figure 4:
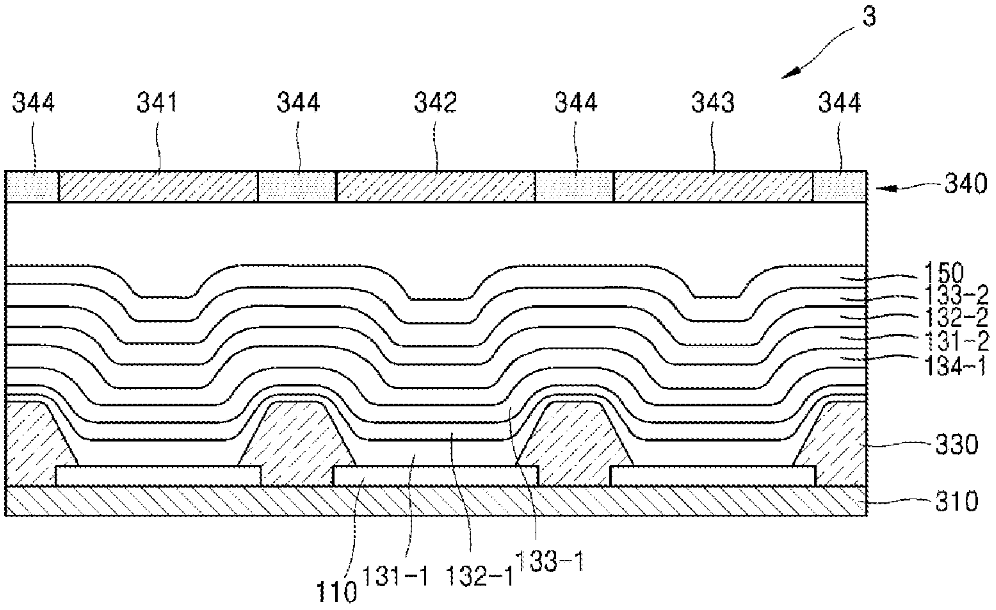
FIG. 4 is a cross-sectional view of an electronic apparatus according to an embodiment.

FIG. 4 is a cross-sectional view of an electronic apparatus 3 according to an embodiment.

In the electronic apparatus 3, an optical filter 340 may be located in at least one traveling direction of light emitted from the light-emitting device.

For example, the light-emitting device may include: a first electrode 110; a first emitting unit including a first hole transport region 131-1, a first emission layer 132-1, and a first electron transport region 133-1; a first charge generation unit 134-1; a second emitting unit including a second hole transport region 131-2, a second emission layer 132-2), and a second electron transport region 133-2; and a second electrode 150. An embodiment in which two emitting units are included has been specifically described, but the inventive concepts are not so limited such that three or more emitting units may be included. In addition, the first electrode 110, the first hole transport region 131-1, the first emission layer 132-1, the first electron transport region 133-1, the first charge generation unit 134-1, the second hole transport region 131-2, the second emission layer 132-2, the second electron transport region 133-2, and the second electrode 150 may each be the same as described herein.

The electronic device 3 may include a first substrate 310 including a plurality of sub-pixel areas spaced apart from each other. The optical filter 340 may include a first region 341, a second region 342, and a third region 343 that are spaced apart from each other and correspond to each of the plurality of sub-pixel regions. The optical filter 340 may also include a first color filter to a third color filter (not shown) and/or a first color conversion layer to a third color conversion layer (not shown).

A pixel-defining layer 330 may be located between the plurality of sub-pixel regions to define each sub-pixel region. Here, the first hole transport region 131-1, the first emission layer 132-1, the first electron transport region 133-1, the first charge generating unit 134-1, the second hole transport region 131-2, the second emission layer 132-2, the second electron transport region 133-2, and the second electrode 150 may not be patterned, but instead extend to the upper portion of the pixel-defining layer 330 to be located in the form a common layer over the first region 341, the second region 342, and the third region 343.

The optical filter 340 may further include a light-shielding pattern 344 located between the first region 341, the second region 342, and the third region 343.

The first region 341, the second region 342, and the third region 343 may emit first color light, second color light, and third color light, respectively, and the first color light, the second color light, and/or the third color light may have different maximum emission wavelengths from each other. For example, the first color light may be red light, the second color light may be green light, and the third color light may be blue light. For example, the first color filter to the third color filter (or, the first color conversion layer to the third color conversion layer) may include quantum dots. In particular, the first region may include red quantum dots, the second region may include green quantum dots, and the third region may not include quantum dots. Details for the quantum dots are the same as described herein. The first region, the second region, and/or the third region may each include a scatter.

For example, the light-emitting device may emit first light, the first region may absorb the first light to emit first-first color light, the second region may absorb the first light to emit second-first color light, and the third region may absorb the first light to emit third-first color light. In this regard, the first-first color light, the second-first color light, and the third-first color light may have different maximum emission wavelengths from each other. In particular, the first light may be blue light, the first-first color light may be red light, the second-first color light may be green light, and the third-first color light may be blue light.

Figure 5:
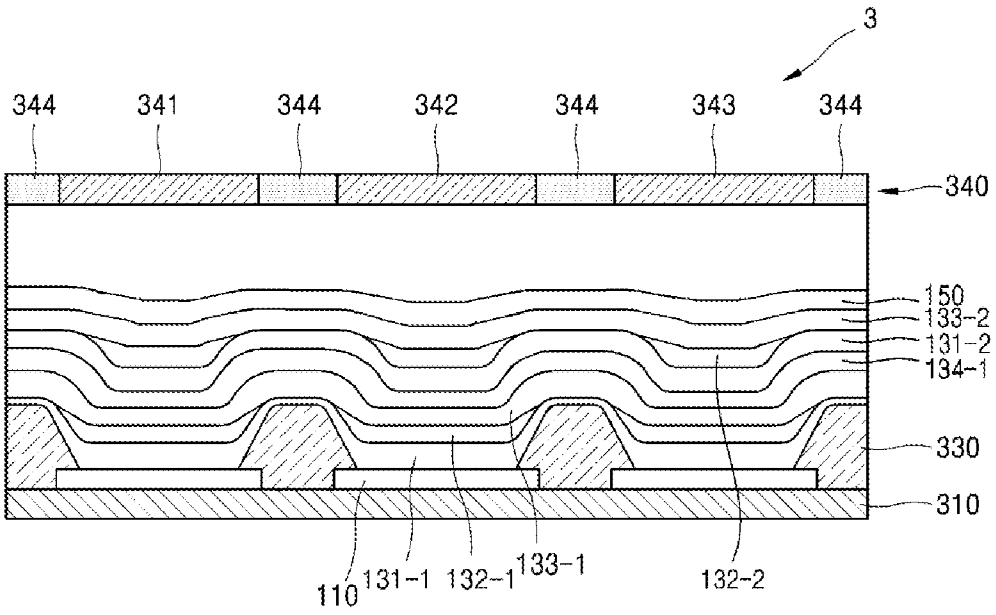
FIG. 5 illustrates a cross-sectional view of an electronic apparatus according to another embodiment.

FIG. 5 is a cross-sectional view of an electronic apparatus 3 according to another embodiment of the present invention.

In FIG. 5, the electronic apparatus 3 may include a first emission layer 132-1 and a second emission layer 132-2 that are patterned to correspond to each of the first region 341, the second region 342, and the third region 343. In the electronic apparatus 3 of FIG. 5, the first hole transport region 131-1, the first electron transport region 133-1, the first charge generation unit 134-1, the second hole transport region 131-2, the second electron transport region 133-2, and the second electrode 150 are not patterned, but instead extend to the upper portion of the pixel defining layer 330 to be located in the form of a common laver over the first region 341, the second region 342, and the third region 343.

Each component of the electronic apparatus 3 has the same or similar function to the corresponding component in the electronic apparatus 3 of FIG. 4 as described above, so that detailed descriptions thereof will be omitted.

The electronic apparatus may further include a thin-film transistor in addition to the light-emitting device as described above. The thin-film transistor may include a source electrode, a drain electrode, and an activation layer, wherein any one of the source electrode and the drain electrode may be electrically connected to any one of the first electrode and the second electrode of the light-emitting device.

The thin-film transistor may further include a gate electrode, a gate insulating film, or the like.

The activation layer may include crystalline silicon, amorphous silicon, an organic semiconductor, an oxide semiconductor, or the like.

The electronic apparatus may further include a sealing portion for sealing the light-emitting device. The sealing portion may be located between the color conversion layer and/or color filter and the light-emitting device. The sealing portion allows light from the light-emitting device to be extracted to the outside, and simultaneously prevents ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. Examples of the functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, and the like).

The authentication apparatus may further include, in addition to the light-emitting device as described above, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 6:
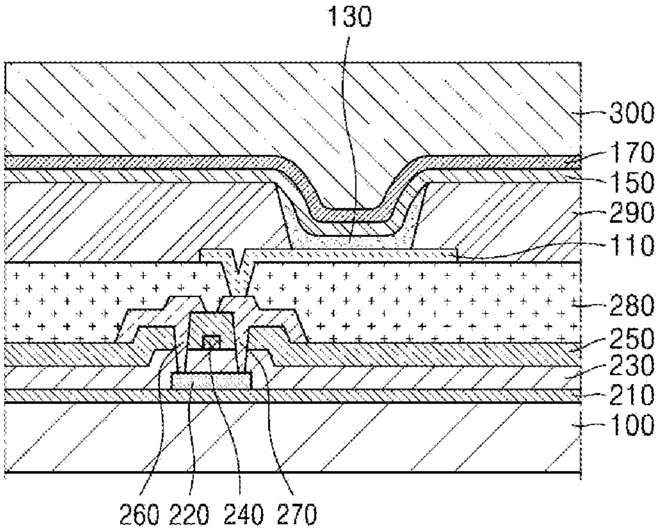
FIG. 6 shows a cross-sectional view of a light-emitting apparatus according to an embodiment.

FIG. 6 is a cross-sectional view showing a light-emitting apparatus according to an embodiment.

The light-emitting apparatus of FIG. 6 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 may prevent penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor, such as silicon or polysilicon, an organic semiconductor, or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be located between the gate electrode 240 and the source electrode 260 and between the gate electrode 240 and the drain electrode 270, in order to insulate from one another.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be located in contact with the exposed portions of the source region and the drain region of the activation layer 220.

The TFT is electrically connected to a light-emitting device to drive the light-emitting device, and is covered and protected by a passivation layer 280. The passivation layer 280 may include an inorganic insulating film, an organic insulating film, or any combination thereof. A light-emitting device is provided on the passivation layer 280. The light-emitting device may include a first electrode 110, an interlayer 130, and a second electrode 150.

The first electrode 110 may be located on the passivation layer 280. The passivation layer 280 may be located to expose a portion of the drain electrode 270, not fully covering the drain electrode 270, and the first electrode 110 may be located to be connected to the exposed portion of the drain electrode 270.

A pixel defining layer 290 including an insulating material may be located on the first electrode 110. The pixel defining layer 290 may expose a certain region of the first electrode 110, and an interlayer 130 may be formed in the exposed region of the first electrode 110. The pixel defining layer 290 may be a polyimide or polyacrylic organic film. Although not shown in FIG. 6, at least some layers of the interlayer 130 may extend up to the upper portion of the pixel defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture or oxygen. The encapsulation portion 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and the like), an epoxy-based resin (for example, aliphatic glycidyl ether (AGE), and the like), or any combination thereof; or any combination of the inorganic films and the organic films.

Figure 7:
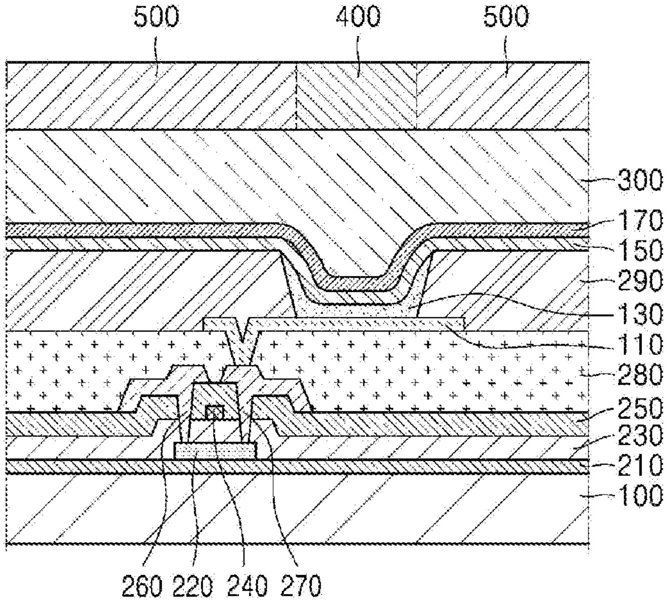
FIG. 7 shows a cross-sectional view of a light-emitting apparatus according to another embodiment.

FIG. 7 shows a cross-sectional view showing a light-emitting apparatus according to an embodiment.

The light-emitting apparatus of FIG. 7 is the same as the light-emitting apparatus of FIG. 6, except that a light-shielding pattern 500 and a functional region 400 are additionally located on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 7 may be a tandem light-emitting device.

The layers included in the hole transport region, the emission layer, and the layers included in the electron transport region may be formed in a certain region by using various methods such as vacuum deposition, spin coating, casting, Langmuir-Blodgett (LB) deposition, ink-jet printing, laser-printing, laser-induced thermal imaging, and the like.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

The term "$C_3$-$C_{60}$ carbocyclic group" as used herein refers to a cyclic group consisting of carbon only and having 3 to 60 carbon atoms, and the term "$C_1$-$C_{60}$ heterocyclic group" as used herein refers to a cyclic group that has 1 to 60 carbon atoms and further has, in addition to carbon, a heteroatom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the number of ring-forming atoms of the $C_1$-$C_{60}$ heterocyclic group may be from 3 to 61.

The "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has 3 to 60 carbon atoms and does not include *—N═*' as a ring-forming moiety, and the term "π electron-deficient nitrogen-containing $C_1$-$C_{60}$ cyclic group" as used herein refers to a heterocyclic group that has 1 to 60 carbon atoms and includes *—N=*' as a ring-forming moiety.

For example, the $C_3$-$C_{60}$ carbocyclic group may be i) a T1 group or ii) a condensed cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a condensed cyclic group in which two or more T2 groups are condensed with each other, or iii) a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the π electron-rich $C_3$-$C_{60}$ cyclic group may be i) a T1 group, ii) a condensed cyclic group in which two or more T1 groups are condensed with each other, iii) a T3 group, iv) a condensed cyclic group in which two or more T3 groups are condensed with each other, or v) a condensed cyclic group in which at least one T3 group and at least one T1 group are condensed with each other (for example, the $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, and the like), the π electron-deficient nitrogen-containing $C_1$-$C_{60}$ cyclic group may be i) a T4 group, ii) a condensed cyclic group in which two or more T4 groups are condensed with each other, iii) a condensed cyclic group in which at least one T4 group and at least one T1 group are condensed with each other, iv) a condensed cyclic group in which at least one T4 group and at least one T3 group are condensed with each other, or v) a condensed cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or bicyclo[2.2.1]heptane), a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group condensed to any cyclic group, a monovalent group, or a polyvalent group (for example, a divalent group, a trivalent group, a tetravalent group, and the like) according to the structure of a formula for which the corresponding term is used. In an embodiment, "a benzene group" may be a benzo group, a phenyl group, a phenylene group, or the like, which may be easily understand by one of ordinary skill in the art according to the structure of a formula including the "benzene group."

Examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has 1 to 60 carbon atoms, and specific examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, and the like. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof are an ethenyl group, a propenyl group, a butenyl group, and the like. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof are an ethynyl group, a propynyl group, and the like. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof are a methoxy group, an ethoxy group, an isopropyloxy group, and the like.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, a bicyclo[2.2.2]octyl group, and the like. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group of 1 to 10 carbon atoms, further including, in addition to carbon atoms, at least one heteroatom, as ring-forming atoms, and specific examples are a 1,2,3,4-oxatriazolidinyl group, a tetrahydrofuranyl group, a tetrahydrothiophenyl group, and the like. The term "$C_1$-$C_{10}$ heterocycloalkylene group" as used herein refers to a divalent group having the same structure as the $C_1$-$C_{10}$ heterocycloalkyl group.

The term $C_3$-$C_{10}$ cycloalkenyl group used herein refers to a monovalent cyclic group that has three to ten carbon atoms and at least one carbon-carbon double bond in the ring thereof and no aromaticity, and specific examples thereof are a cyclopentenyl group, a cyclohexenyl group, a cycloheptenyl group, and the like. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group are a 4,5-dihydro-1,2,3,4-oxatriazolyl group, a 2,3-dihydrofuranyl group, a 2,3-dihydrothiophenyl group, and the like. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system of 6 to 60 carbon atoms, and the term "$C_6$-$C_{60}$ arylene group" as used herein refers to a divalent group having a carbocyclic aromatic system of 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and the like. When the $C_6$-$C_{60}$ aryl group and the $C_6$-$C_{60}$ arylene group each include two or more rings, the two or more rings may be condensed with each other.

The term "$C_1$-$C_{60}$ heteroaryl group" as used herein refers to a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein refers to a divalent group having a heterocyclic aromatic system of 1 to 60 carbon atoms, further including, in addition to carbon atoms, at least one heteroatom, as ring-forming atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a naphthyridinyl group, and the like. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein refers to a divalent group having the same structure as the monovalent non-aromatic condensed polycyclic group described above.

The term "monovalent non-aromatic condensed heteropolycyclic group" as used herein refers to a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, a benzothienodibenzothiophenyl group, and the like. The term "divalent non-aromatic condensed heteropolycyclic group" as used herein refers to a divalent group having the same structure as the monovalent non-aromatic condensed heteropolycyclic group described above.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "$R_{10a}$" as used herein refers to:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$).

In the present specification, $Q_1$ to $Q_3$, $Q_{11}$ to $Q_{13}$, $Q_{21}$ to $Q_{23}$ and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of heteroatoms are O, S, N, P, Si, B, Ge, Se, or any combination thereof.

The term "Ph" as used herein refers to a phenyl group, the term "Me" as used herein refers to a methyl group, the term "Et" as used herein refers to an ethyl group, the term "ter-Bu" or "$Bu^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, a light-emitting device according to embodiments will be described in detail with reference to Examples.

EXAMPLES

Comparative Example 1

As a substrate also serving as an anode, each of a first glass substrate with 15 Ω/cm$^2$ (100 Å) ITO (manufactured by Corning. Inc.,) formed thereon, a second glass substrate with (1,000 Å) Ag formed thereon, and a third glass with 15

Ω/cm$^2$ (100 Å) ITO (manufactured by Corning. Inc.,) formed thereon was cut to a size of 50 mm×50 mm×0.7 mm, and sonicated with isopropyl alcohol and pure water, each for 5 minutes. Then, ultraviolet light was irradiated for 30 minutes thereto, and ozone was exposed thereto for cleaning. Subsequently, the resultant first glass substrate, second glass substrate, and third glass substrate were sequentially stacked to be loaded onto a vacuum deposition apparatus.

On the anode, HAT-CN was deposited to a thickness of 50 Å, NPB was deposited to a thickness of 600 Å, TCTA was deposited to a thickness of 50 Å, and Compound H8 as a host and FD37 as a dopant were co-deposited at a weight ratio of 98:2, thereby forming an emission layer having a thickness of 170 Å. On the emission layer, ET46 was deposited to a thickness of 50 Å, and ET47 and LiQ were co-deposited at a ratio of 5:5 to a thickness of 200 Å, thereby forming a first emitting unit.

On the first emitting unit, BCP and Li (wherein an amount of Li was 1 wt %) were co-deposited to form an n-type charge generation layer having a thickness of 50 Å, and HAT-CN was deposited to form a p-type charge generation layer having a thickness of 50 Å, thereby forming a first charge generation unit.

On the first charge generation unit, NPB was deposited to a thickness of 600 Å, TCTA was deposited to a thickness of 50 Å, and Compound H8 as a host and FD37 as a dopant were co-deposited at a weight ratio of 98:2, thereby forming an emission layer having a thickness of 170 Å. On the emission layer, ET46 was deposited to a thickness of 50 Å, and ET47 and LiQ were co-deposited at a ratio of 5:5 to a thickness of 200 Å, thereby forming a second emitting unit.

On the second emitting unit, BCP and Li (wherein an amount of Li was 1 wt %) were co-deposited to form an n-type charge generation layer having a thickness of 50 Å, and HAT-CN was deposited to form a p-type charge generation layer having a thickness of 50 Å, thereby forming a second charge generation unit.

On the second charge generation unit, NPB was deposited to a thickness of 600 Å, TCTA was deposited to a thickness of 50 Å, and Compound H8 as a host and FD37 as a dopant were co-deposited at a weight ratio of 98:2, thereby forming an emission layer having a thickness of 170 Å. On the emission layer, ET46 was deposited to a thickness of 50 Å, and ET47 and LiQ were co-deposited at a ratio of 5:5 to a thickness of 200 Å, thereby forming a third emitting unit.

On the third emitting unit, BCP and Li (wherein an amount of Li was 1 wt %) were co-deposited to form an n-type charge generation layer having a thickness of 50 Å, and HAT-CN was deposited to form a p-type charge generation layer having a thickness of 50 Å, thereby forming a third charge generation unit.

On the third charge generation unit, NPB was deposited to a thickness of 600 Å, TCTA was deposited to a thickness of 50 Å, and Compound H39, Compound H126, and PD13 were co-deposited at a weight ratio of 40.5:40.5:9, thereby forming an emission layer having a thickness of 250 Å. On the emission layer, ET46 was deposited to a thickness of 50 Å, and ET47 and LiQ were co-deposited at a ratio of 5:5 to a thickness of 200 Å, thereby forming a fourth emitting unit.

On the fourth emitting unit, Yb was deposited to form an electron injection layer having a thickness of 10 Å, Ag and Mg were co-deposited on the electron injection layer at a weight ratio of 9:1 to form a cathode having a thickness of 100 Å, and HT28 was deposited on the cathode to form a capping layer having a thickness of 700 Å, thereby completing the manufacture of a light-emitting device.

Example 1

A light-emitting device was manufactured in the same manner as in Comparative Example 1, except that, instead of the emission layer of the first emitting unit, a double-layered emission layer including a first emission layer and a second emission layer that were sequentially stacked as described later was used.

Compound mCP as a first host, Compound B3PYMPM as a second host, and Compound DF9 a first dopant were co-deposited at a weight ratio of 49:49:2 to form a first emission layer having a thickness of 85 Å. Then, on the first emission layer, Compound mCP as a third host, Compound B3PYMPM as a fourth host, and Compound PD13 as a second dopant were co-deposited at a weight ratio of 40.5:40.5:9 to form a second emission layer having a thickness of 85 Å.

Example 2

A light-emitting device was manufactured in the same manner as in Comparative Example 1, except that, instead of the emission layer of the first emitting unit and the emission layer of the second emitting unit, a double-layered emission layer including a first emission layer and a second emission layer that were sequentially stacked as described later was respectively used.

Compound mCP as a first host, Compound B3PYMPM as a second host, and Compound DF9 a first dopant were co-deposited at a weight ratio of 49:49:2 to form a first emission layer having a thickness of 85 Å. Then, on the first emission layer, Compound mCP as a third host, Compound B3PYMPM as a fourth host, and Compound PD13 as a second dopant were co-deposited at a weight ratio of 40.5:40.5:9 to form a second emission layer having a thickness of 85 Å.

Example 3

A light-emitting device was manufactured in the same manner as in Comparative Example 1, except that, instead of the emission layer of the first emitting unit, the emission layer of the second emitting unit, and the emission layer of the third emitting unit, a double-layered emission layer including a first emission layer and a second emission layer that were sequentially stacked as described later was respectively used.

Compound mCP as a first host, Compound B3PYMPM as a second host, and Compound DF9 a first dopant were co-deposited at a weight ratio of 49:49:2 to form a first emission layer having a thickness of 85 Å. Then, on the first emission layer, Compound mCP as a third host, Compound B3PYMPM as a fourth host, and Compound PD13 as a second dopant were co-deposited at a weight ratio of 40.5:40.5:9 to form a second emission layer having a thickness of 85 Å.

Example 4

A light-emitting device was manufactured in the same manner as in Comparative Example 1, except that, instead of the emission layer of the first emitting unit, the emission layer of the second emitting unit, and the emission layer of the third emitting unit, a double-layered emission layer including a first emission layer and a second emission layer that were sequentially stacked as described later was respectively used, and that, instead of the emission layer of the fourth emitting unit, a double-layered emission layer including a third emission layer and a fourth emission layer that were sequentially stacked as described later was used.

Compound mCP as a first host, Compound B3PYMPM as a second host, and Compound DF9 a first dopant were co-deposited at a weight ratio of 49:49:2 to form a first emission layer having a thickness of 85 Å. Then, on the first emission layer, Compound mCP as a third host, Compound B3PYMPM as a fourth host, and Compound PD13 as a second dopant were co-deposited at a weight ratio of 40.5:40.5:9 to form a second emission layer having a thickness of 85 Å.

Compound mCP as a first host, Compound B3PYMPM as a second host, and Compound DF9 a first dopant were co-deposited at a weight ratio of 49:49:2 to form a third emission layer having a thickness of 125 Å. Then, on the third emission layer, Compound mCP as a third host, Compound B3PYMPM as a fourth host, and Compound PD13 as a second dopant were co-deposited at a weight ratio of 40.5:40.5:9 to form a fourth emission layer having a thickness of 125 Å.

Evaluation Example 1

Regarding the light-emitting devices manufactured according to Comparative Example 1 and Examples 1 to 4, the efficiency (Cd/A/y) at luminance of 1,500 nits was measured by using a color luminance meter, a Keithley source meter apparatus, and a fixed current room-temperature lifespan apparatus. Results thereof are shown in Table 1.

The efficiency for each of the light-emitting devices of Examples 1 to 4 is a relative value expressed on the basis of 100% of the efficiency of the light-emitting device of Comparative Example 1.

TABLE 1

| | Emission layer of first emitting unit<br>Emission layer of second emitting unit<br>Emission layer of third emitting unit<br>Emission layer of fourth emitting unit | Efficiency (Cd/A/y) | Luminance (nit) |
|---|---|---|---|
| Comparative Example 1 | Single blue fluorescent emission layer<br>Single blue fluorescent emission layer<br>Single blue fluorescent emission layer<br>Single green phosphorescent emission layer | 100% | 1500 |
| Example 1 | Double-layered emission layer<br>Single blue fluorescent emission layer<br>Single blue fluorescent emission layer<br>Single green phosphorescent emission layer | 130% | 1500 |
| Example 2 | Double-layered emission layer<br>Double-layered emission layer<br>Single blue fluorescent emission layer<br>Single green phosphorescent emission layer | 159% | 1500 |
| Example 3 | Double-layered emission layer<br>Double-layered emission layer<br>Double-layered emission layer<br>Single green phosphorescent emission layer | 182% | 1500 |
| Example 4 | Double-layered emission layer<br>Double-layered emission layer<br>Double-layered emission layer<br>Double-layered emission layer | 206% | 1500 |

Referring to Table 1, it was confirmed that, as compared to the light-emitting device of Comparative Example 1 in which all the emitting units respectively had a single-layered emission layer structure, the light-emitting devices of Examples 1 to 4 had significantly excellent efficiency.

According to the one or more embodiments, a light-emitting device may have high efficiency.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting device comprising:
a first electrode;
a second electrode facing the first electrode;
m emitting units located between the first electrode and the second electrode; and
m−1 charge generation units, each located between two neighboring emitting units among the m emitting units and including an n-type charge generation layer and a p-type charge generation layer,
wherein:
m is an integer of 2 or more;
the m emitting units each comprises a hole transport region, an emission layer, and an electron transport region, which are sequentially arranged;
at least one of the m emission layers comprises a first emission layer and a second emission layer that are in contact with each other;
the first emission layer comprises a first host, a second host, and a first dopant;
the second emission layer comprises a third host, a fourth host, and a second dopant;
the first host and the second host form a first exciplex;
the third host and the fourth host form a second exciplex; and
the first dopant is a delayed fluorescence dopant, and the second dopant is a phosphorescent dopant, and
wherein a lowest excitation triplet energy level of the first exciplex (T1(Ex1) and a lowest excitation triplet energy level of the second exciplex (T1(Ex2)) are each greater than 2.7 eV.

2. The light-emitting device of claim 1, wherein the first dopant and the second dopant emit light of different colors from each other.

3. The light-emitting device of claim 1, wherein the first dopant emits blue light, and the second dopant emits green light or red light.

4. The light-emitting device of claim 1, wherein the first host is identical to the third host and the second host is identical to the fourth host.

5. The light-emitting device of claim 1, wherein m is an integer equal to greater than 3.

6. The light-emitting device of claim 1, wherein:

the first emission layer is located between the first electrode and the second electrode, and the second emission layer is located between the first emission layer and the second electrode; or the first emission layer is located between the first electrode and the second electrode, and the second emission layer is located between the first electrode and the first emission layer.

7. The light-emitting device of claim 1, wherein:

the hole transport region comprises a hole injection layer, a hole transport layer, an emission auxiliary layer, an electron blocking layer, or any combination thereof; and the electron transport region comprises a buffer layer, a hole blocking layer, an electron transport layer, an electron injection layer, or any combination thereof.

8. The light-emitting device of claim 1, wherein a maximum emission wavelength of light emitted from at least one emitting unit of the m emitting units is different from a maximum emission wavelength of light emitted from at least one emitting unit of the remaining emitting units.

9. A light-emitting device comprising:

a first electrode;

a second electrode facing the first electrode;

m emitting units located between the first electrode and the second electrode; and m−1 charge generation units, each located between two neighboring emitting units among the m emitting units and including an n-type charge generation layer and a p-type charge generation layer, wherein:

m is an integer of 2 or more;

the m emitting units each comprises a hole transport region, an emission layer, and an electron transport region, which are sequentially arranged;

at least one of the m emission layers comprises a first emission layer and a second emission layer that are in contact with each other;

the first emission layer comprises a first host, a second host, and a first dopant;

the second emission layer comprises a third host, a fourth host, and a second dopant;

the first host and the second host form a first exciplex;

the third host and the fourth host form a second exciplex; and the first dopant is a delayed fluorescence dopant, and the second dopant is a phosphorescent dopant, and wherein light emitted from each of the m emitting units has the same maximum emission wavelengths.

10. A light-emitting device comprising:

a first electrode;

a second electrode facing the first electrode;

m emitting units located between the first electrode and the second electrode; and m−1 charge generation units, each located between two neighboring emitting units among the m emitting units and including an n-type charge generation layer and a p-type charge generation layer, wherein:

m is an integer of 2 or more;

the m emitting units each comprises a hole transport region, an emission layer, and an electron transport region, which are sequentially arranged;

at least one of the m emission layers comprises a first emission layer and a second emission layer that are in contact with each other;

the first emission layer comprises a first host, a second host, and a first dopant;

the second emission layer comprises a third host, a fourth host, and a second dopant;

the first host and the second host form a first exciplex;

the third host and the fourth host form a second exciplex; and the first dopant is a delayed fluorescence dopant, and the second dopant is a phosphorescent dopant, and wherein:

the light-emitting device comprises a first emitting unit, a second emitting unit adjacent to the first emitting unit, and a first charge generation unit between the first emitting unit and the second emitting unit;

the first emitting unit is located between the first electrode and the first charge generation unit;

the first emitting unit comprises the first emission layer and the second emission layer; and the second emitting unit comprises neither the first emission layer nor the second emission layer.

11. The light-emitting device of claim 1, wherein:

the light-emitting device comprises a first emitting unit, a second emitting unit adjacent to the first emitting unit, and a first charge generation unit between the first emitting unit and the second emitting unit;

the first emitting unit is located between the first electrode and the first charge generation unit; and each of the first emitting unit and the second light-emitting unit comprises both the first emission layer and the second emission layer.

12. The light-emitting device of claim 1, wherein the first host and the third host are each independently represented by Formula 1:

Formula 1

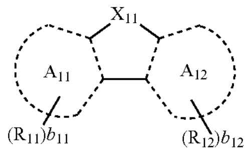

wherein, in Formula 1, $X_{11}$ is O, S, or $N(R_{13})$, $R_{11}$ to $R_{13}$ are each independently $*-(L_{11})_{a11}-R_{14}$, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, wherein at least one of $R_{11}$ to $R_{13}$ is $*-(L_{11})_{a11}-R_{14}$, b11 and b12 are each independently an integer of 1 to 6, $L_{11}$ is a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a11 is an integer of 0 to 5, $R_{14}$ is hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), $R_{10a}$ is: deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

13. The light-emitting device of claim 1, wherein the second host and the fourth host are each independently represented by Formula 3:

Formula 3

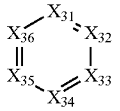

wherein, in Formula 3, $X_{31}$ is N or C($R_{31}$); $X_{32}$ is N or C($R_{32}$); $X_{33}$ is N or C($R_{33}$); $X_{34}$ is N or C($R_{34}$); $X_{35}$ is N or C($R_{35}$); and $X_{36}$ is N or C($R_{36}$), at least one of $X_{31}$ to $X_{36}$ is N, $R_{31}$ to $R_{36}$ are each independently *-($L_{31}$)$_{a31}$-$R_{37}$, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), wherein at least one of $R_{31}$ to $R_{36}$ is *-($L_{31}$) a31-$R_{37}$, $L_{31}$ is a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a31 is an integer of 0 to 5, $R_{37}$ is hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently:

hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group;

a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

14. The light-emitting device of claim 1, wherein the first dopant comprises a condensed cyclic compound represented by Formula 2:

Formula 2

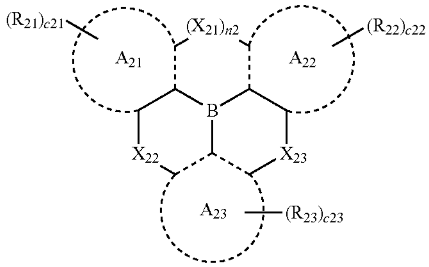

wherein, in Formula 2, $A_{21}$ to $A_{23}$ are each independently a $C_3$-$C_{60}$ carbocyclic group or a $C_1$-$C_{60}$ heterocyclic group, $X_{21}$ to $X_{23}$ are each independently O, S, $N(R_{24})$, $C(R_{24})(R_{25})$, or $Si(R_{24})(R_{25})$, n2 is 0 or 1, wherein, when n2 is O, $A_{21}$ and $A_{22}$ are not linked to each other, $R_{21}$ to $R_{25}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, c21 to c23 are each independently an integer of 1 to 6, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a Ce-Coo arylthio group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

15. The light-emitting device of claim 1, wherein the first dopant comprises an organometallic compound represented by Formula 401:

Formula 401

$$M(L_{401})_{xc1}(L_{402})_{xc2}$$

Formula 402

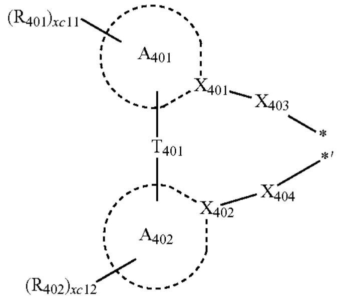

wherein, in Formulae 401 and 402,

M is a transition metal including iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm), $L_{401}$ is a ligand represented by Formula 402, and xc1 is 1, 2, or 3, wherein, when xc1 is 2 or more, two or more of $L_{401}$ are identical to or different from each other, $L_{402}$ is an organic ligand, and xc2 is 0, 1, 2, 3, or 4, wherein, when xc2 is 2 or more, two or more of $L_{402}$ are identical to or different from each other, $X_{401}$ and $X_{402}$ are each independently nitrogen or carbon, ring $A_{401}$ and ring $A_{402}$ are each independently a $C_3$-$C_{60}$ carbocyclic group or a $C_1$-$C_{60}$ heterocyclic group, $T_{401}$ is a single bond, *—O—**, *—S—**, *—C(=O)—**, *—N($Q_{411}$)-**, *—C($Q_{411}$)($Q_{412}$)-**, *—C($Q_{411}$)=C($Q_{412}$)-**, *—C($Q_{411}$)=**, or *=C($Q_{411}$)=*, $X_{403}$ and $X_{404}$ are each independently a chemical bond including a covalent bond or a coordinate bond, O, S, $N(Q_{413})$, $B(Q_{413})$, $P(Q_{413})$, $C(Q_{413})(Q_{414})$, or $Si(Q_{413})(Q_{414})$, $R_{401}$ and $R_{402}$ are each independently hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), xc11 and xc12 are each independently an integer of 0 to 10, $Q_{401}$ to $Q_{403}$ and $Q_{411}$ to $Q_{414}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and and *' in Formula 402 each indicate a binding site to M in Formula 401.

16. The light-emitting device of claim 1, further comprising at least one of a first capping layer located outside the first electrode and a second capping layer located outside the second electrode, wherein at least one of the first capping layer and the second capping layer comprises a material having a refractive index of 1.6 or more at a wavelength of 589 nm.

17. An electronic apparatus comprising the light-emitting device of claim 1.

18. The electronic apparatus of claim 17, further comprising:

a sealing portion located on the light-emitting device; and a functional layer located on the sealing portion and comprising a touch screen layer, a polarizing layer, a color filter, a color conversion layer, or any combination thereof.

19. The electronic apparatus of claim 17, further comprising a quantum dot or an optical member comprising the quantum dot, each located in at least one traveling direction of light emitted from the light-emitting device.

* * * * *